United States Patent
Kojima et al.

(10) Patent No.: US 7,772,813 B2
(45) Date of Patent: Aug. 10, 2010

(54) POWER SUPPLY CIRCUIT

(75) Inventors: Tomokazu Kojima, Osaka (JP); Minoru Honda, Kagawa (JP)

(73) Assignee: Panasonic Corporation, Osaka (JP)

( * ) Notice: Subject to any disclaimer, the term of this patent is extended or adjusted under 35 U.S.C. 154(b) by 732 days.

(21) Appl. No.: 11/639,280

(22) Filed: Dec. 15, 2006

(65) Prior Publication Data
US 2007/0139021 A1   Jun. 21, 2007

(30) Foreign Application Priority Data
Dec. 21, 2005   (JP)   ............... 2005-367889

(51) Int. Cl.
*G05F 1/00*   (2006.01)
(52) U.S. Cl. .................................. 323/270
(58) Field of Classification Search ................. 323/226, 323/233, 242, 243, 265, 270, 273, 281, 280; 320/166
See application file for complete search history.

(56) References Cited
U.S. PATENT DOCUMENTS

| | | | |
|---|---|---|---|
| 6,252,384 B1 | 6/2001 | Arai et al. | |
| 6,333,623 B1 * | 12/2001 | Heisley et al. | 323/280 |
| 6,362,609 B1 * | 3/2002 | Gailhard | 323/280 |
| 6,686,728 B2 * | 2/2004 | Nakajima | 323/281 |
| 2001/0019278 A1 | 9/2001 | Sudo et al. | |
| 2005/0073287 A1 * | 4/2005 | Ball et al. | 323/281 |

FOREIGN PATENT DOCUMENTS

| | | | |
|---|---|---|---|
| CN | 1312493 A | | 9/2001 |
| JP | 11-340753 | | 12/1999 |
| JP | 2000111867 A | * | 4/2000 |
| JP | 2002-014733 | | 1/2002 |

OTHER PUBLICATIONS

English translation of the First Office Action Text issued in Chinese Patent Application No. 200610167890.0.

* cited by examiner

*Primary Examiner*—Bao Q Vu
*Assistant Examiner*—Jue Zhang
(74) *Attorney, Agent, or Firm*—McDermott Will & Emery LLP

(57) ABSTRACT

An operational amplifier generates a power supply potential from a reference potential. An impedance adjuster adjusts an output impedance of the operational amplifier in accordance with a control signal. A charge accumulator accumulates an output charge of the operational amplifier whose impedance is adjusted by the impedance adjuster. A comparator compares an output voltage of the operational amplifier before the impedance adjustment by the impedance adjuster and the output voltage of the operational amplifier after the impedance adjustment by the impedance adjuster to each other, and the comparator further generates the control signal in accordance with a result of the comparison so as to output the generated control signal to the impedance adjuster.

12 Claims, 43 Drawing Sheets

F I G. 2
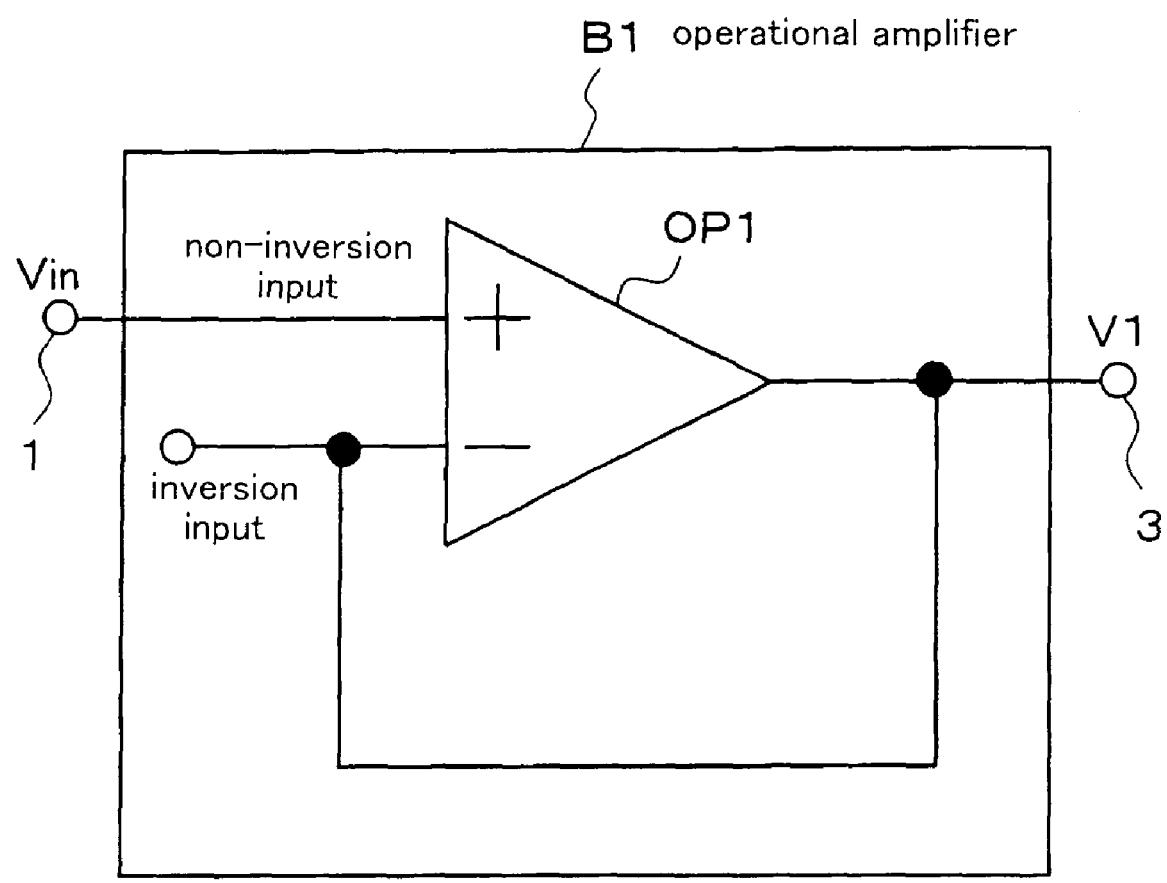

F I G. 2 0
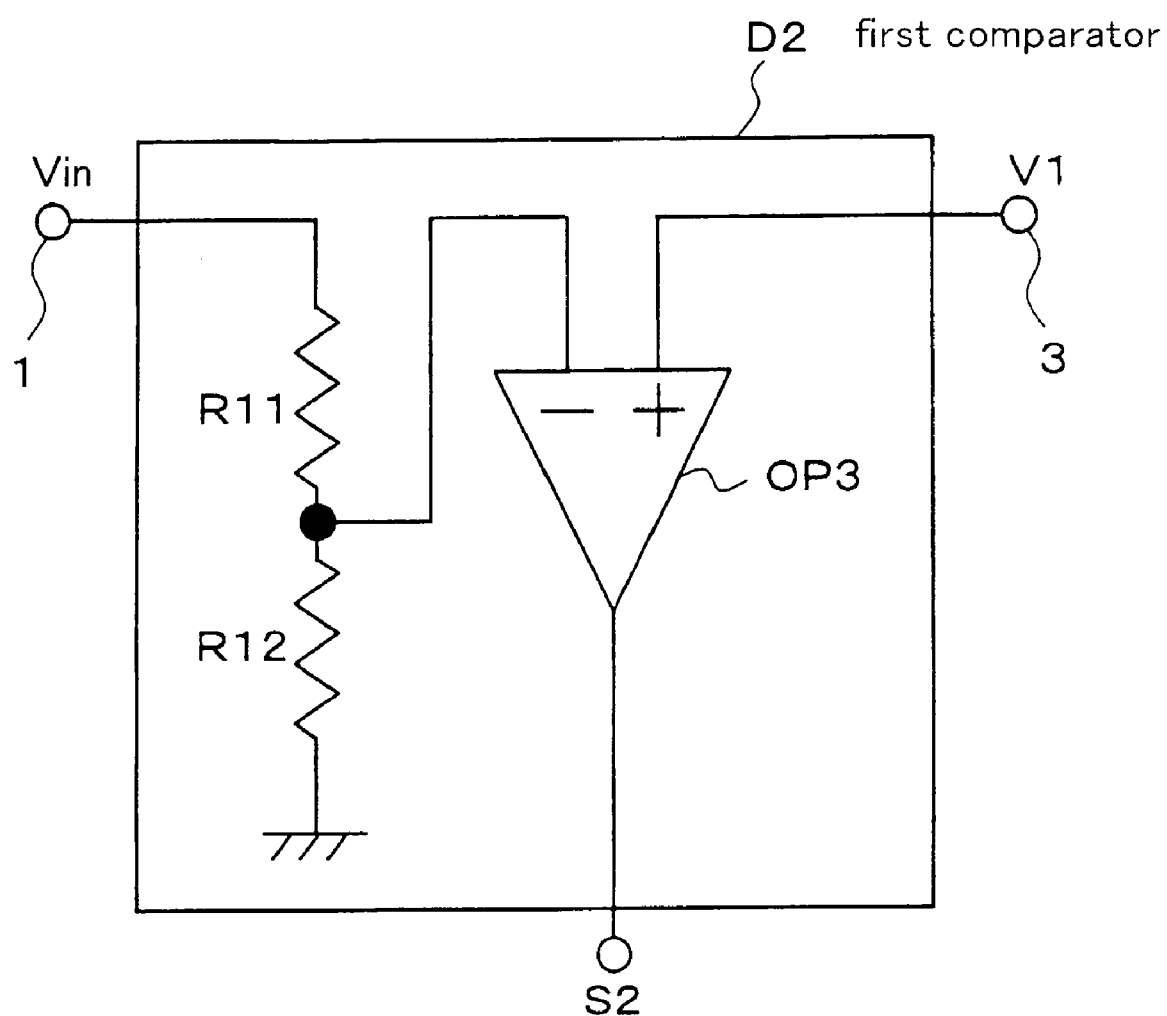

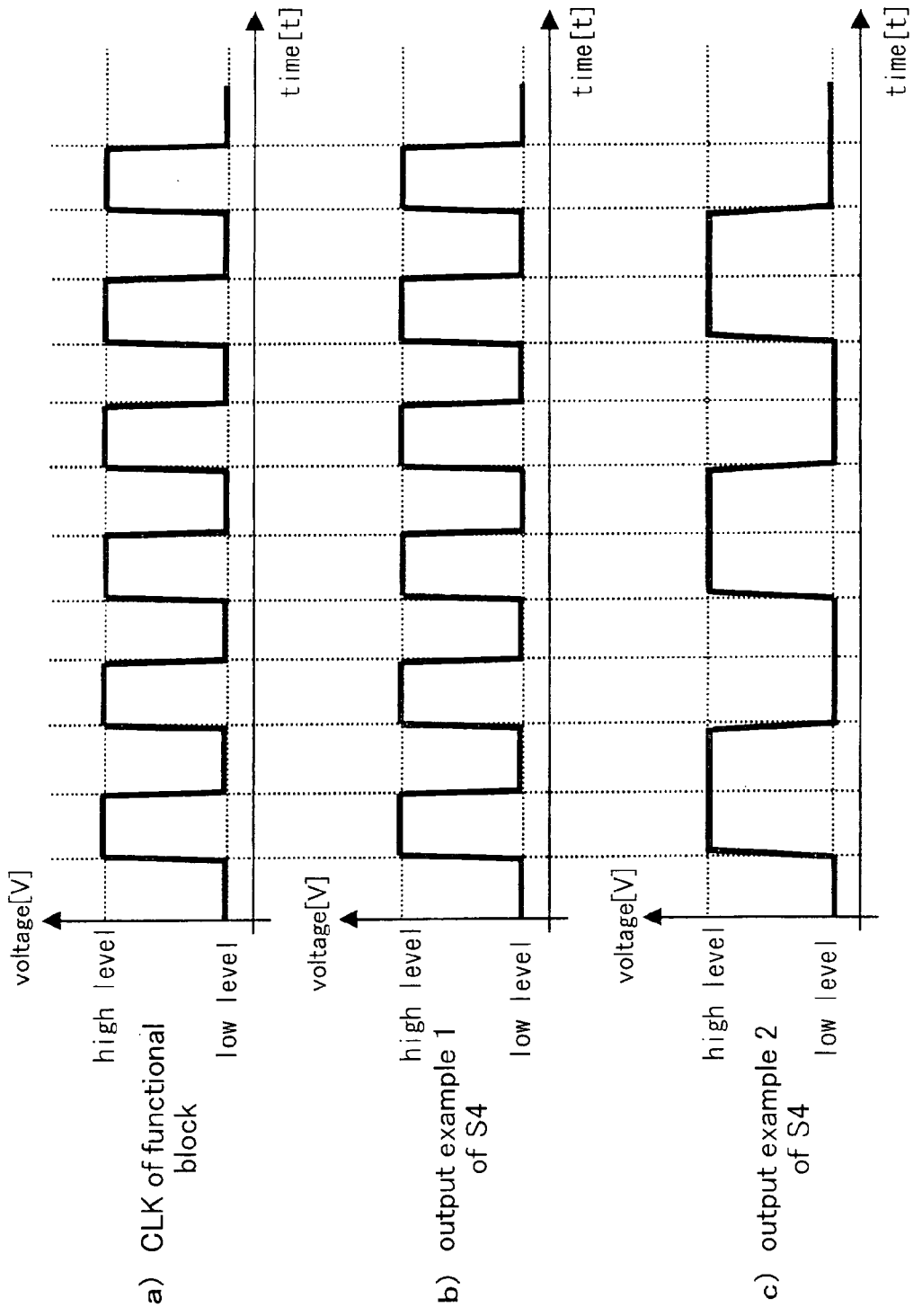

F I G. 3 6
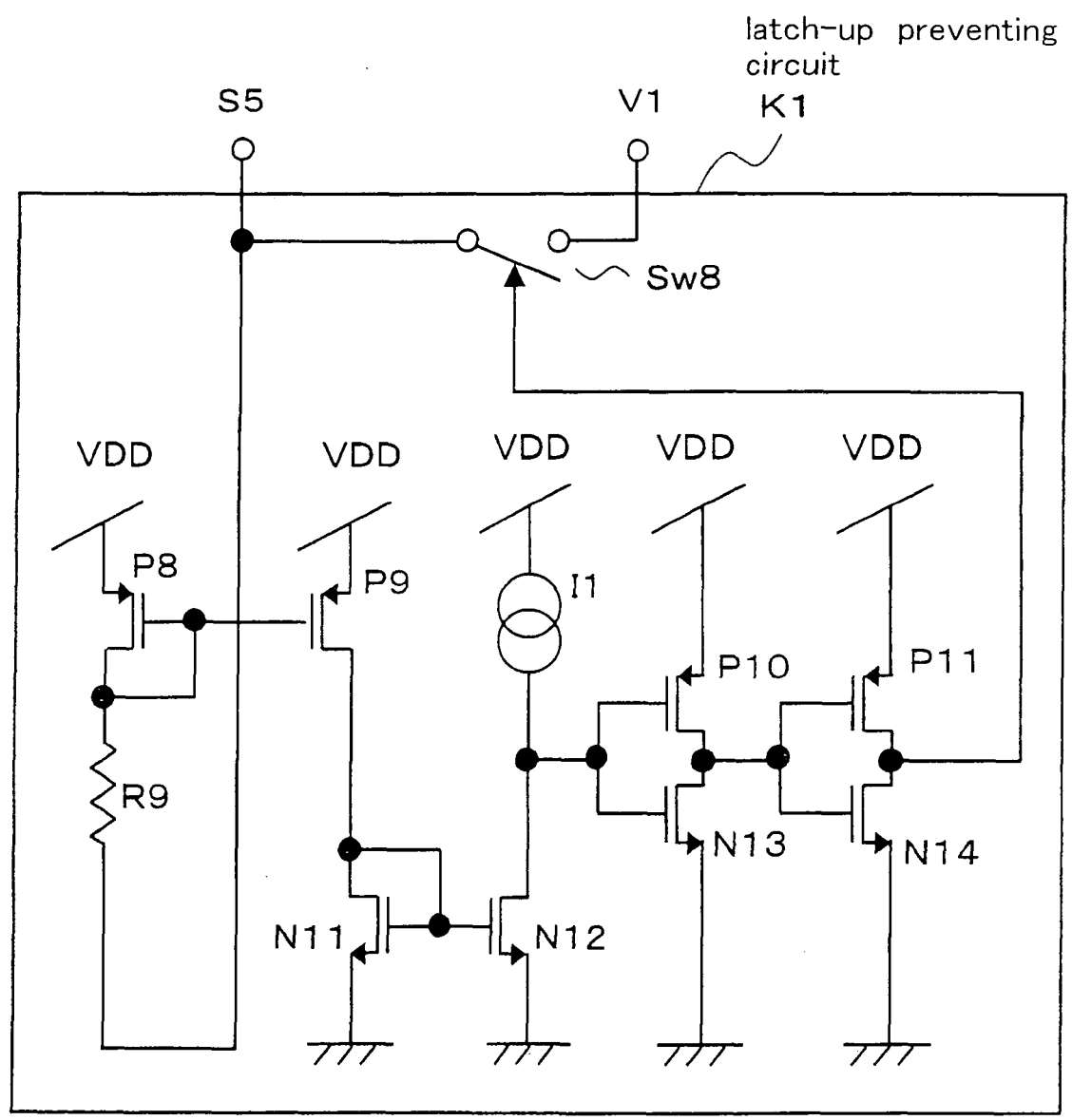

POWER SUPPLY CIRCUIT

BACKGROUND OF THE INVENTION

1. Field of the Invention

The present invention relates to a power supply circuit used in a liquid crystal display device or the like, more specifically to a power supply circuit with a high drive performance having mixed loading of a liquid crystal display drive, a control circuit, RAM and the like.

2. Description of the Related Art

In recent models of a mobile device typified by a mobile telephone and the like, types of the device, to which a power supply circuit for supplying power required for a plurality of functions is mounted, is increased. Such a model is advantageous in the point that power consumption and number of power-supply lines can be reduced by controlling on and off of the power supply in concert with on and off of the function.

As this type of the power supply circuit, the power supply circuit has been conventionally known which could realize a phase stability of an output from an operational amplifier and response to a momentary change of the output by connecting a smooth capacitor to an output terminal of the operational amplifier via a resistance (for example, see No. 2002-14733 of the Japanese Patent Applications Laid-Open).

As another example is known a power supply circuit which could realize a phase stability and high-speed operation by automatically adjusting a phase compensation resistance and a capacitance in the operational amplifier without using the smooth capacitor (for example, see No. H11-340753 of the Japanese Patent Applications Laid-Open).

FIG. 48 shows a conventional power supply circuit AO1 for assuring area reduction, less power consumption and phase stability. In FIG. 48, 1 denotes an input terminal of a reference potential Vin, 2 denotes a power supply circuit output terminal, B1 denotes an operational amplifier for generating a power supply potential V1 by buffering the reference voltage Vin, R01 denotes a phase stability resistance, and E1 denotes a smooth capacitor. The resistance R01 generally has an impedance in the range of a few Ω-a few-hundred Ω order in order to stabilize a phase of the output voltage V1 of the operational amplifier B1 and a level of an output voltage Vout of the power supply circuit. The smooth capacitor E1 has an electrostatic capacitance of a few μF (microfarad) order in order to smoothen the output voltage V1 of the operational amplifier B1.

In the power supply circuit AO1 shown in FIG. 48, the output voltage Vout of the power supply circuit supplies power to functional blocks (loads) in a mobile device. For example, in the case of a liquid crystal display device comprising a power supply circuit, a control circuit, RAM and the like are connected to the power supply circuit output terminal 2. These functional blocks consume different levels of power in accordance with data displayed on a screen of the liquid crystal display device. Dividing the power consumption levels roughly into two categories, there are a state where large power (for example, a few-ten mw order) is consumed (large power consumption state) and a state where power is hardly consumed (momentary power consumption state). A current is supplied from the operational amplifier B1 via the resistance R01 in the large power consumption state, while a charge is supplied from the smooth capacitor E1 in the momentary power consumption state. Accordingly, stable power can be supplied to the control circuit, RAM and the like.

The following is needed in order to take power supply mode,

Though the charge can be momentarily supplied to the functional block demanding a high-speed processing, the smooth capacitor E1 is required.

It is necessary to use a resistance element having such a small resistance value (for example, at most a few-hundred Ω) that the output voltage Vout of the power supply circuit does not drop even in the large power supply as the resistance R01.

It is difficult to secure the phase stability because power is not supplied adversely in a less power consumption mode regardless of having such a capability that can respond to the large power in the operational amplifier B1.

In order to stabilize the phase, it is necessary to supply the current to an output transistor of the operational amplifier B1 or set the resistance R01 to a large value (for example, at least a few-hundred Ω).

In order to realize the power supply circuit corresponding to the different modes, the value of the resistance R01 has different ideal values in accordance with the power consumption states, or it is necessary for the amplifier B1 to control so as to prevent the output transistor from oscillation even in the power-less mode. In either case, such disadvantages are generated that the output voltage Vout of the power supply circuit is shifted, phase allowance is reduced, the current of the output transistor is increased, and additionally chip area is increased.

SUMMARY OF THE INVENTION

Therefore, a main object of the present invention is to provide a power supply circuit in which a shift of an output voltage of the power supply circuit is small, and a consumed current and a chip area are prevented from increasing as a power supply circuit installed in a device comprising a plurality of functions.

A power supply circuit according to the present invention is configured as follows in order to achieve the foregoing object.

Constitution 1 of the Present Invention

Constitution 1 relates to a power supply circuit for generating a voltage for driving a load with direct-current, comprising:

an operational amplifier for generating a power supply potential from a reference potential;

an impedance adjuster for adjusting an output impedance of the operational amplifier in accordance with a control signal;

a charge accumulator for accumulating an output charge of the operational amplifier whose impedance is adjusted by the impedance adjuster; and a comparator for comparing an output voltage of the operational amplifier before the impedance adjustment by the impedance adjuster and the output voltage of the operational amplifier after the impedance adjustment by the impedance adjuster to each other, the comparator further generating the control signal in accordance with a result of the comparison and outputting the generated control signal to the impedance adjuster.

FIG. 1 in preferred embodiments described later can be referenced with respect to the Constitution 1.

In the Constitution 1, a voltage difference between two ends of the impedance adjuster changes depending on whether or not there is a load in an output terminal of the power supply circuit. The presence or absence of the load corresponds to switchover of an operation/non-operation of a functional block connected to the power supply circuit. The variation of the voltage difference is detected in the comparator, and the impedance of the impedance adjuster is adjusted based on the control signal showing the comparison result by the comparator. In the case where the load is not connected to the power supply circuit, the output impedance is adjusted to a higher level of impedance in the impedance adjuster so that the phase stability can be secured. On the contrary, in the case where the load is connected to the power supply circuit, the output impedance is adjusted to a lower level of impedance in the impedance adjuster so that a voltage drop is controlled and a larger power can be thereby supplied to the load.

Because the output impedance is thus automatically adjusted in the impedance adjuster in accordance with the variation due to the presence or absence of the load, trade-off between the reduction of the voltage drop and the stability of the output voltage can be cancelled while area reduction can be realized at the same time without any complication of the operational amplifier. As a result, a power supply circuit, which can exert a high drive performance with less power consumption and achieve a higher phase accuracy, can be realized.

Constitution 2 of the Present Invention

There is a mode, wherein, in the Constitution 1, the operational amplifier comprises a switchover phase compensator for adjusting an output phase thereof, the switchover phase compensator comprises a plurality of phase compensating circuits having a different level of phase compensation each other, and the phase compensating circuits for adjusting the output phase are switched over from one another based on the control signal. FIGS. 11 and 12 in the preferred embodiments described later can be referenced for the Constitution 2.

In the Constitution 2, in the case where the load is not connected to the power supply circuit, the output impedance is adjusted to a higher level of impedance in the impedance adjuster, and the operational amplifier is made to function as an inversion amplifier based on the switchover of the phase compensating circuit. As a result, the phase stability can be improved.

In the case where the load is connected to the power supply circuit, the output impedance is adjusted to a lower level of impedance in the impedance adjuster. Accordingly, the voltage drop can be controlled and a larger current can be thereby supplied to the load. Further, when the operational amplifier is made to function as a voltage follower based on the switchover of the phase compensator, a rise characteristic of the operational amplifier for charging the charge accumulator is improved, and the operation is accelerated.

Constitution 3 of the Present Invention

There is a mode, wherein, in the Constitution 2, the power supply circuit further comprises an input terminal to which the reference potential is inputted from outside, wherein the operational amplifier comprises:

a non-inversion input terminal to which the reference potential is inputted from the input terminal;

an inversion input terminal; and an amplifier output terminal for outputting the power supply potential, and the switchover phase compensator comprises:

a first switch for controlling conduction between the input terminal and the inversion input terminal based on the control signal;

a first resistance connected in series to the first switch;

a second switch for controlling conduction between the inversion input terminal and the output terminal based on the control signal; and a parallel circuit connected in parallel to the second switch, and wherein the parallel circuit comprises a capacitor and a second resistance connected in parallel to each other. FIG. 13 in the preferred embodiments described later can be referenced for the Constitution 3.

In the Constitution 3, the first switch is turned off and the second switch is turned on based on the control signal from the comparator when the load is not connected so that the output terminal of the operational amplifier is directly connected to the inversion input terminal. Accordingly, the operational amplifier is made to function as a voltage follower so as to secure a high speed in the operation. Further, the first switch is turned on and the second switch is turned off based on the control signal from the comparator when the load is connected so that the first and second resistances and the capacitor are connected to the inversion input terminal. Accordingly, the operational amplifier is made to function as a differential amplifier so as to secure the phase stability.

Constitution 4 of the Present Invention

There is a mode, wherein, in the Constitution 3, the power supply circuit further comprises a third switch for controlling conduction between the parallel circuit and the output terminal based on the control signal. FIG. 14 in the preferred embodiments described later can be referenced for the constitution 4.

According to the Constitution 4, when the operational amplifier is switched over from a structure functioning as the inversion amplifier to a structure functioning as the voltage follower, the third switch is turned off so that the capacitor of the parallel circuit is prevented from discharging. As a result, a rising speed of the operational amplifier for charging the capacitor can be increased when the operational amplifier is switched over again from a structure functioning as the voltage follower to a structure functioning as the inversion amplifier.

Constitution 5 of the Present Invention

There is a mode, wherein, in the Constitution 2, the power supply circuit further comprises an input terminal to which the reference potential is inputted from outside, wherein the operational amplifier comprises:

a non-inversion input terminal to which the reference potential is inputted from the input terminal;

an inversion input terminal; and an amplifier output terminal for outputting the power supply potential, and the switchover phase compensator comprises:

a switch for controlling conduction between the inversion input terminal and the output terminal based on the control signal; and a parallel circuit connected in parallel to the switch, and the parallel circuit comprises a capacitor and a resistance connected in parallel to each other. FIG. 15 in the preferred embodiments described later can be referenced for the Constitution 5.

According to the Constitution 5, the number of the constituent elements is reduced in comparison to the Constitution 3. As a result, the circuit area can be reduced while the phase accuracy in the absence of the load is secured at the same time.

Constitution 6 of the Present Invention

There is a mode, wherein, in the Constitution 1, the power supply circuit further comprises a power supply circuit output terminal for outputting the power supply potential outside, wherein the operational amplifier comprises an amplifier output terminal for outputting the power supply potential to the power supply circuit output terminal, the impedance adjuster comprises a parallel circuit provided between the amplifier output terminal and the power supply circuit output terminal, and the parallel circuit comprises:

a switch for controlling conduction between the amplifier output terminal and the power supply circuit output terminal in accordance with the control signal and a resistance connected in parallel to the switch.

It may be constituted so that the parallel circuit comprises a series circuit and a first resistance connected in parallel to each other, and the series circuit comprises:

a switch for controlling conduction between the amplifier output terminal and the power supply circuit output terminal in accordance with the control signal and a second resistance connected in series to the switch.

FIGS. 6 and 4 in the preferred embodiments described later can be referenced for the Constitution 6.

Constitution 7 of the Present Invention

There is a mode, wherein, in the Constitution 1, the power supply circuit further comprises a power supply circuit output terminal for outputting the power supply potential outside, wherein the operational amplifier comprises an amplifier output terminal for outputting the power supply potential to the power supply circuit output terminal, the impedance adjuster comprises:

a first transistor provided between the amplifier output terminal and the power supply circuit output terminal; and an ON resistance connected in parallel to the first transistor.

Additionally, it maybe constituted so that the impedance adjuster may comprise:

a first transistor provided between the amplifier output terminal and the power supply circuit output terminal, and a second transistor connected in parallel to the first transistor, wherein the second transistor has a transistor size different to that of the first transistor.

FIG. 7 in the preferred embodiments described later can be referenced with respect to the Constitution 7.

Constitution 8 of the Present Invention

There is a mode, wherein, in the Constitution 1, the power supply circuit further comprises a power supply circuit output terminal for outputting the power supply potential outside, wherein the operational amplifier comprises an amplifier output terminal for outputting the power supply potential to the power supply circuit output terminal, the impedance adjuster comprises a transistor provided between the amplifier output terminal and the power supply circuit output terminal, wherein a potential more than a threshold voltage is supplied to a gate potential of the transistor, and a back gate potential of the transistor is switched over by the control signal. FIGS. 8 and 9 in the preferred embodiments described later can be referenced with respect to the Constitution 8.

Constitution 9 of the Present Invention

There is a mode, wherein, in the Constitution 1, the comparator outputs the control signal so that the output impedance by the impedance adjuster is adjusted to a high level of impedance when the output voltage of the operational amplifier after the impedance adjustment is higher than or equal to the output voltage of the operational amplifier before the impedance adjustment, and the comparator outputs the control signal so that the output impedance by the impedance adjuster is adjusted to a low level of impedance when the output voltage of the operational amplifier after the impedance adjustment is lower than the output voltage of the operational amplifier before the impedance adjustment. FIG. 5 in the preferred embodiments described later can be referenced with respect to the Constitution 9.

In the Constitution 9, the presence or absence of the load at the power supply circuit output terminal is judged based on the comparison between the output voltage of the operational amplifier after the impedance adjustment and the output voltage of the operational amplifier before the impedance adjustment. More specifically, the load is judged to be absent when the output voltage after the impedance adjustment is higher than or equal to the output voltage before the impedance is adjusted, while the load is judged to be present when the output voltage of the operational amplifier after the impedance adjustment is lower than the output voltage of the operational amplifier before the impedance adjustment.

Constitution 10 of the Present Invention

There is a mode, wherein, in the Constitution 1, the power supply circuit further comprises a power supply circuit output terminal for outputting the power supply potential outside, wherein the comparator comprises a non-inversion input terminal and an inversion input terminal, wherein the non-inversion input terminal of the comparator is connected to the power supply circuit output terminal, and the inversion input terminal of the comparator is connected to a resistance dividing point at which the output voltage of the operational amplifier is divided. FIG. 10 in the preferred embodiments described later can be referenced with respect to the Constitution 10.

Constitution 11 of the Present Invention

According to Constitution 11, a power supply circuit for generating a voltage for driving a load with direct-current comprises:

an operational amplifier for generating a power supply potential from a reference potential;

an impedance adjuster for adjusting an output impedance of the operational amplifier in accordance with a control signal;

a charge accumulator for accumulating an output charge of the operational amplifier whose impedance is adjusted by the impedance adjuster; and a comparator for comparing the reference potential to an output voltage of the operational amplifier after the impedance adjustment by the impedance adjuster, thereafter further generating the control signal in accordance with a result of the comparison and outputting the generated control signal to the impedance adjuster.

In comparison to the Constitution 1, the Constitution 11 is characterized in that the comparator compares the output voltage of the operational amplifier after the impedance adjustment to the reference potential in place of the output voltage of the operational amplifier before the adjustment. FIG. 16 in the preferred embodiments described later can be referenced for the Constitution 11.

According to the Constitution 11, the comparator is free of any influence from the operational amplifier and can thereby improve its response speed.

Constitution 12 of the Present Invention

There is a mode, wherein, in the Constitution 11, the power supply circuit comprises a power supply circuit output terminal for outputting the power supply potential outside, wherein the comparator comprises a non-inversion input terminal and an inversion input terminal, wherein the non-inversion input terminal of the comparator is connected to the power supply circuit output terminal, and the inversion input terminal of the comparator is connected to a resistance dividing point at which the reference potential is divided. FIG. 10 in the preferred embodiments described later can be referenced for the Constitution 12.

Constitution 13 of the Present Invention

According to Constitution 13, a power supply circuit for generating a voltage for driving a load with direct-current, comprises:

an operational amplifier for generating a power supply potential from a reference potential;

an impedance adjuster for adjusting an output impedance of the operational amplifier in accordance with a control signal;

a charge accumulator for accumulating an output charge of the operational amplifier whose impedance is adjusted by the impedance adjuster;

a first comparator for comparing an output voltage of the operational amplifier before the impedance adjustment by the impedance adjuster to the reference potential and generating a switchover signal in accordance with a result of the comparison;

a switch for selecting one of the output voltage of the operational amplifier before the impedance adjustment by the impedance adjuster and the reference potential in accordance with the switchover signal; and a second comparator for comparing the output voltage of the operational amplifier after the impedance adjustment by the impedance adjuster to an output voltage of the switch, thereafter further generating the control signal in accordance with a result of the comparison and outputting the generated control signal to the impedance adjuster.

FIG. 18 in the preferred embodiments described later can be referenced for the Constitution 13.

In the Constitution 13, the first comparator compares the output voltage of the operational amplifier before the impedance adjustment to the reference potential at a leading edge of voltage. In an initial stage of the leading edge, the output voltage of the operational amplifier before the impedance adjustment is lower than the reference potential. Therefore, the switch supplies the reference potential to the second comparator based on the switching signal outputted by the first comparator. As a result, in the initial stage of a leading edge of the power, the second comparator compares the output voltage of the operational amplifier after the impedance adjustment to the reference potential.

When the output voltage of the operational amplifier is stabilized over time, the switching signal outputted from the second comparator is inverted. Accordingly, the switch supplies the output voltage of the operational amplifier before the impedance adjustment to the second comparator. Therefore, in a latter stage of a leading edge of the power, the second comparator shifts to the state of comparing the output voltage of the operational amplifier after the impedance adjustment and the output voltage of the operational amplifier before the impedance adjustment to each other. Thereby, in the initial stage of a leading edge of the power, the operation of the second comparator can be started at a high speed. Further, the second comparator switches over to the comparison state without consideration of offset after the operation of the operational amplifier is stabilized so that the second comparator can be operated with a higher accuracy. This constitution can strike a balance between the speedy responsiveness and accurate comparison processing.

Constitution 14 of the Present Invention

According to Constitution 14, a power supply circuit for generating a voltage for driving a load with direct-current comprises:

an operational amplifier for generating a power supply potential from a reference potential;

an impedance adjuster for adjusting an output impedance of the operational amplifier in accordance with a control signal;

a charge accumulator for accumulating an output charge of the operational amplifier whose impedance is adjusted by the impedance adjuster;

a first comparator for comparing an output voltage of the operational amplifier before the impedance adjustment by the impedance adjuster and an output voltage of the operational amplifier after the impedance adjustment by the impedance adjuster to each other and generating a switching signal in accordance with a result of the comparison;

a switch for selecting one of the output voltage of the operational amplifier before the impedance adjustment by the impedance adjuster and the reference potential in accordance with the switchover signal; and a second comparator for comparing the output voltage of the operational amplifier after the impedance adjustment by the impedance adjuster to an output voltage of the switch, thereafter generating the control signal in accordance with a result of the comparison and outputting the generated control signal to the impedance adjuster. FIG. 21 in the preferred embodiments described later can be referenced for the Constitution 14.

In the case where the output current of the operational amplifier is increased and the potential difference in the impedance adjuster is thereby increased in the Constitution 14, the switch supplies the reference potential to the second comparator based on the switchover signal. As a result, the second comparator compares the output voltage of the operational amplifier after the impedance adjustment to the reference potential, and it becomes possible that the second comparator is operated speedily.

Meanwhile, after the potential difference in the impedance adjuster is reduced by the control signal from the second comparator, the switching signal outputted from the first comparator is inverted. Therefore, the switch supplies the output voltage of the operational amplifier before the impedance adjustment to the second comparator. Thereby, the comparison processing by the second comparator counterchanges to the state where the output voltages of the operational amplifier before and after the impedance adjustment are compared, that is, the state where the offset is not taken into account, and it is possible to make the second comparator operate with higher accuracy. This constitution can strike a balance between the speedy responsiveness and accurate comparison processing.

Constitution 15 of the Present Invention

According to Constitution 15, a power supply circuit for generating a voltage for driving a load with direct-current, comprises:

an operational amplifier for generating a power supply potential from a reference potential;

an impedance adjuster for adjusting an output impedance of the operational amplifier in accordance with a control signal;

a charge accumulator for accumulating an output charge of the operational amplifier whose impedance is adjusted by the impedance adjuster;

a functional block direct-current driven by the voltage generated by the power supply circuit;

a timing controller for outputting a switchover signal at a predetermined timing in accordance with an operation of the functional block;

a switch for selecting one of the output voltage of the operational amplifier before the impedance adjustment by the impedance adjuster and the reference potential in accordance with the switchover signal; and a comparator for comparing the output voltage of the operational amplifier after the impedance adjustment by the impedance adjuster to an output voltage of the switch, thereafter generating the control signal in accordance with a result of the comparison and outputting the generated control signal to the impedance adjuster. FIG. 24 in the preferred embodiments described later can be referenced for the Constitution 15.

According to the Constitution 15, in the case where the output voltage of the operational amplifier after the impedance adjustment is already known, an output stabilization time is calculated in advance in the functional block. The switch supplies the reference potential to the comparator through the switchover signal until the output voltage of the operational amplifier is stabilized. Accordingly, it is possible that the comparator can be operated at a high speed during a period when the output voltage of the operational amplifier after the impedance adjustment is unstable, and the comparator can be operated with a higher accuracy after the output voltage of the operational amplifier after the impedance adjustment becomes stable. This constitution can strike a balance between the speedy responsiveness and accurate comparison processing.

Constitution 16 of the Present Invention

There is a mode wherein, in the Constitution 15, the timing controller generates the switchover signal synchronizing with an operation frequency of the functional block or an N-frequency division of the operation frequency.

Constitution 17 of the Present Invention

According to Constitution 17, a power supply circuit for generating a voltage for driving a load with direct-current, comprises:

a first operational amplifier for generating a power supply potential from a reference potential;

an continuously variable impedance adjuster for performing continuously variable setting on an output impedance of the first operational amplifier in accordance with a control signal;

a charge accumulator for accumulating an output charge of the first operational amplifier whose impedance is adjusted by the continuously variable impedance adjuster; and a second operational amplifier for executing an operation of a difference between an output voltage of the operational amplifier before the impedance adjustment by the continuously variable impedance adjuster and an output voltage of the operational amplifier after the impedance adjustment by the continuously variable impedance adjuster, thereafter generating the control signal in accordance with the difference and outputting the generated control signal to the continuously variable impedance adjuster. FIG. 26 in the preferred embodiments described later can be referenced for the Constitution 17.

In the constitution 17, when the load connected to the power supply circuit is reduced and the output current of the first operational amplifier is thereby reduced so that the voltage drop in the continuously variable impedance adjuster is reduced, the second operational amplifier generates the control signal for adjusting so as to increase the output impedance in the continuously variable impedance adjuster. On the contrary, when the load connected to the power supply circuit is increased and the output voltage of the first operational amplifier is thereby increased so that the voltage drop in the continuously variable impedance adjuster is increased, the second operational amplifier generates the control signal for adjusting so as to decrease the output impedance in the continuously variable impedance adjuster. As a result, it is possible that the impedance is controlled adjustably in the continuous values.

Constitution 18 of the Present Invention

There is a mode wherein, in the Constitution 17, the power supply circuit further comprises a latch-up preventing circuit, wherein the latch-up preventing circuit selects an avoidance path of the continuously variable impedance adjuster when latch-up of the continuously variable impedance adjuster is detected. FIG. 34 in the preferred embodiments described later can be referenced for the Constitution 18.

In the Constitution 18, the latch up in the continuously variable impedance adjuster can be avoided.

Constitution 19 of the Present Invention

There is a mode wherein, in the Constitution 18, the power supply circuit comprises a power supply circuit output terminal for outputting the power supply potential outside, wherein the first operational amplifier comprises an amplifier output terminal for outputting the power supply potential to the power supply circuit output terminal, wherein the latch-up preventing circuit comprises:

a first transistor which uses an output current of the first operational amplifier or the second operational amplifier as a current supply source;

a second transistor constituting a current mirror circuit by being paired with the first transistor;

a third transistor which uses the second transistor as a current supply source;

a fourth transistor constituting a current mirror circuit by being paired with the third transistor;

an input current circuit which serves as a current supply source of the fourth transistor;

a first inverter connected to a point at which the fourth transistor and the input current circuit are connected;

a second inverter connected to the first inverter; and a switch for controlling conduction between the amplifier output terminal and the power supply circuit output terminal in accordance with an output signal of the second inverter. FIG. 35 in the preferred embodiments described later can be referenced for the Constitution 19.

Constitution 20 of the Present Invention

There is a mode wherein, in the Constitution 18, the latch-up preventing circuit comprises:

a first transistor which uses an output current of the first operational amplifier or the second operational amplifier as a current supply source;

a second transistor constituting a current mirror circuit by being paired with the first transistor;

a third transistor which uses the second transistor as a current supply source;

a fourth transistor constituting a current mirror circuit by being paired with the third transistor;

an input current circuit which serves as a current supply source of the fourth transistor;

a first inverter connected to a point at which the fourth transistor and the input current circuit are connected;

a second inverter connected to the first inverter; and a switch for switching over whether or not the output of the second operational amplifier replaces the output of the first operational amplifier in accordance with an output signal of the second inverter. FIG. 36 in the preferred embodiments described later can be referenced for the Constitution 20.

In the Constitution 20, while the latch-up preventing function is provided, any discontinuity in varying the impedance in the adjustment is eliminated when an excessive current is detected. As a result, the impedance can be finely adjusted with the continuously variable impedance adjuster.

Constitution 21 of the Present Invention

There is a mode wherein, in the Constitution 18, the power supply circuit comprises a power supply circuit output terminal for outputting the power supply potential outside, wherein the first operational amplifier comprises an amplifier output terminal for outputting the power supply potential to the power supply circuit output terminal, and the latch-up preventing circuit comprises:

a first transistor which uses an output current of the first operational amplifier or the second operational amplifier as a current supply source;

a second transistor constituting a current mirror circuit by being paired with the first transistor;

an input current circuit which serves as a current supply source of the second transistor;

an inverter connected to a point at which the second transistor and the input current circuit are connected;

a switch for controlling conduction between the amplifier output terminal and the power supply circuit output terminal in accordance with an output signal of the inverter. FIG. 37 in the preferred embodiments described later can be referenced for the Constitution 21.

Constitution 22 of the Present Invention

There is a mode wherein, in the Constitution 18, the latch-up preventing circuit comprises:

a first transistor which uses an output current of the first operational amplifier or the second operational amplifier as a current supply source;

a second transistor constituting a current mirror circuit by being paired with the first transistor;

an input current circuit which serves as a current supply source of the second transistor;

an inverter connected to a point at which the second transistor and the input current circuit are connected; and a switch for switching over whether or not the output of the second operational amplifier replaces the output of the first operational amplifier in accordance with an output signal of the inverter. FIG. 38 in the preferred embodiments described later can be referenced with respect to the Constitution 22.

According to the Constitution 22, while the latch-up preventing function is provided, any discontinuity in varying the impedance in the adjustment is eliminated when an excessive current is detected. As a result, the impedance can be finely adjusted with the continuously variable impedance adjuster.

Constitution 23 of the Present Invention

According to Constitution 23, a power supply circuit for generating a voltage for driving a load with direct-current, comprises:

an operational amplifier for generating a power supply potential from a reference potential;

an output impedance transistor for adjusting an output impedance of the operational amplifier in accordance with the operation of the operational amplifier; and a charge accumulator for accumulating an output charge of the operational amplifier whose impedance is adjusted by the output impedance transistor, wherein the operational amplifier comprises an output transistor, a gate terminal of the output impedance transistor is connected to a gate terminal of the output transistor, and a threshold voltage of the output impedance transistor is set to a value smaller than a threshold voltage of the output transistor or a negative value (depression type). FIG. 39 in the preferred embodiments described later can be referenced for the Constitution 23.

According to the Constitution 23, the impedance of the output impedance transistor is variably controlled in accordance with the current variation of the current monitor transistor of the operational amplifier. Thereby, an effect similar to that of the Constitution 1 can be achieved, and the output current of the operational amplifier is directly monitored so that control for varying the output impedance can be carried out.

Constitution 24 of the Present Invention

According to Constitution 24, a power supply circuit for generating a voltage for driving a load with direct-current, comprises:

an operational amplifier for generating a power supply potential from a reference potential;

an output impedance transistor for adjusting an output impedance of the operational amplifier; and a charge accumulator for accumulating an output charge of the operational amplifier whose impedance is adjusted by the output impedance transistor, a current monitor transistor for monitoring an output current of the operational amplifier;

a first transistor constituting a current mirror circuit by being paired with the current monitor transistor;

a second transistor which uses the first transistor as a current supply source;

a third transistor constituting a current mirror circuit by being paired with the second transistor;

a fourth transistor for converting an output current of the third transistor into a voltage and supplying the converted output voltage to a gate terminal of the output impedance transistor. FIG. 40 in the preferred embodiments described later can be referenced for the Constitution 24.

According to the Constitution 24, the impedance of the output impedance transistor is variably controlled in accordance with the current variation of the current monitor transistor of the operational amplifier.

Constitution 25 of the Present Invention

There is a mode wherein, in the Constitution 24, further a fifth transistor in a current supply path between the third transistor and the fourth transistor is provided, wherein the output voltage of the operational amplifier before the impedance adjustment by the output impedance transistor is supplied to a gate terminal of the fifth transistor. FIG. 41 in the preferred embodiments described later can be referenced for the Constitution 25.

Constitution 26 of the Present Invention

According to Constitution 26, a power supply circuit for generating a voltage for driving a load with direct-current, comprises:

an operational amplifier for generating a power supply potential from a reference potential;

an output impedance transistor for adjusting an output impedance of the operational amplifier;

a charge accumulator for accumulating an output charge of the operational amplifier whose impedance is adjusted by the output impedance transistor, a current monitor transistor for monitoring an output current of the operational amplifier;

a first transistor constituting a current mirror circuit by being paired with the current monitor transistor;

a second transistor which uses the first transistor as a current supply source;

a third transistor constituting a current mirror circuit by being paired with the second transistor; and a fourth transistor for supplying a current to the third transistor, wherein the power supply potential before the impedance adjustment by the output impedance transistor is supplied to a gate terminal of the fourth transistor, and an output voltage of the fourth transistor is supplied to a gate terminal of the output impedance transistor. FIG. 42 in the preferred embodiments described later can be referenced for the Constitution 26.

According to the Constitution 26, the impedance of the output impedance transistor is variably controlled in accordance with the current variation of the current monitor transistor of the operational amplifier.

Constitution 27 of the Present Invention

According to Constitution 27, a power supply circuit for generating a voltage for driving a load with direct-current comprises:

an operational amplifier for generating a power supply potential from a reference potential;

an output impedance transistor for adjusting an output impedance of the operational amplifier;

a charge accumulator for accumulating an output charge of the operational amplifier whose impedance is adjusted by the output impedance transistor, a current monitor transistor for monitoring an output current of the operational amplifier;

a first transistor constituting a current mirror circuit by being paired with the current monitor transistor;

a second transistor which uses the first transistor as a current supply source;

a third transistor constituting a current mirror circuit by being paired with the second transistor;

a fourth transistor for supplying a current to the third transistor; and a fifth transistor provided between the third and fourth transistors, a gate terminal of the fifth transistor being supplied with an output voltage of the operational amplifier before the impedance adjustment by the continuously variable impedance adjuster, wherein a gate terminal of the fourth transistor is connected to a gate terminal of the first transistor, and an output voltage of the fourth transistor is supplied to a gate terminal of the output impedance transistor. FIG. 43 in the preferred embodiments described later can be referenced for the Constitution 27.

According to the Constitution 27, the impedance of the output impedance transistor is variably controlled in accordance with the current variation of the current monitor transistor of the operational amplifier.

Constitution 28 of the Present Invention

According to Constitution 28, a power supply circuit for generating a voltage for driving a load with direct-current comprises:

an operational amplifier for generating a power supply potential from a reference potential;

an output impedance transistor for adjusting an output impedance of the operational amplifier; and a charge accumulator for accumulating an output charge of the operational amplifier whose impedance is adjusted by the output impedance transistor, a current monitor transistor for monitoring an output current of the operational amplifier;

a transistor constituting a current mirror circuit by being paired with the current monitor transistor; and a resistance provided between the transistor and a ground, wherein an output voltage of the transistor is supplied to a gate terminal of the output impedance transistor. FIG. 44 in the preferred embodiments described later can be referenced with respect to the Constitution 28.

According to the Constitution 28, the impedance of the output impedance transistor is variably controlled in accordance with the current variation of the current monitor transistor of the operational amplifier.

Constitution 29 of the Present Invention

There is a mode wherein, in the Constitution 28, a power supply circuit further comprises an ON resistance operating in accordance with a potential at a point at which the transistor and the resistance are connected in place of the output impedance transistor, or a plurality of transistors having a different transistor size and connected in parallel to each other in place of the output impedance transistor. FIG. 45 in the preferred embodiments described later can be referenced for the the Constitution 29.

According to the Constitution 29, the impedance can be adjusted in such a manner that steps are more finely divided.

Constitution 30 of the Present Invention

According to Constitution 30, a power supply circuit for generating a voltage for driving a load with direct-current comprises:

an operational amplifier for generating a power supply potential from a reference potential;

a high-potential current monitor transistor for monitoring an output current of the operational amplifier on a high-potential side;

a first transistor constituting a current mirror circuit by being paired with the high-potential current monitor transistor, a low-potential current monitor transistor for monitoring an output current of the operational amplifier on a low-potential side;

a second transistor constituting a current mirror circuit by being paired with the low-potential current monitor transistor;

a first resistance provided between the first transistor and a ground;

a second resistance provided between the second transistor and a power supply;

a first output impedance transistor for adjusting an output impedance of the operational amplifier in accordance with a potential at a point at which the first transistor and the first resistance are connected;

a second output impedance transistor for adjusting the output impedance of the operational amplifier in accordance with a potential at a point at which the second transistor and the second resistance are connected; and a charge accumulator for accumulating an output charge of the operational amplifier whose impedance is adjusted by the first and second output impedance transistors. FIG. 46 in the preferred embodiments described later can be referenced with respect to the Constitution 30.

According to the Constitution 30, an effect similar to that of the Constitution 28 can be obtained, and additionally the operation can be further stabilized.

Constitution 31 of the Present Invention

There is a mode wherein, in the Constitution 30, the power supply circuit further comprising:

an ON resistance operating in accordance with a potential at a point at which the first transistor and the first resistance are connected in place of the first output impedance transistor, and an ON resistance operating in accordance with a potential at a point at which the second transistor and the second resistance are connected in place of the second output impedance transistor.

According to another mode of the Constitution 30, a plurality of transistors connected in parallel to each other and having a different transistor size respectively is provided in place of the first output impedance transistor, and a plurality of transistors connected in parallel to each other and having a different transistor size respectively is provided in place of the second output impedance transistor. FIG. 47 in the preferred embodiments described later can be referenced for the Constitution 31.

According to the Constitution 31, the impedance can be adjusted in such a manner that steps are more finely divided.

Summarizing the description of the constitutions, the output impedance can be adjusted in accordance with the output current of the operational amplifier without any complication of the operational amplifier. Therefore, the reduction of the voltage drop, stabilization of the output voltage and reduction of the power consumption can be achieved irrespective of the variation of the power consumption.

According to the present invention, a power supply circuit wherein the voltage drop is eliminated, the output voltage is stable and the power consumption is small irrespective of the amount of the consumed current can be realized. As a result, an operational amplifier having a complicated structure becomes unnecessary, which reduces an area of a system to which the power supply circuit is mounted.

The technology according to the present invention is effective as a technology for reducing an area of a circuit and a system in a power supply circuit with a high drive performance having a mixed loading of a liquid crystal display driver, a control circuit, RAM and the like.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art upon the implementation of the present invention.

FIG. 2 shows a constitution of an operational amplifier according to the preferred embodiment 1.

FIG. 20 shows a circuit configuration (2) of the first comparator according to the preferred embodiment 4.

FIG. 25 is a timing chart of a timing controller according to the preferred embodiment 6.

FIG. 36 shows a circuit configuration (2) of the latch-up preventing circuit according to the preferred embodiment 8.

DETAILED DESCRIPTION OF THE INVENTION

Figure 1A:
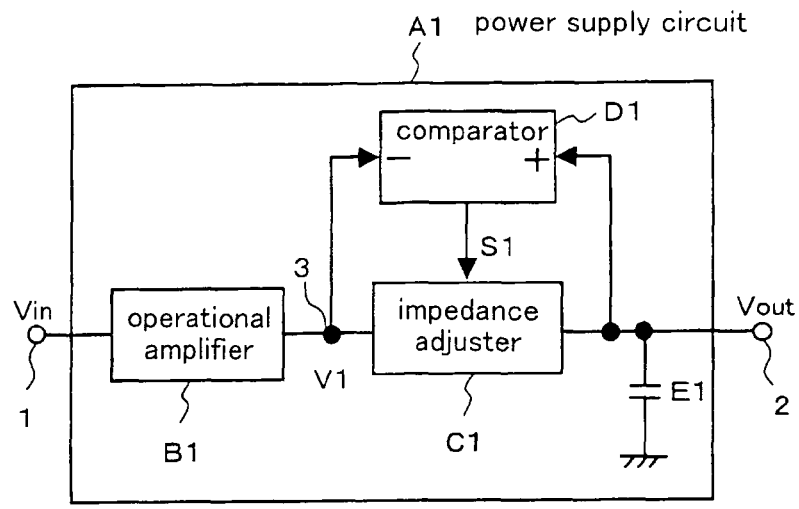
FIG. 1A is a block diagram illustrating a constitution of a power supply circuit according to a preferred embodiment 1 of the present invention.

Hereinafter, preferred embodiments of a power supply circuit according to the present invention are described in detail referring to the drawings.

Preferred Embodiment 1

Figure 1B:
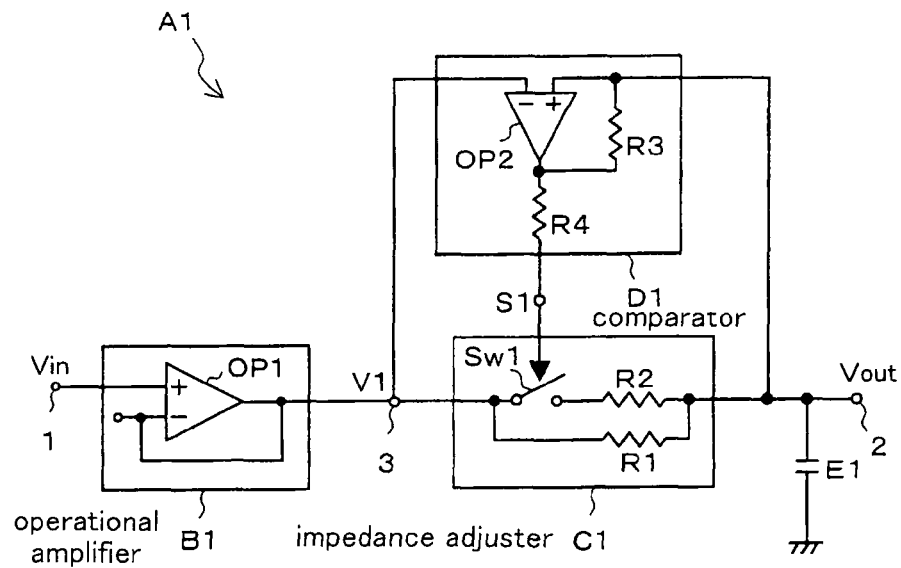
FIG. 1B shows a detailed circuit configuration of the circuit shown in FIG. 1A.

A power supply circuit according to a preferred embodiment 1 of the present invention is described below. FIG. 1A is a block diagram illustrating a constitution of the power supply circuit according to the preferred embodiment 1. FIG. 1B shows a detailed configuration of the circuit shown in FIG. 1A. Referring to reference symbols shown in FIGS. 1A and 1B, A1 denotes a power supply circuit, 1 denotes an input terminal of a reference potential Vin, 2 denotes an output terminal of the power supply circuit A1, B1 denotes an operational amplifier for generating a power supply potential V1 based on the applied reference potential Vin, C1 denotes an impedance adjuster inserted between an output terminal 3 of the operational amplifier B1 and the power supply circuit output terminal 2 and adjusting an impedance in accordance with a control signal S1, D1 denotes a comparator for comparing a power supply circuit output voltage Vout in the power supply circuit output terminal 2 and the output voltage V1 of the operational amplifier B1 to each other and outputting the control signal S1 based on a result of the comparison to the impedance adjuster C1, and E1 denotes a charge accumulator connected to the power supply circuit output terminal 2 in order to accumulate a charge in the power supply circuit output terminal 2.

The operational amplifier B1 has a structure of a voltage follower structure shown in FIG. 2, and the reference potential Vin is inputted to a non-inversion input terminal (+) of an operational amplifier OP1. An output terminal 3 of the operational amplifier OP1 is connected to an inversion input terminal (−) thereof. The operational amplifier OP1 basically has a structure of a two-stage amplifier shown in FIG. 3. P1, P2 and P3 denote Pch transistors, and N1, N2, N3 and N4 denote Nch transistors.

Figure 4:
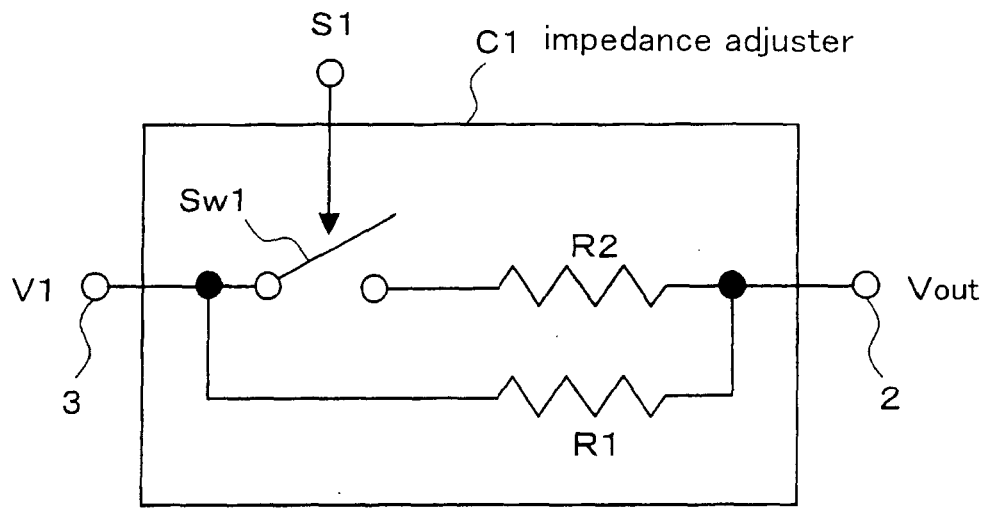
FIG. 4 shows a circuit configuration (1) of an impedance adjuster according to the preferred embodiment 1.

The impedance adjuster C1 has a structure shown in FIG. 4. A parallel circuit comprising a resistance R1, a switch Sw1 and a resistance R2 is connected to between the output terminal 3 of the operational amplifier B1 and the power supply circuit output terminal 2, and the switch Sw1 is opened and closed by the control signal S1 outputted from the comparator D1. The resistances R1 and R2 generally have an impedance in the range of a few Ω-a few hundreds of Ω in order to stabilize the level of the power supply circuit output voltage Vout.

Figure 5:
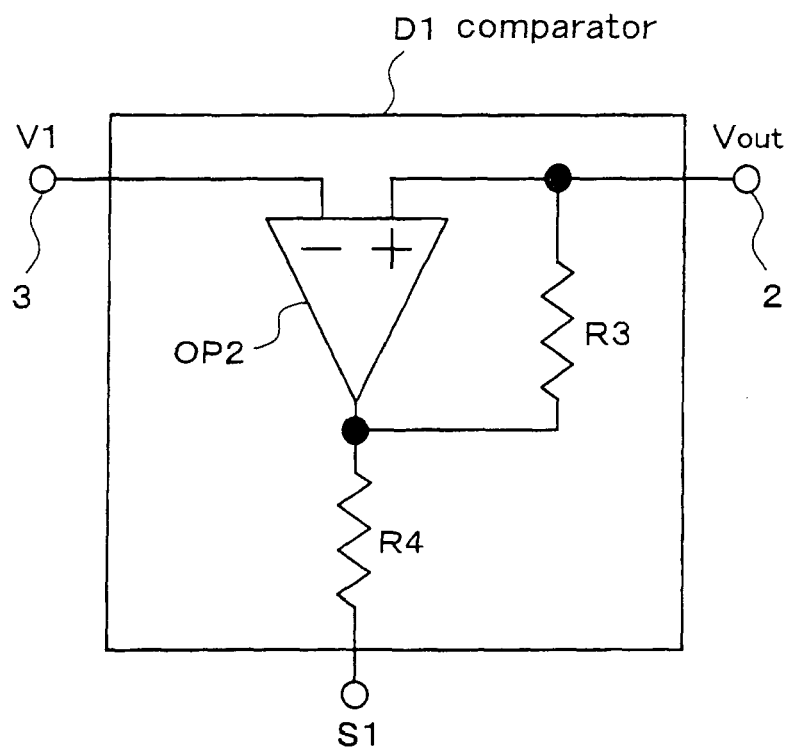
FIG. 5 shows a circuit configuration (1) of a comparator according to the preferred embodiment 1.

The comparator D1 has a structure of a hysteresis comparator shown in FIG. 5. The output voltage V1 of the operational amplifier B1 is inputted to an inversion input terminal (−) of an operational amplifier OP2. The power supply circuit output voltage Vout is inputted to a non-inversion input terminal (+) of the operational amplifier OP2. The resistance R3 is connected between the non-inversion input terminal (+) and an output terminal of the operational amplifier OP2. The resistance R4 is connected between the output terminal of the operational amplifier OP2 and the impedance adjuster C1. The charge accumulator E1 has an electrostatic capacitance of a few μF (Microfarad) order in order to smoothen the variation of the output voltage V1.

Next, an operation of the power supply circuit A1 according to the present preferred embodiment thus constituted is described. In a state where the power supply circuit output terminal 2 is unloaded, a current amount from the operational amplifier B1 is small, and a voltage drop in the impedance adjuster C1 is small (for example, lower than 100 mV). As a result, in the comparator D1 as the hysteresis comparator, the power supply circuit output voltage Vout is equal to the output voltage V1 of the operational amplifier B1, and the comparator D1 outputs "H" level as the control signal S1. Accordingly, the switch Sw1 in the impedance adjuster C1 is turned off and the resistance R is thereby separated, therefore, a resistance level in the impedance adjuster C1 is increased. More specifically, in order to secure phase compensation in the operational amplifier B1, the resistance level in the impedance adjuster C1 is as high as, for example, 100 Ω-a few MΩ.

In a state where the power supply circuit output terminal 2 is under the load, the output current of the operational amplifier B1 is increased (for example, 1 mA), and the voltage drop in the impedance adjuster C1 is increased (for example, higher than 100 mV). As a result, the power supply circuit output voltage Vout is lower than the output voltage V1 of the operational amplifier B1 in the comparator D1, and the comparator D1 outputs "L" level as the control signal S1. Accordingly, the switch Sw1 in the impedance adjuster C1 is turned on, and the resistance R2 is connected in parallel to the resistance R1. As a result, the resistance level in the impedance adjuster C1 becomes low. More specifically, the resistance in the impedance adjuster C1 becomes as low as, for example, a few Ω-at most 100Ω, in order to control the voltage drop.

As described above, according to the present preferred embodiment, the impedance of the impedance adjuster C1 is automatically adjusted depending on the presence or absence of the load at the power supply circuit output terminal 2. Thereby, trade-off between the reduction of the voltage drop and stability of the output voltage can be cancelled while area reduction is realized without any complication of the operational amplifier B1. Therefore, it is possible to realize a power supply circuit that has a high drive performance (at least a few mA) with less power consumption, a phase allowance and a high stability.

Further, the switch Sw1 can be opened and closed in a stable manner irrelevant to the off-set voltage of the operational amplifier B1 because the comparator D1 is connected to between the both ends of the impedance adjuster C1.

Modified Embodiment of the Preferred Embodiment 1

Figure 6:
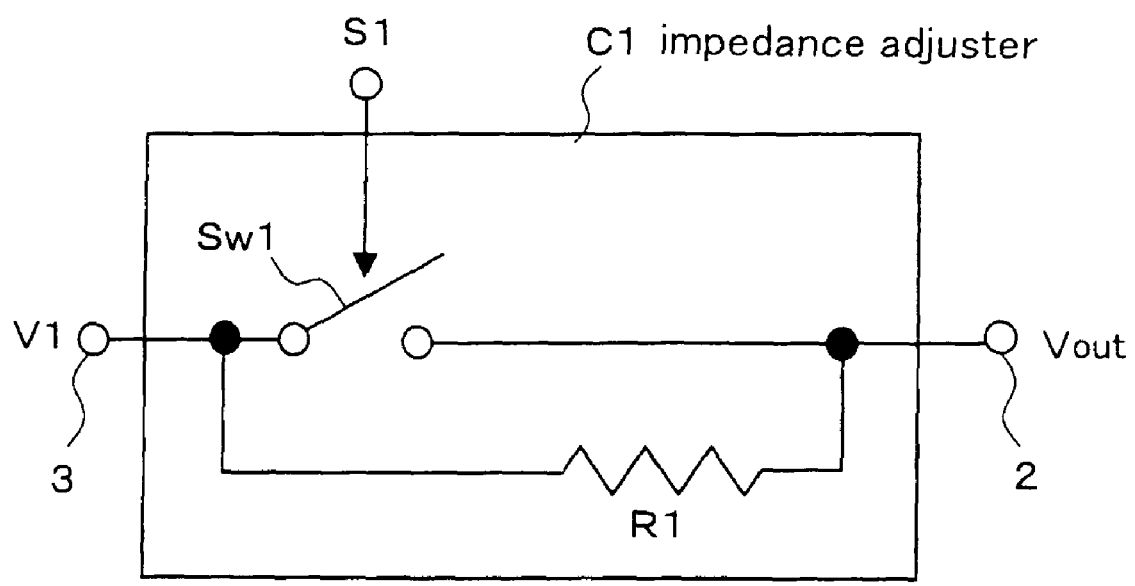
FIG. 6 shows a circuit configuration (2) of the impedance adjuster according to the preferred embodiment 1.

Other constitutions of the impedance adjuster C1 are described. In an impedance adjuster shown in FIG. 6, the resistance R2 shown in FIG. 4 is deleted, and the ON resistance of the switch Sw1 is utilized in place of the resistance R2. In an impedance adjuster C1 shown in FIG. 7, a parallel circuit comprising Nch transistors N5 and N6 is inserted between the output terminal 3 of the operational amplifier B1 and the power supply circuit output terminal 2. These Nch transistors N5 and N6 are different in their ON resistances and transistor sizes respectively. A Pch transistor P4 and an Nch transistor N7 constitute an inverter, and one of the Nch transistor N5 and the Nch transistor N6 is conducted.

Figure 8:
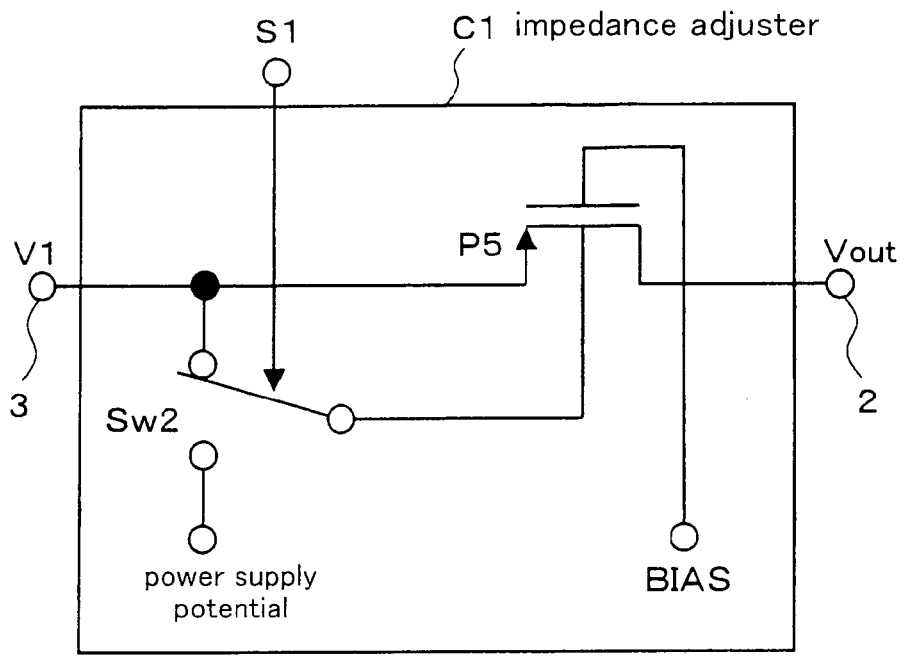
FIG. 8 shows a circuit configuration (4) of the impedance adjuster according to the preferred embodiment 1.

In an impedance adjuster C1 shown in FIG. 8, a Pch transistor P5 is connected between the output terminal 3 of the operational amplifier B1 and the power supply circuit output terminal 2. A potential BIAS equal to or above a threshold voltage is supplied to a gate potential of the Pch transistor P5. A switch Sw2 is turned on or off in accordance with the control signal S1 outputted from the comparator D1. A back gate potential of the Pch transistor P5 can be thereby selected from one of a source potential of the Pch transistor P5 and the power supply potential.

Figure 9:
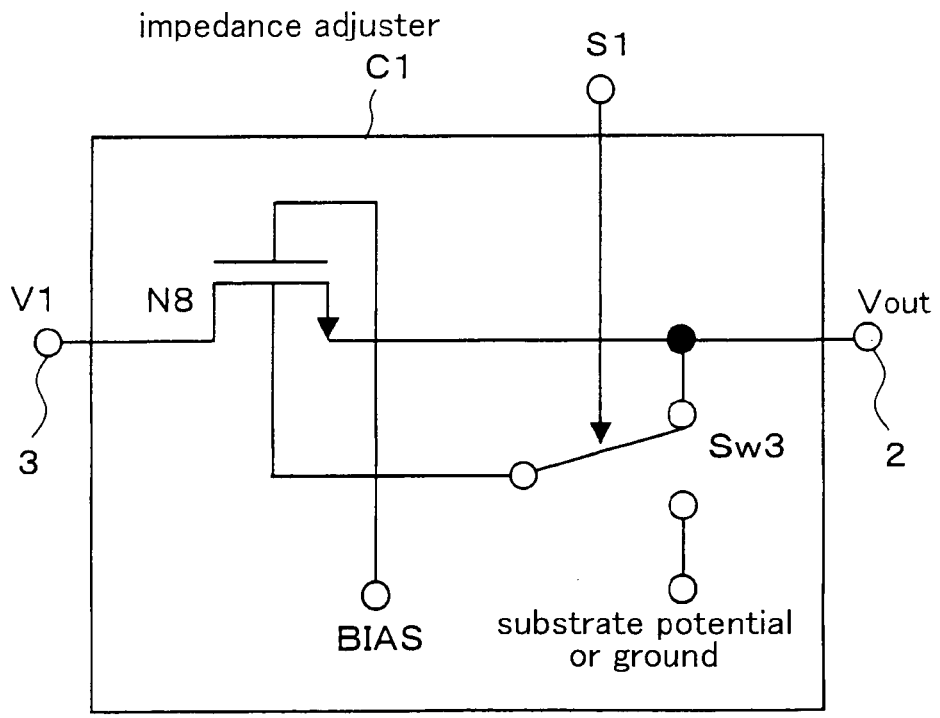
FIG. 9 shows a circuit configuration (5) of the impedance adjuster according to the preferred embodiment 1.

In an impedance adjuster C1 shown in FIG. 9, an Nch transistor N8 is provided in place of the Pch transistor P5 shown in FIG. 8. A switch Sw3 is turned on or off in accordance with the control signal S1 outputted from the comparator D1 so that a back gate potential of the Nch transistor N8 can be selected from one of a source potential of the Nch transistor N8, a substrate potential and a ground potential.

Figure 10:
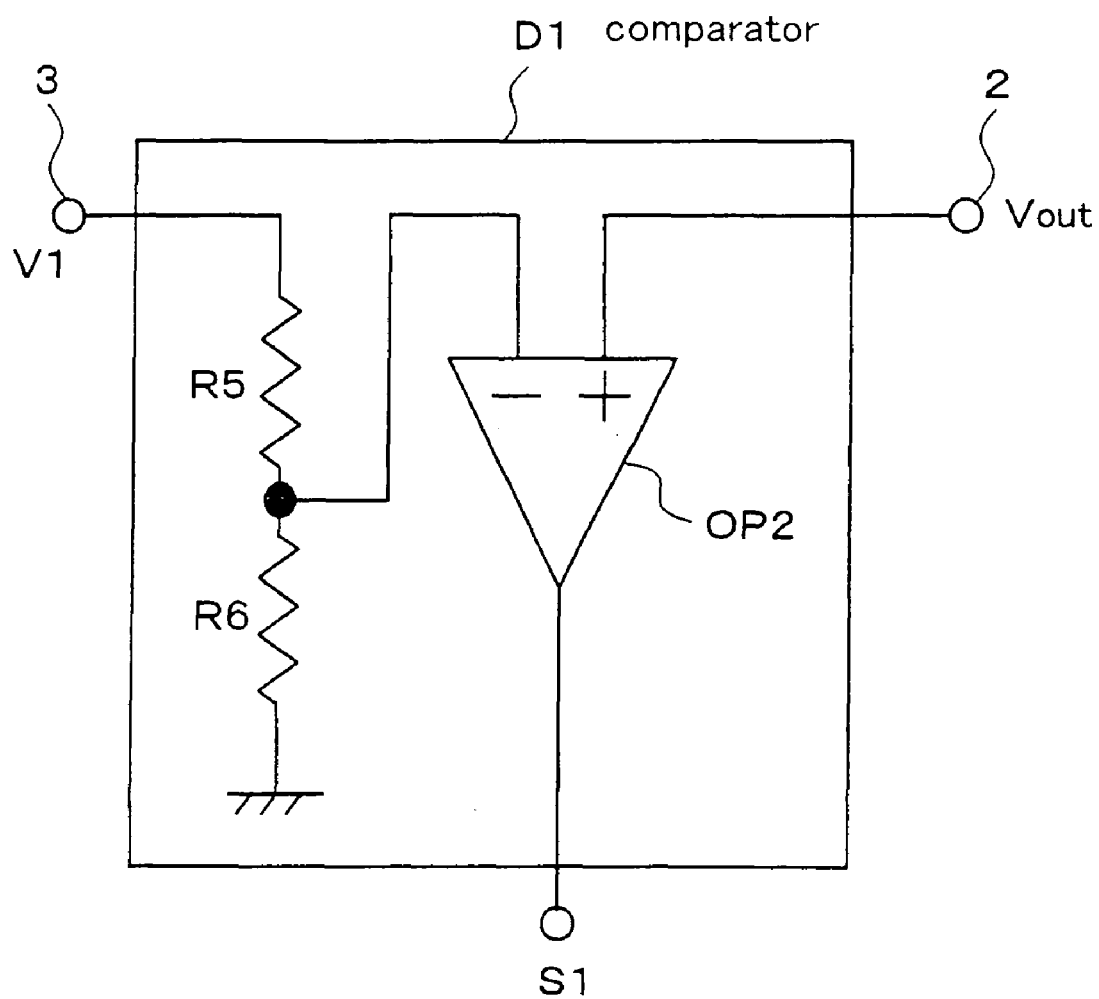
FIG. 10 shows a circuit configuration (2) of the comparator according to the preferred embodiment 1.

Next, another constitutions of the comparator D1 are described. In a comparator D1 shown in FIG. 10, a divided voltage by resistance of the output voltage V1 of the operational amplifier B1 is inputted to the inversion input terminal (−) of the operational amplifier OP2 shown in FIG. 5, and the power supply circuit output voltage Vout is inputted to the non-inversion input terminal (+) of the operational amplifier OP2. In this constitution, the comparator D1 can be linearly operated, and the switch can be opened and closed in a more stable manner.

Figure 3:
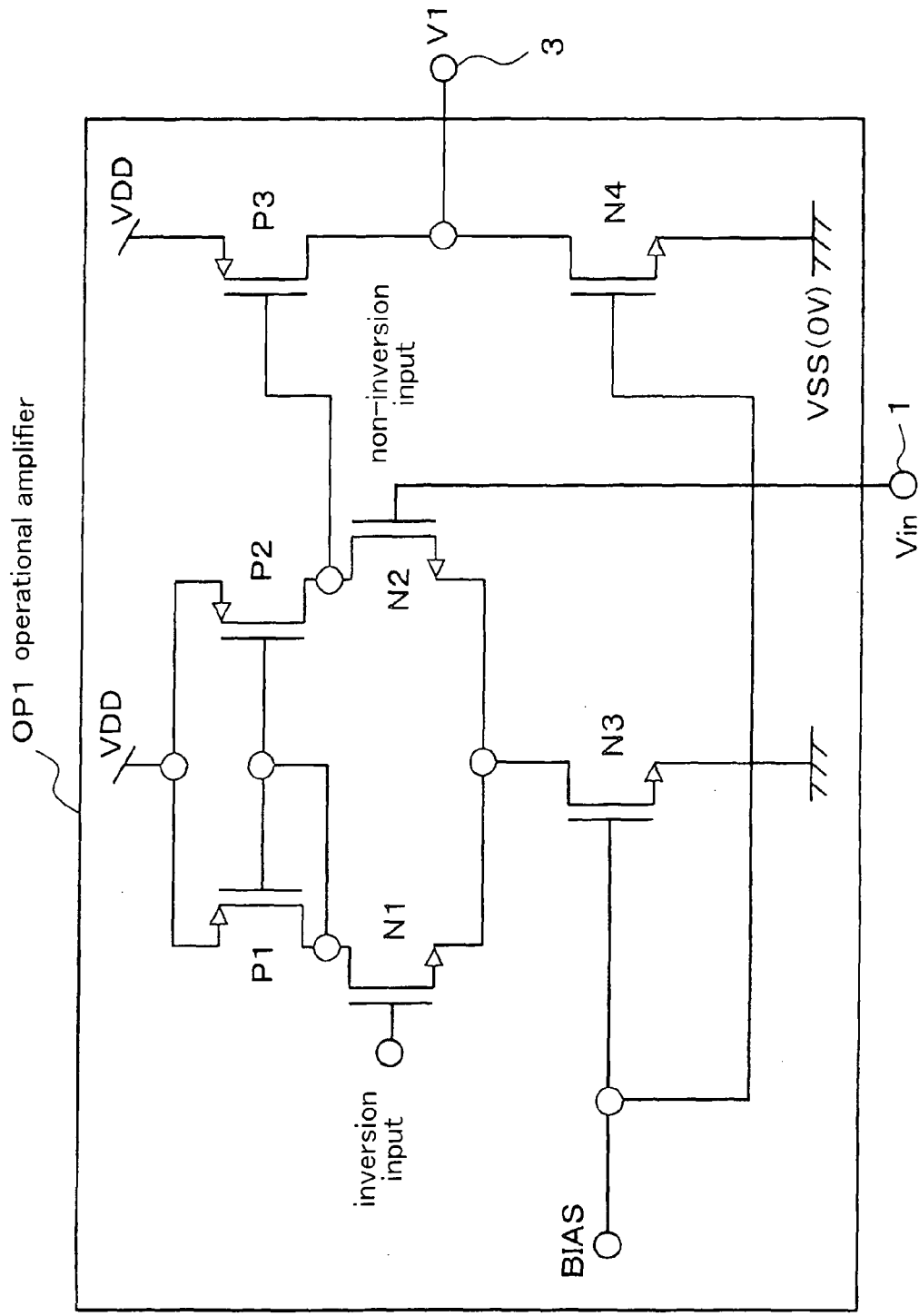
FIG. 3 shows a circuit configuration of the operational amplifier according to the preferred embodiment 1.

In FIG. 3, the two-stage amplifying circuit is used as the operational amplifier OP1. However, it is needless to say that the effect of the power supply circuit A1 according to the present preferred embodiment can be still exerted in the case where a three-stage amplifying circuit, a Rail-to-Rail operational amplifier or the like is adopted.

Figure 7:
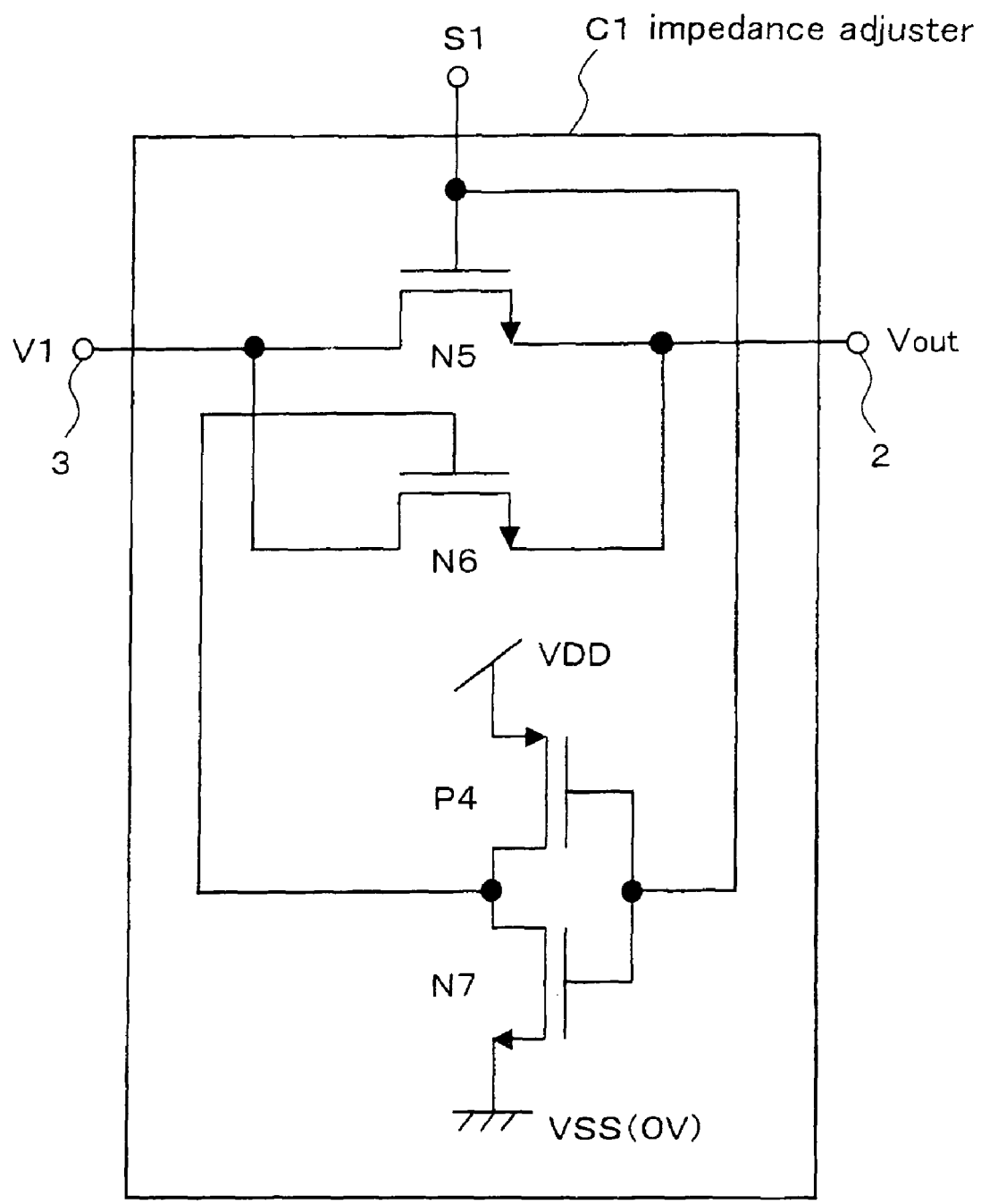
FIG. 7 shows a circuit configuration (3) of the impedance adjuster according to the preferred embodiment 1.

In FIG. 7, the Nch transistor is adopted as the circuit element, however, a similar circuit can be realized when the Pch transistor is used as the circuit element.

Preferred Embodiment 2

Figure 11:
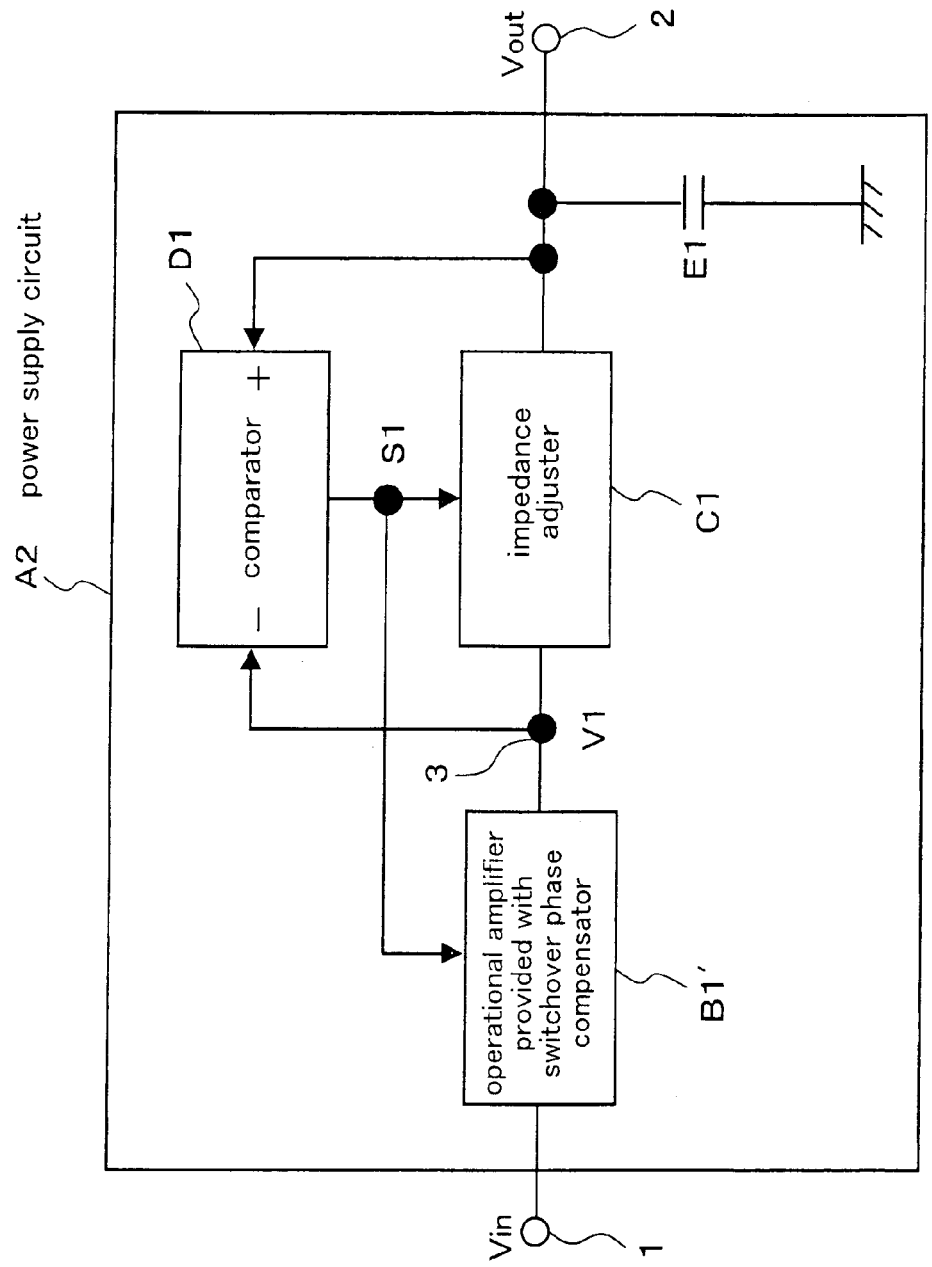
FIG. 11 is a block diagram illustrating a constitution of a power supply circuit according to a preferred embodiment 2 of the present invention.

FIG. 11 is a block diagram illustrating a constitution of a power supply circuit A2 according to a preferred embodiment 2 of the present invention. In FIG. 11, the same references as those shown in FIG. 1 according to the preferred embodiment 1 denote the same constituent elements, and they are not described again. The power supply circuit A2 is provided with an operational amplifier B1' to which a switchover phase compensator is attached in place of the operational amplifier B1. Accordingly, the impedance adjuster C1 and the operational amplifier B1' are controlled by the control signal S1 from the comparator D1.

Figure 12:
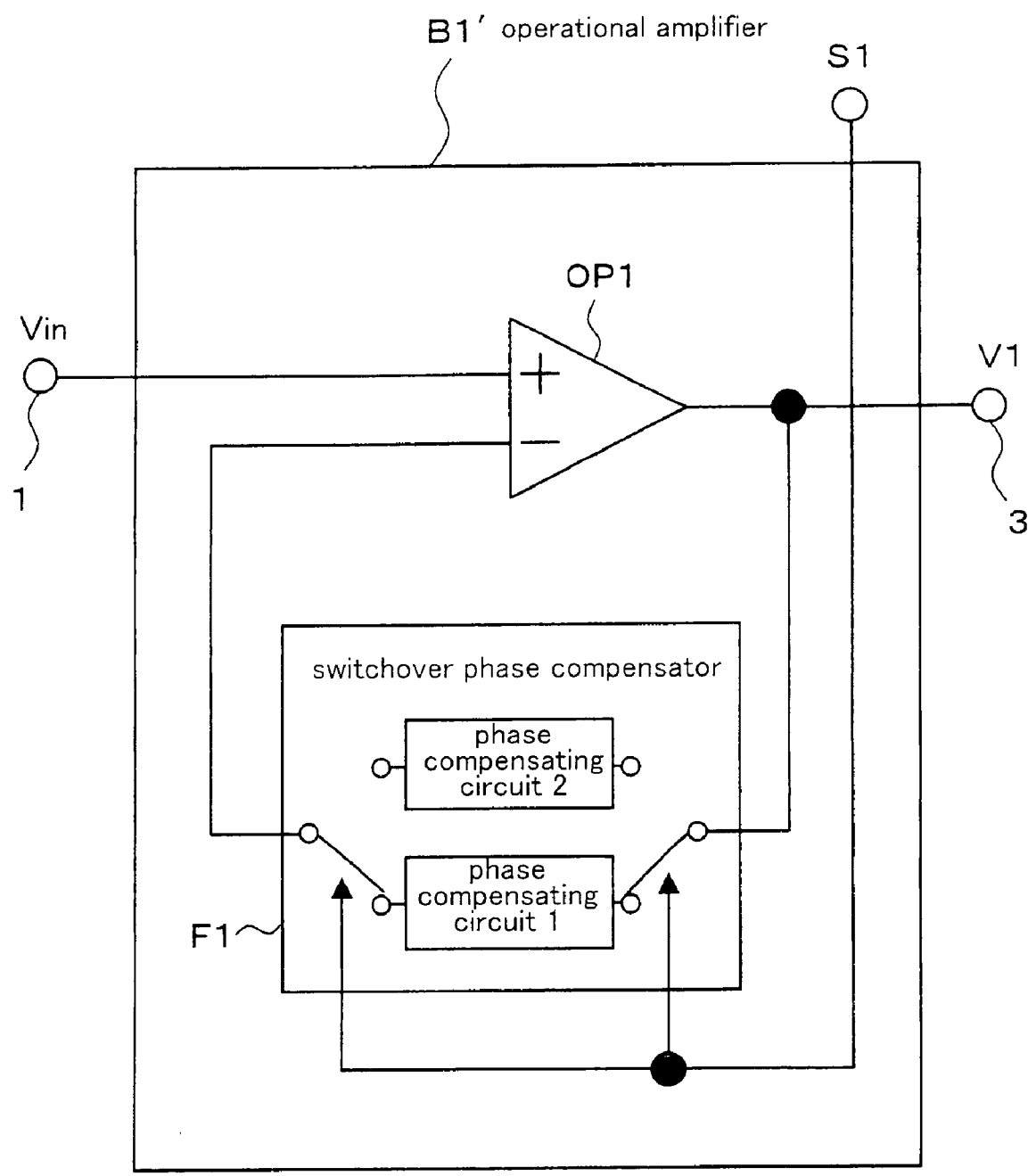
FIG. 12 shows constitutions of an operational amplifier and a switchover phase compensator in the power supply circuit according to the preferred embodiment 2.

The operational amplifier B1' is configured as shown in FIG. 12. A switchover phase compensator F1 is provided between the inversion input terminal (−) of the operational amplifier OP1 and an output terminal 3 of the operational amplifier B1', and the two phase compensating circuits are selected by the switch. The operational amplifier OP1, which is configured in the same manner as that of FIG. 3, is not described again.

Figure 13:
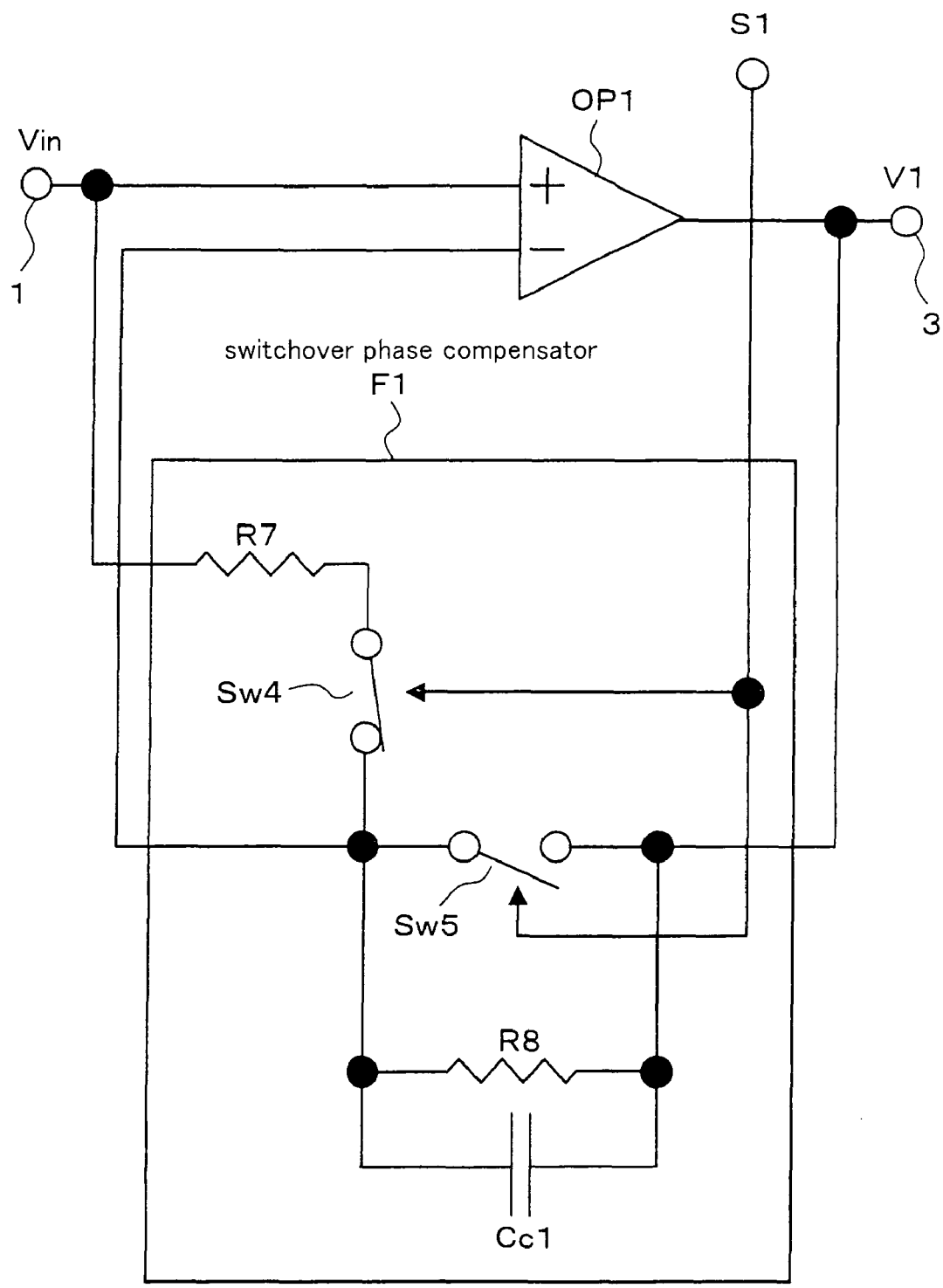
FIG. 13 shows a circuit configuration (1) of the switchover phase compensator in the power supply circuit according to the preferred embodiment 2.

The switchover phase compensating circuit F1 is configured as shown in FIG. 13. A series circuit comprising a resistance R7 and a switch Sw4 is provided between an input terminal 1 of the reference potential Vin and the inversion input terminal (−) of the operational amplifier OP1. A parallel circuit comprising a switch Sw5, a resistance R8 and a phase compensating capacitor Cc1 is provided between the output terminal and the inversion input terminal (−) of the operational amplifier OP1. The switches Sw4 and Sw5 are turned on and off oppositely to each other by the control signal S1 outputted from the comparator D1.

Next, an operation of the power supply circuit A2 according to the present preferred embodiment thus constituted is described. In the state of unloading, the control signal S1 from the comparator D1 is at the "H" level, and the impedance of the impedance adjuster C1 is thereby increased. At the time, the switch Sw4 of the switchover phase compensator F1 is simultaneously turned on, and the switch Sw5 is turned off. Then, the phase compensating capacitor Cc1 is connected to the inversion input terminal (−) of the operational amplifier OP1, and as a result, the operational amplifier OP1 functions as an inversion amplifying circuit.

In the state under the load, the control signal S1 from the comparator D1 is at the "L" level, and the impedance of the impedance adjuster C1 is thereby reduced. At the time, the switch Sw4 of the switchover phase compensator F1 is simultaneously turned off, and the switch Sw5 is turned on. As a result, the operational amplifier OP1 functions as a voltage follower.

As described above, according to the present preferred embodiment, the phase compensating capacitor Cc1 is connected and the operational amplifier OP1 functions as the inversion amplifying circuit in the state of unloading in a manner different to the preferred embodiment 1. As a result, the operational amplifier OP1 is further stabilized.

Modified Embodiment of the Preferred Embodiment 2

Figure 14:
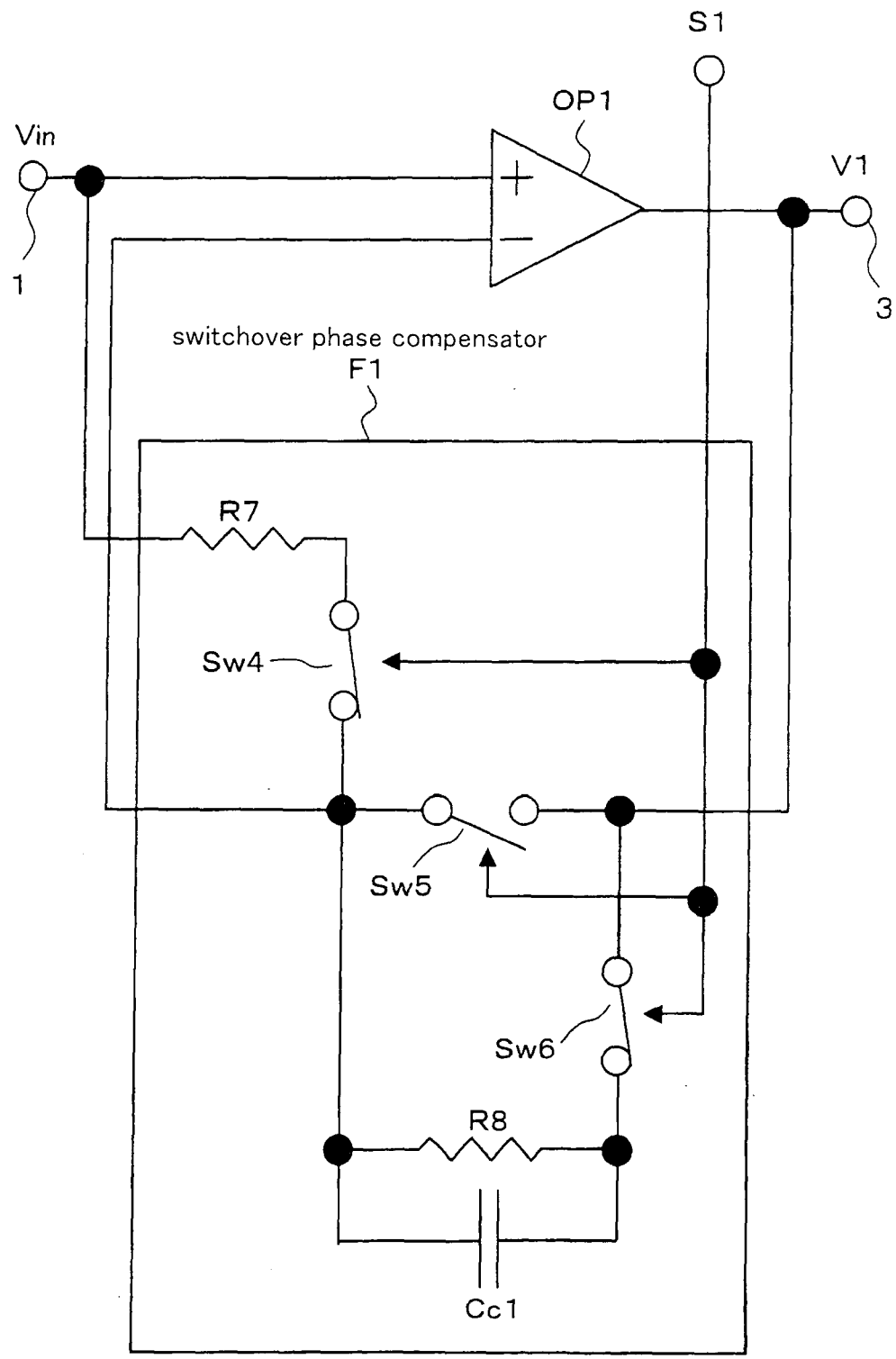
FIG. 14 shows a circuit configuration (2) of the switchover phase compensator in the power supply circuit according to the preferred embodiment 2.

In a switchover phase compensator F1 shown in FIG. 14, which is configured in a manner different to FIG. 13, a switch Sw6, which is turned on and off based on the control signal S1 from the comparator D1, is inserted between the output terminal 3 of the operational amplifier B1' and the resistance R8. In the state of unloading, the control signal S1 is at the "H" level. The switch Sw6 is turned on by the control signal at the "H" level, while the switch Sw6 is turned off by the control signal S1 at the "L" level in the state under the load.

According to the constitution, the switch Sw6 is in the OFF state and the capacitor Cc1 is thereby separated when the operational amplifier OP1 functions as the voltage follower so that discharging from the capacitor Cc1 is prevented. As a result, the capacitor Cc1 is charged at a higher speed when the structure functioning as the voltage follower is switched to the one functioning as the inversion amplifying circuit in the operational amplifier OP1, and an output rising speed of the power supply circuit A2 is thereby increased.

Further, the ON resistances of the switches Sw4 and Sw6 are equally set, and a resistance ratio in the function as the inversion amplifier is equal. As a result, the offset can be surely reduced.

Figure 15:
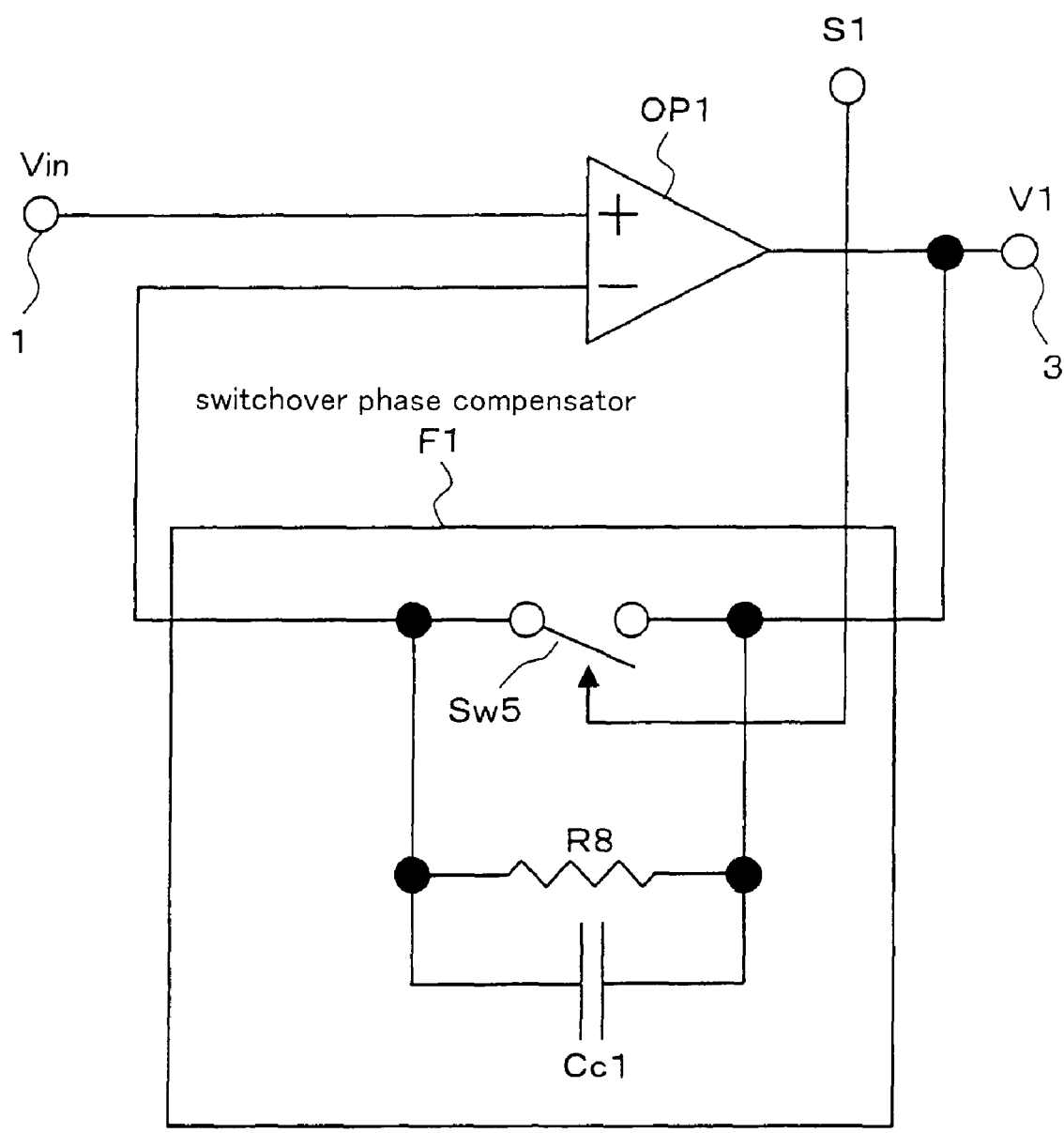
FIG. 15 shows a circuit configuration (3) of the switchover phase compensator in the power supply circuit according to the preferred embodiment 2.

In a switchover phase compensator F1 shown in FIG. 15, differing from the one in. FIG. 13, the resistance R7 and the switch Sw4 are eliminated. Accordingly, the circuit area can be reduced while the phase allowance in the state of unloading is secured.

The switch Sw6, which is added in the constitution shown in FIG. 14, is not provided in the constitution shown in FIG. 15, however, the switch Sw6 can be provided even in the circuit configuration shown in FIG. 15.

Preferred Embodiment 3

Figure 16:
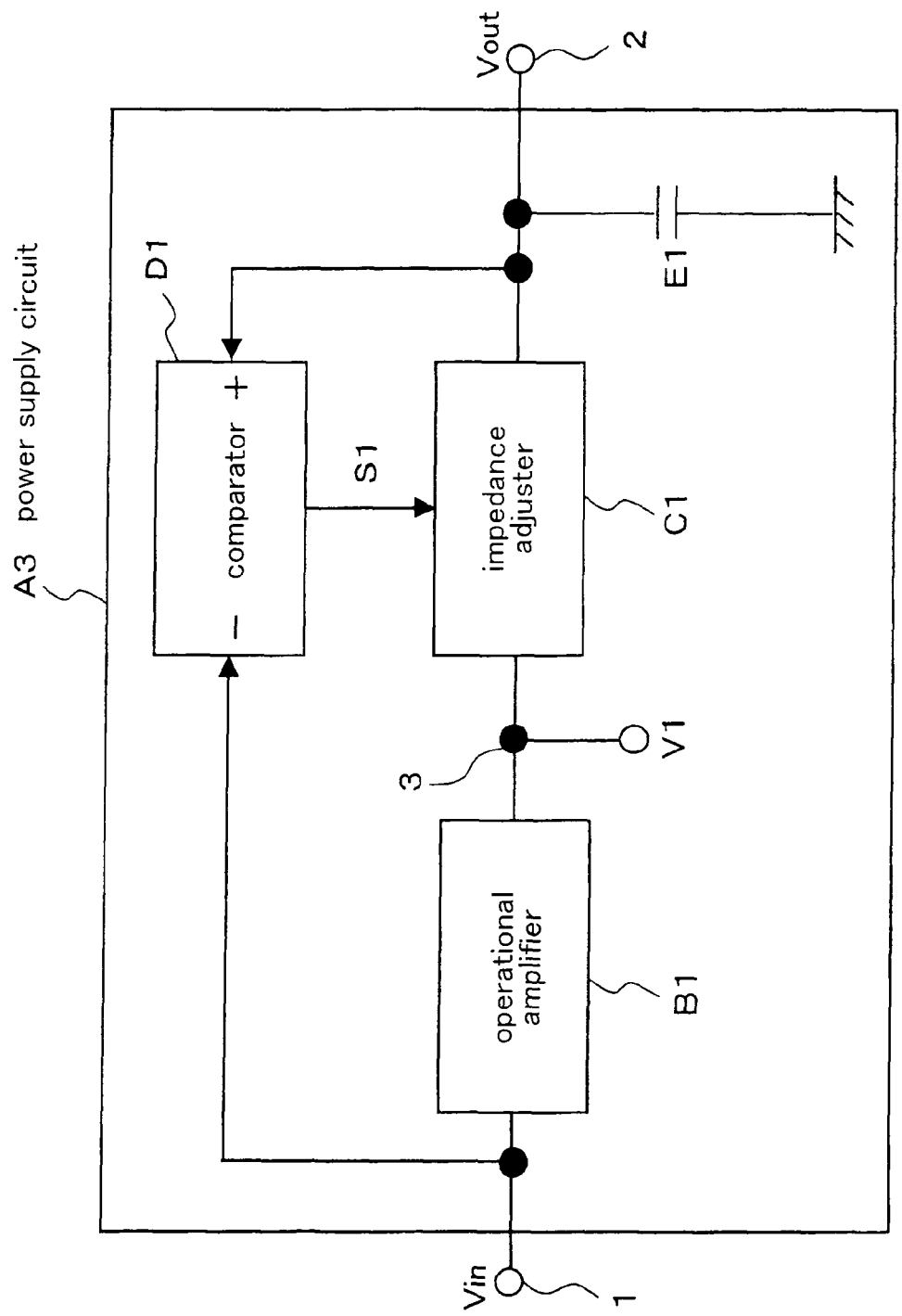
FIG. 16 is a block diagram illustrating a constitution of a power supply circuit according to a preferred embodiment 3 of the present invention.

FIG. 16 is a block diagram illustrating a constitution of a power supply circuit A3 according to a preferred embodiment 3 of the present invention. In FIG. 11, the same references as those shown in FIG. 1 according to the preferred embodiment 1 denote the same constituent elements, and they are not described again. In the power supply circuit A3 according to the present preferred embodiment, the comparator D1 compares the power supply circuit output voltage Vout and the reference potential Vin applied to the input terminal 1 to each other, and outputs the control signal S1 in accordance with a result of the comparison to the impedance adjuster C1.

According to the present preferred embodiment, the input from the comparator D1 to the inversion input terminal (−) is free of any influence of the operational amplifier B1, which improves the response speed of the comparator D1. Any other operation is similar to that of the preferred embodiment 1 and is not described again.

Modified Embodiment of the Preferred Embodiment 3

Figure 17:
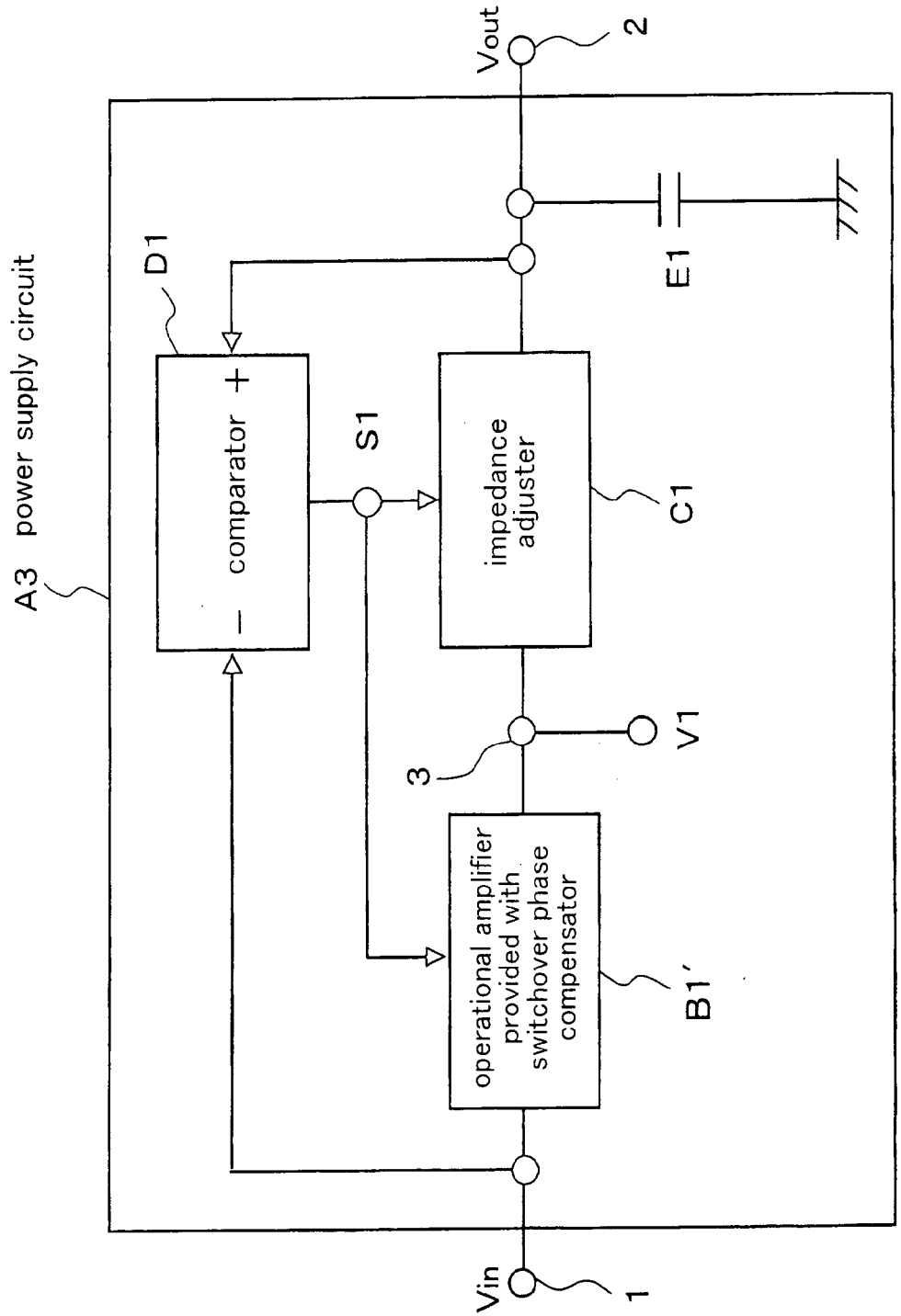
FIG. 17 is a block diagram illustrating a constitution of a power supply circuit according to a modified embodiment of the preferred embodiment 3.

A power supply circuit A3' shown in FIG. 17 corresponds to a constitution wherein the preferred embodiment 3 is applied to the constitution shown in FIG. 11 according to the preferred embodiment 2. More specifically, the comparator D1 compares the power supply circuit output voltage Vout and the reference potential Vin applied to the input terminal 1 to each other, and outputs the control signal S1 in accordance with a result of the comparison to the impedance adjuster C1 and the switchover phase compensator F1 in the operational amplifier B1'. According to the constitution, the response speed of the comparator D1 is improved in comparison to the constitution shown in FIG. 11.

Preferred Embodiment 4

Figure 18:
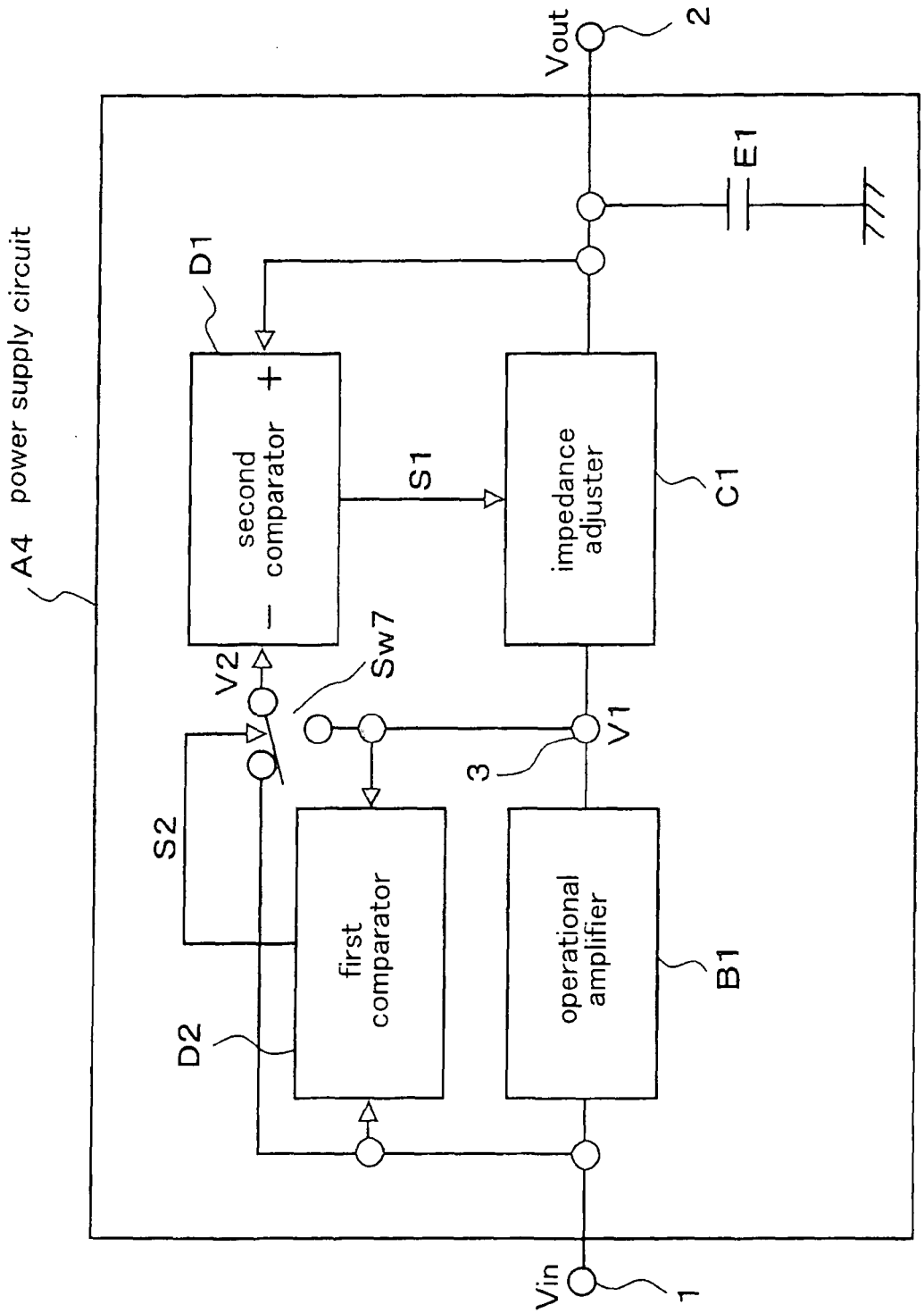
FIG. 18 is a block diagram illustrating a constitution of a power supply circuit according to a preferred embodiment 4 of the present invention.

FIG. 18 is a block diagram illustrating a constitution of a power supply circuit A4 according to a preferred embodiment 4 of the present invention. In FIG. 18, B1 denotes an operational amplifier for generating the power supply potential V1 from the reference potential Vin applied to the input terminal 1. C1 denotes an impedance adjuster provided between the output terminal 3 of the operational amplifier B1 and the power supply circuit output terminal 2 in order to adjust the impedance in accordance with the control signal S1. E1 denotes a charge accumulator connected to the power supply circuit output terminal 2 and accumulating a charge in the power supply circuit output terminal 2. D2 denotes a first comparator for comparing the reference potential Vin applied to the input terminal 1 and the output voltage V1 of the operational amplifier B1 to each other. Sw7 denotes a switch for selecting one of the reference potential Vin and the output voltage V1 of the operational amplifier B1 through being switched based on a switchover signal S2 in accordance with a result of the comparison by the first comparator D2. D1 denotes a second comparator for comparing an output voltage V2 of the switch Sw7 and the power supply circuit output voltage Vout to each other in order to output the control signal S1 in accordance with a result of the comparison to the impedance adjuster C1.

Figure 19:
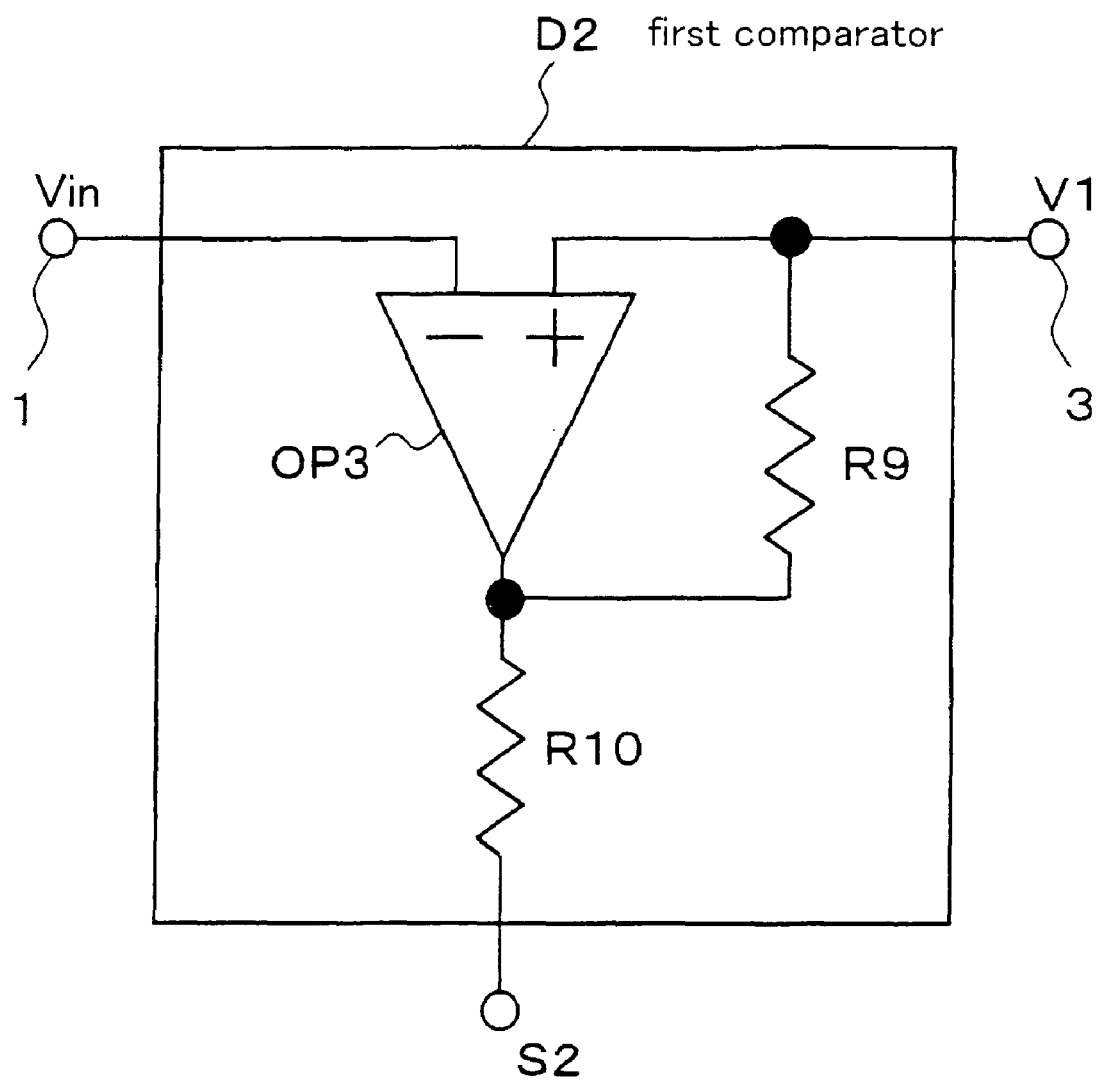
FIG. 19 shows a circuit configuration (1) of a first comparator according to the preferred embodiment 4.

The first comparator D2 has a structure of a hysteresis comparator shown in FIG. 19. The reference potential Vin is inputted to an inversion input terminal (−) of an operational amplifier OP3. The output voltage V1 of the operational amplifier B1 is inputted to an non-inversion of the operational amplifier OP3. An output of the operational amplifier OP3 is the switching signal S2 for opening and closing the switch Sw7.

Next, an operation of the power supply circuit A4 according to the present preferred embodiment thus constituted is described. When the power supply arises, the first comparator D2 compares the reference potential Vin to the output voltage V1 of the operational amplifier B1. In an initial stage after rising of the power supply, the output voltage V1 of the operational amplifier B1 is lower than the reference potential (a voltage difference is, for example, at least 100 mV). Therefore, the switch Sw7 is controlled by the switching signal S2 outputted by the first comparator D2, and the output voltage V2 of the switch Sw7 is connected to the input of the second comparator D1. Accordingly, the second comparator D1 compares the power supply circuit output voltage Vout to the reference potential Vin in the initial stage after rising of the power supply. A rising speed of the reference potential Vin is faster than that of the input voltage of the impedance adjuster C1, that is the output voltage V1 of the operational amplifier B1.

When the output voltage V1 of the operational amplifier B1 is stabilized based on elapse of the time, the switchover signal S2 outputted from the first comparator D2 is inverted, and the switch Sw7 connects the output voltage V1 of the operational amplifier BE to the input of the second comparator D1, in response to the signal inversion. Therefore, in a latter stage after rising of the power supply, the comparison processing in the second comparator D1 shifts to a mode where the power supply circuit output voltage Vout is compared to the output voltage V1 of the operational amplifier B1. As any other operation is similar to that of the preferred embodiment 1, it is not described again.

As described above, according to the present preferred embodiment, the operation of the second comparator D1 can be speedily started in the initial stage after rising of the power supply. Further, the second comparator D1 can be accurately operated by switching the second comparator D1 to the comparison state without considering the offset after the operation of the operational amplifier B1 is stabilized. Thereby, the higher response speed and the higher accuracy in the comparison can be compatible.

Modified Embodiment of the Preferred Embodiment 4

In a first comparator D2 shown in FIG. 20, differing from the constitution shown in FIG. 19, a divided voltage by resistance of the reference potential Vin is inputted to the inversion input terminal (−) of the operational amplifier OP3, and the output voltage V1 of the operational amplifier B1 is inputted to the non-inversion input terminal (+). According to the constitution shown in FIG. 20, the first comparator D2 can be operated linearly, and the switch can be opened and closed in a more stable manner.

In the foregoing description, the reference potential Vin is inputted to the inversion input terminal (−) of the second comparator D1 immediately after the operational amplifier B1 starts its operation. However, it is needles to say that the reference potential Vin is inputted to the inversion input terminal (−) of the second comparator D1 even when the output voltage V1 of the operational amplifier B1 is reduced by an external factor.

Preferred Embodiment 5

Figure 21:
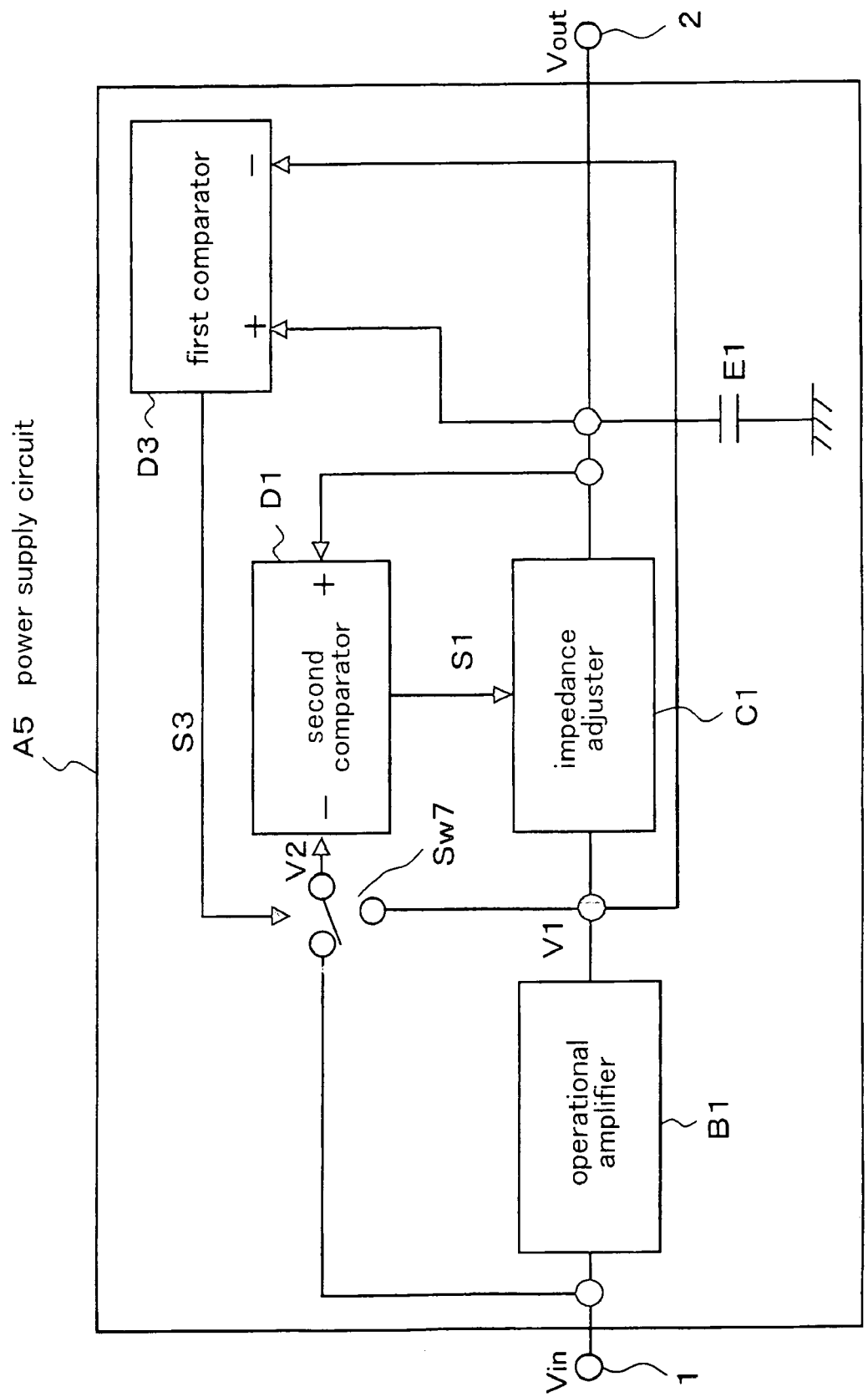
FIG. 21 is a block diagram illustrating a constitution of a power supply circuit according to a preferred embodiment 5 of the present invention.

FIG. 21 is a block diagram illustrating a constitution of a power supply circuit A5 according to a preferred embodiment 5 of the present invention. In FIG. 21, B1 denotes an operational amplifier for generating the power supply potential V1 based on the reference potential Vin applied to the input terminal 1. C1 denotes an impedance adjuster inserted between the output terminal 3 of the operational amplifier B1 and the power supply circuit output terminal 2 in order to adjust the impedance in accordance with the control signal S1. E1 denotes charge accumulator connected to the power supply circuit output terminal 2 in order to accumulate a charge in the power supply circuit output terminal 2. D3 denotes a first comparator for comparing the output voltage V1 of the operational amplifier B1 and the power supply circuit output voltage Vout to each other. Sw7 denotes a switch for selecting one of the reference potential Vin and the output voltage V1 of the operational amplifier B1 by being switched based on a switchover signal S3 in accordance with a result of the comparison by the first comparator D3. D1 denotes a second comparator for comparing the output voltage V2 of the switch Sw7 and the power supply circuit output voltage Vout to each other in order to output the control signal S1 in accordance with a result of the comparison to the impedance adjuster C1.

Figure 22:
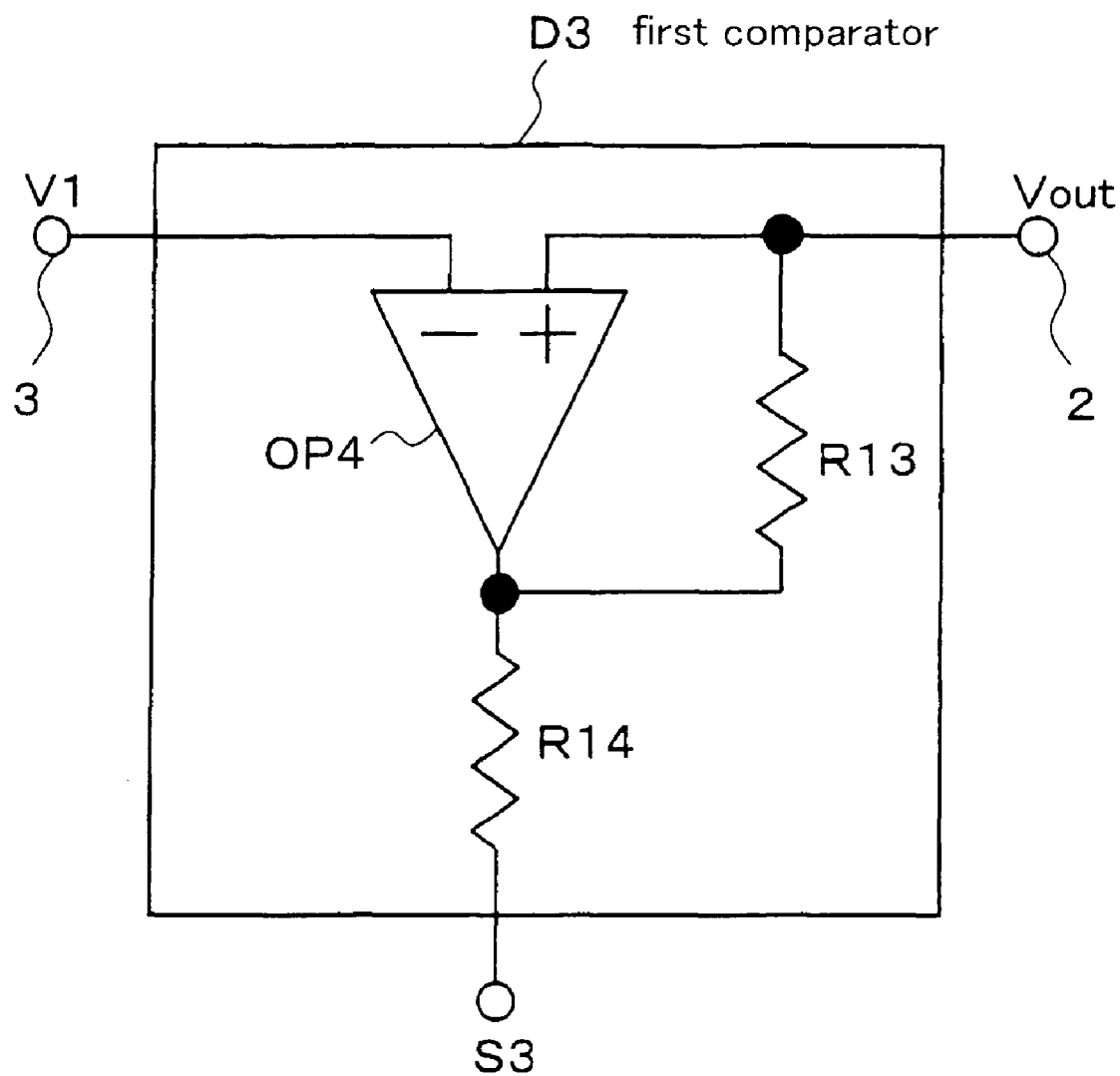
FIG. 22 shows a circuit configuration (1) of a first comparator according to the preferred embodiment 5.

The first comparator D3 has a structure of a hysterisis comparator shown in FIG. 22. The output voltage V1 of the operational amplifier B1 is inputted to an inversion input terminal (−) of an operational amplifier OP4. The power supply circuit output voltage Vout is inputted to an non-inversion input terminal (+) of the operational amplifier OP4. The output of the operational amplifier OP4 is the switchover signal S3 for opening and closing the switch SW7.

An operation of the power supply circuit A5 according to the present preferred embodiment thus constituted is described. When the output current of the operation amplifier B1 is increased and the potential difference in the impedance adjuster C1 is increased, the switch Sw7 controlled by the switchover signal S3 outputted by the first comparator D3 supplies the reference potential Vin to the input of the second comparator D1. Thereby, the second comparator D1 compares the power supply circuit output voltage Vout to the reference potential Vin so that the second comparator D1 is operated at a high speed.

Meanwhile, after the potential difference in the impedance adjuster C1 is reduced by the control signal S1 from the second comparator D1, the switching signal S3 outputted from the first comparator D3 is inverted. Therefore, the switch Sw7 controlled by the switchover signal S3 supplies the output voltage V1 of the operational amplifier B1 (input voltage of the impedance adjuster C1) to the second comparator D1. Accordingly, the second comparator D1 shifts to a comparison mode where the power supply circuit output voltage Vout is compared to the output voltage V1 of the operational amplifier B1, wherein the offset is not considered. Therefore, the operation of the second comparator D1 can be accurate. As a result, the speedy responsiveness and comparison with a high accuracy can be compatible.

Modified Embodiment of the Preferred Embodiment 5

Figure 23:
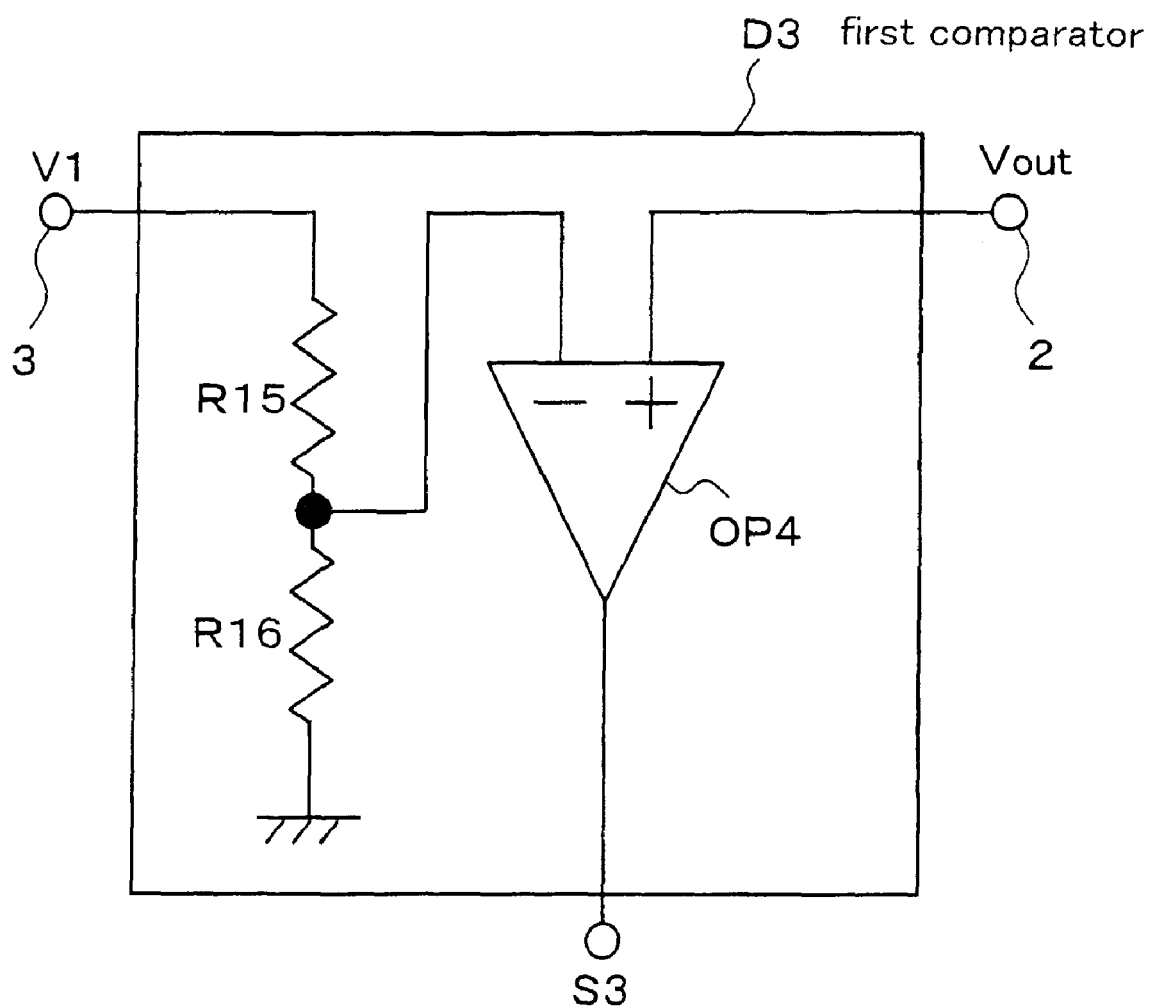
FIG. 23 shows a circuit configuration (2) of the first comparator according to the preferred embodiment 5.

A first comparator D3 shown in FIG. 23, differing from that of FIG. 22, inputs the divided voltage by resistance of the output voltage V1 of the operational amplifier B1 to the inversion input terminal (−) of the operational amplifier OP4, and inputs the power supply circuit output voltage Vout to the non-inversion input terminal (+) of the operational amplifier OP4. According to the constitution shown in FIG. 23, the first comparator D3 can be thereby operated linearly, which enables to open and close the switch more stably.

Preferred Embodiment 6

Figure 24:
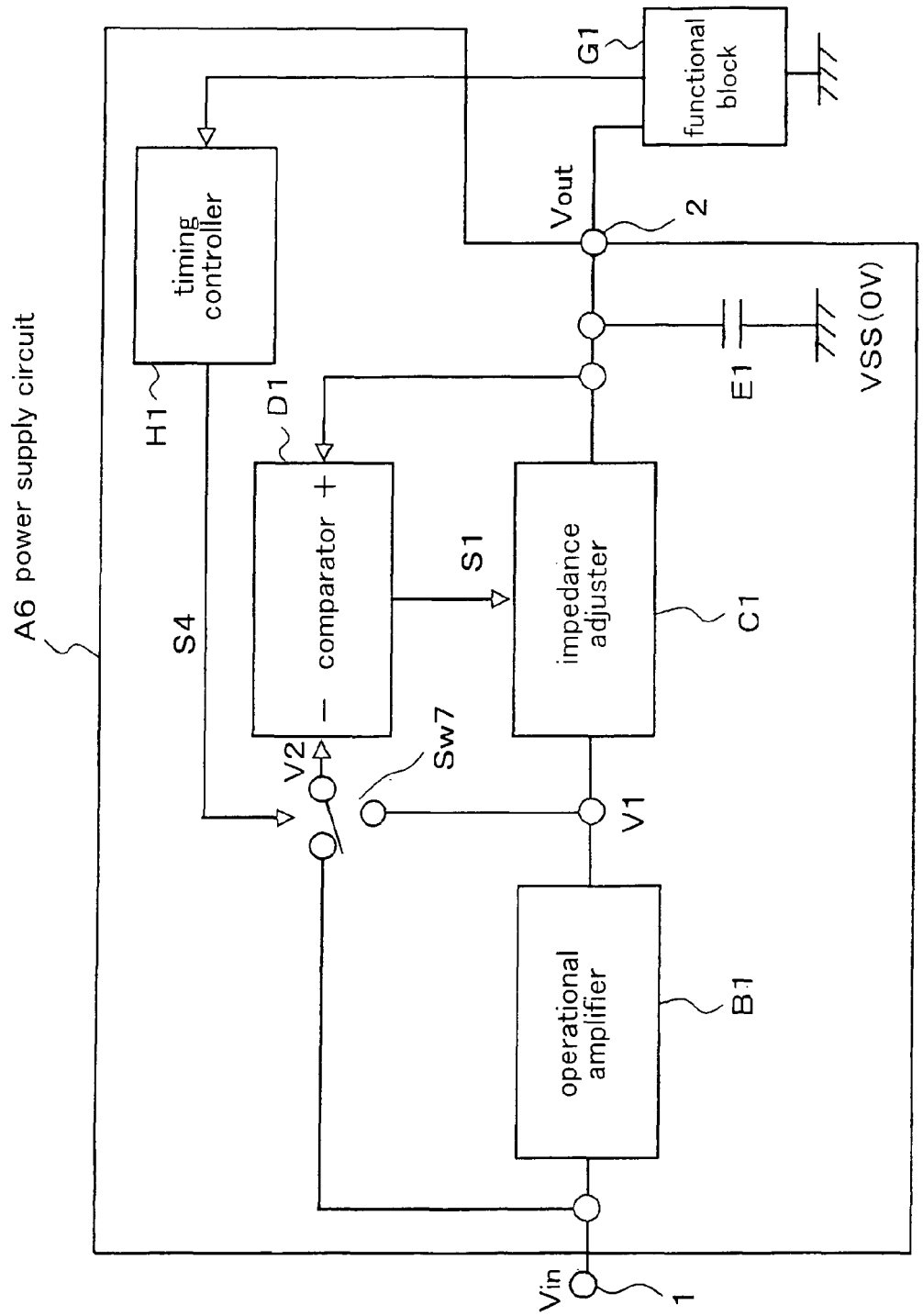
FIG. 24 is a block diagram illustrating a constitution of a power supply circuit according to a preferred embodiment 6 of the present invention.

FIG. 24 is a block diagram illustrating a constitution of a power supply circuit A6 according to a preferred embodiment 6 of the present invention. In FIG. 24, G1 denotes a functional block operating by using the power supply circuit output voltage Vout as a voltage supply source. H1 denotes a timing controller for controlling the switch Sw7 by outputting a switchover signal S4 in accordance with the operation of the functional block G1. The functional block G1 is operated with a clock inputted from outside or generated internally. The timing controller H1 has a function of generating the switching signal S4 having a frequency resulting from 1-N frequency division of an operation frequency of the functional block G1 as shown in a timing chart of FIG. 25, and opening and closing of the switch Sw7 is controlled by the switching signal S4. Any other component, which is similar to that of the preferred embodiment 5 shown in FIG. 21, is simply provided with the same reference symbol and not described again.

The description below is given based on the assumption that the value of the power supply circuit output voltage Vout is already known. The functional block G1 previously calculates in advance an amount of time for stabilizing the power supply circuit output voltage Vout of the power supply circuit A6. The timing controller H1 controls the switch Sw7 so that the reference potential Vin is inputted to the comparator D1 until the power supply circuit output voltage Vout is stabilized so as to thereby make the comparator D1 operate at a high speed. After the power supply circuit output voltage Vout is stabilized, the timing controller H1 controls the switch Sw7 so that the output voltage V1 of the operational amplifier B1 is inputted to the comparator D1 to thereby make the comparator D1 operate with a high accuracy.

In the present preferred embodiment, the power supply necessary for the functional block G1 is outputted in accordance with the operation of the functional block G1. As a result, the reduction of the power consumption in the system and the operation of the power supply circuit with a high efficiency can be compatible.

Preferred Embodiment 7

Figure 26A:
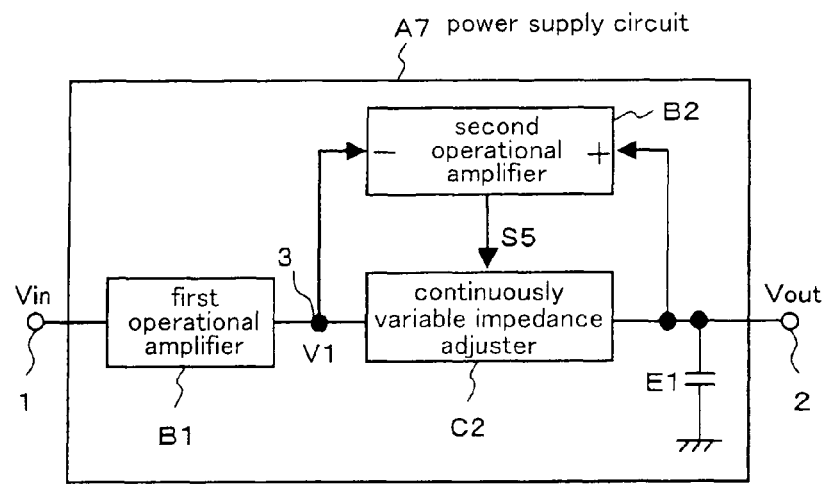
FIG. 26A is a block diagram illustrating a constitution of a power supply circuit according to a preferred embodiment 7 of the present invention.
Figure 26B:
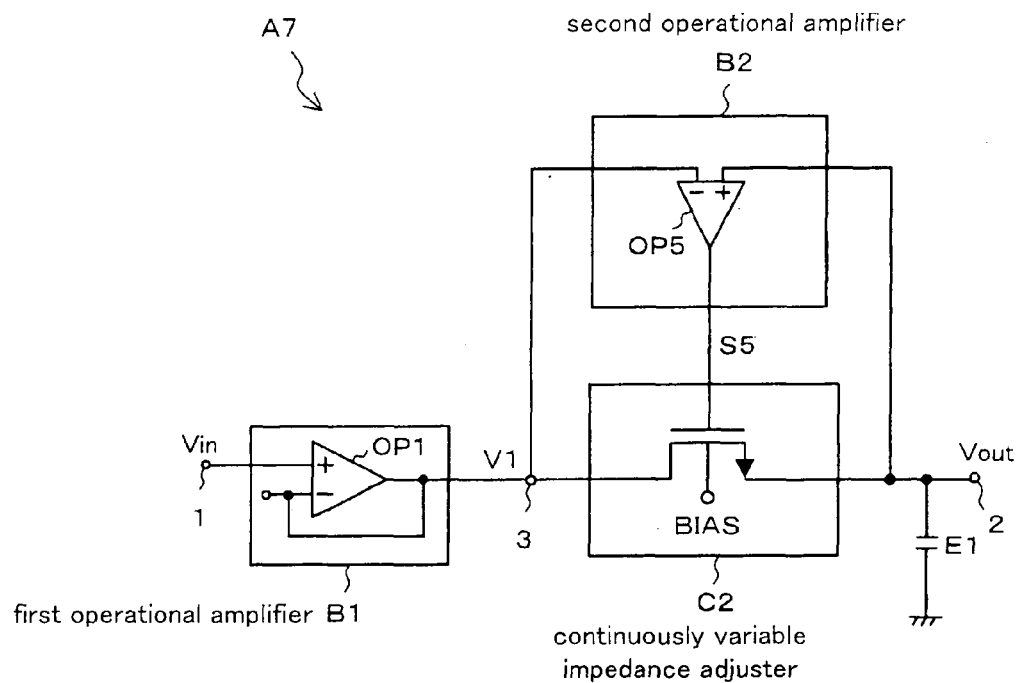
FIG. 26B shows a detailed circuit configuration of the circuit shown in FIG. 26A.

FIG. 26A is a block diagram illustrating a constitution of a power supply circuit A7 according to a preferred embodiment 7 of the present invention. FIG. 26B shows a detailed configuration of the circuit shown in FIG. 26A. In FIGS. 26A and 26B, B1 denotes a first operational amplifier for generating the power supply potential V1 based on the reference potential Vin applied to the input terminal 1. C2 denotes an continuously variable impedance adjuster provided between the output terminal 3 of the first operational amplifier B1 and the power supply circuit output terminal 2 in order to continuously and variably adjust the impedance in accordance with a control signal S5. E1 denotes a charge accumulator connected to the power supply circuit output terminal 2 in order to accumulate the charge in the power supply circuit output terminal 2. B2 denotes a second operational amplifier for executing an operation of a difference between the power supply circuit output voltage Vout and the output voltage V1 of the first operational amplifier B1 and outputting the control signal S5 in accordance with the difference to the continuously variable impedance adjuster C2.

Figure 27:
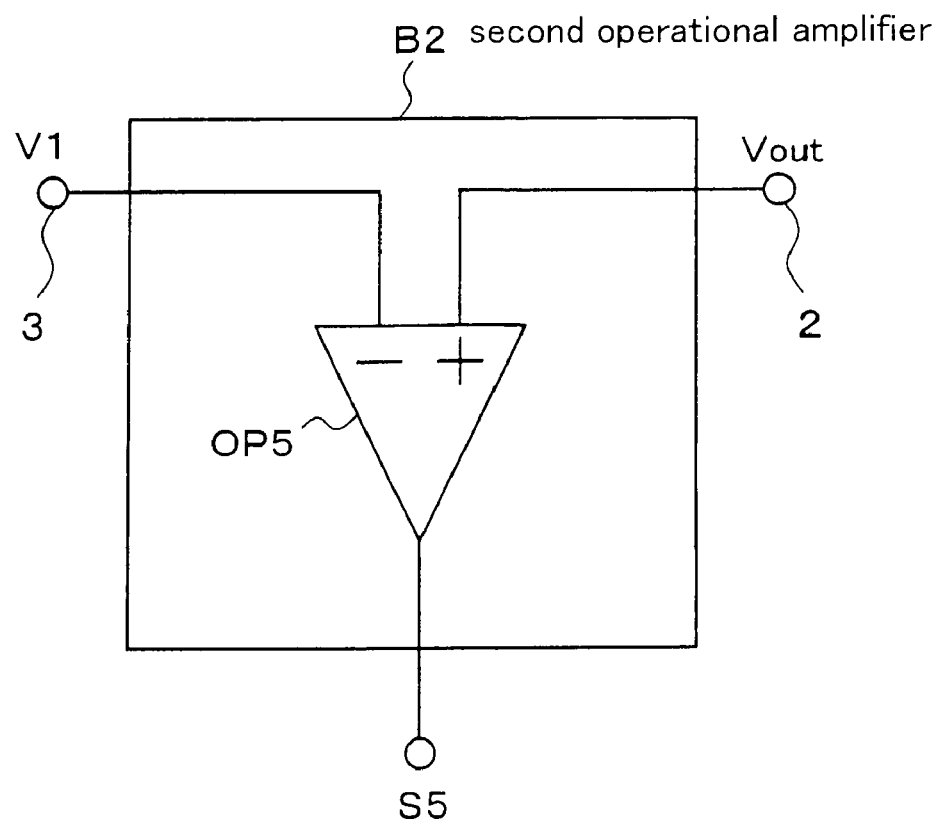
FIG. 27 shows a circuit configuration (1) of a second operational amplifier according to the preferred embodiment 7.

FIG. 27 shows a constitution of a second operational amplifier B2. The second operational amplifier B2 has an operational amplifier OP5. As shown in FIG. 27, the output voltage V1 of the operational amplifier B1 is inputted to an inversion input terminal (−) of the operational amplifier OP5, while the power supply circuit output voltage Vout is inputted to a non-inversion input terminal (+) thereof.

Figure 28:
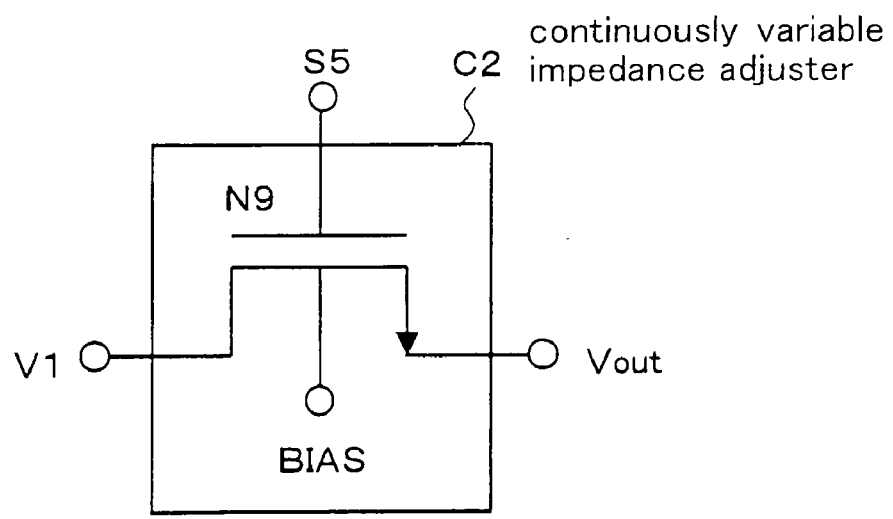
FIG. 28 shows a circuit configuration (1) of an continuously variable impedance adjuster according to the preferred embodiment 7.

FIG. 28 shows a constitution of the impedance continuous adjuster C2. The continuously variable impedance adjuster C2 comprises an Nch transistor N9. As shown in FIG. 28, the control signal S5 outputted from the operational amplifier OP5 is inputted to a gate terminal of the transistor N9, while the output voltage V1 of the operational amplifier B1 is inputted to a drain terminal thereof. The power supply circuit output voltage Vout in the power supply circuit output terminal 2 is inputted to a source terminal of the transistor N9, and such a potential that does not generate latch-up is inputted to a back gate terminal of the transistor N9.

Next, an operation of the power supply circuit A7 according to the present preferred embodiment thus constituted is described. In the state where the power supply circuit output terminal 2 is unloading (the output current amount of the first operational amplifier B1 is small, and the voltage drop in the continuously variable impedance adjuster C2 is small), the input difference with respect to the second operational amplifier B2 is small. Therefore, the control signal S5 consequently shows a small value. Accordingly, the voltage applied to the gate terminal of the continuously variable impedance adjuster C2 is lowered, and the continuously variable impedance adjuster C2 thereby has a high resistance (for example, 100Ω-a few MΩ). As a result, the phase compensation in the operational amplifier B1 can be secured.

Meanwhile, in the state under the load (the output current amount of the first operational amplifier B1 is increased (for example, 1 mA), and the voltage drop in the continuously variable impedance adjuster C2 is large), the input difference with respect to the second operational amplifier B2 is increased. Therefore, the control signal S5 consequently shows a large value. Accordingly, the voltage applied to the gate terminal of the continuously variable impedance adjuster C2 is increased, and the voltage drop is controlled so that the continuously variable impedance adjuster C2 has a low resistance (for example, a few MΩ-at most 100Ω).

Thereby, the impedance in the continuously variable impedance adjuster C2 is continuously adjusted in accordance with the value of the input difference with respect to the second operational amplifier B2.

As described above, according to the present preferred embodiment, an effect similar to that of the preferred embodiment 1 can be achieved, and the impedance can be variably controlled to the continuous values.

Modified Embodiment of the Preferred Embodiment 7

Figure 29:
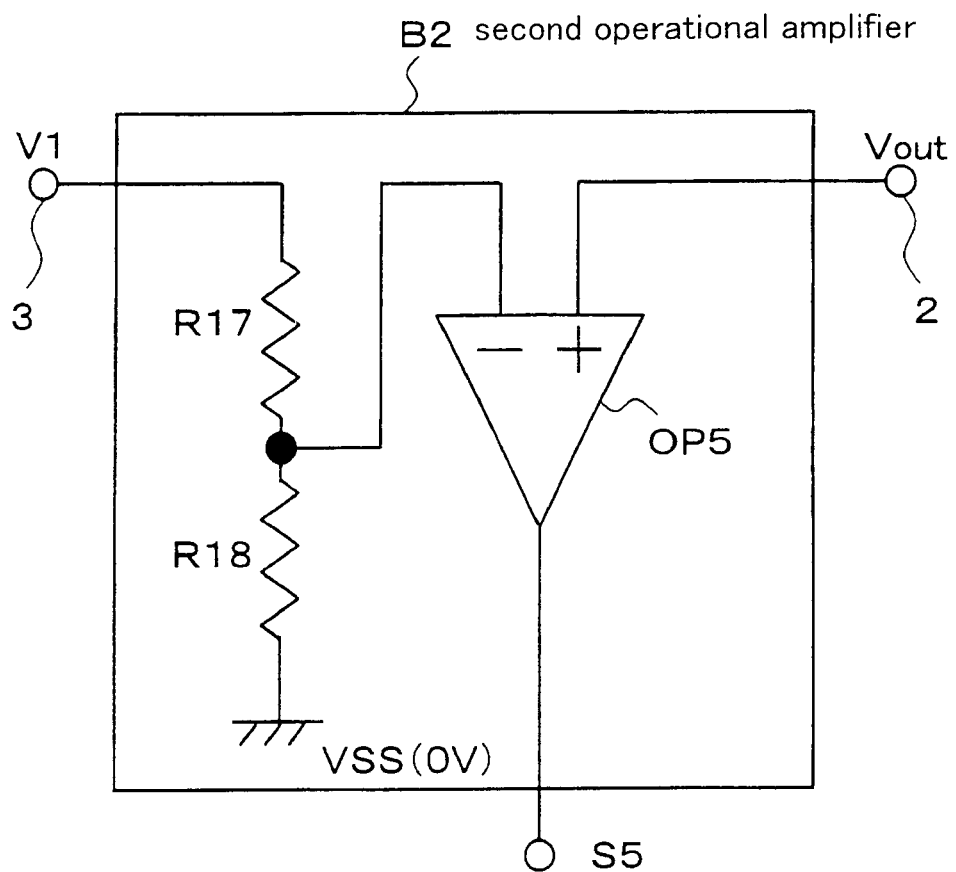
FIG. 29 shows a circuit configuration (2) of the second operational amplifier according to the preferred embodiment 7.

In a second operational amplifier B2 shown in FIG. 29, differing from the configuration in FIG. 28, the divided voltage by resistance of the output voltage V1 of the operational amplifier B1 is inputted to the inversion input terminal (−) of the operational amplifier OP5, and the power supply circuit output voltage Vout is inputted to the non-inversion input terminal (+) of the operational amplifier OP5. As a result, the second operational amplifier B2 can be operated linearly, which further stabilizes the opening/closing control.

Figure 30:
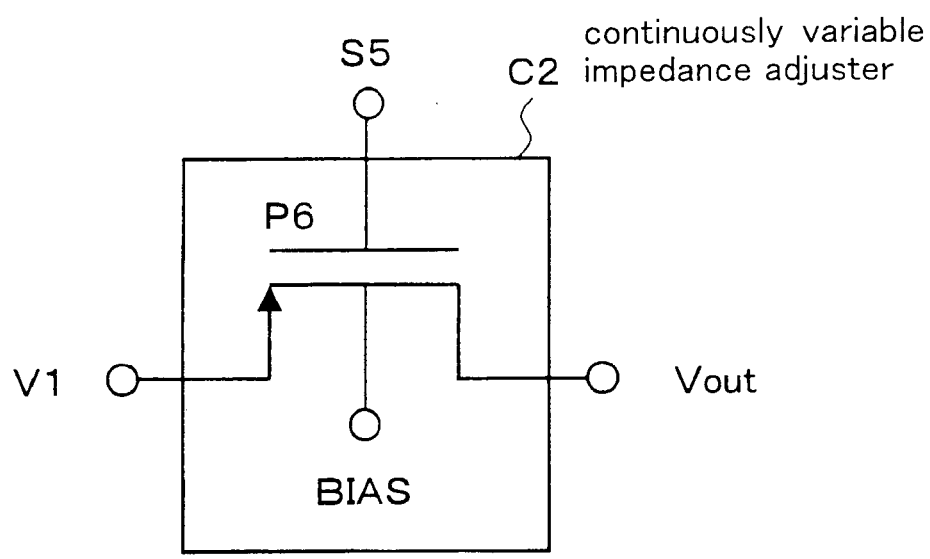
FIG. 30 shows a circuit configuration (2) of the continuously variable impedance adjuster according to the preferred embodiment 7.

An continuously variable impedance adjuster C2 shown in FIG. 30 comprises, differing from the Nch transistor N9 shown in FIG. 28, a Pch transistor P6. In an continuously variable impedance adjuster C2 shown in FIG. 31, which is different from the one in FIG. 28, the control signal S5 outputted from the second operational amplifier B2 is inputted to a back gate of an Nch transistor N10, and the impedance is thereby variable. According to the constitution, a potential more than a threshold voltage of the Nch transistor N10 is inputted to a gate terminal of the Nch transistor N10.

Figure 31:
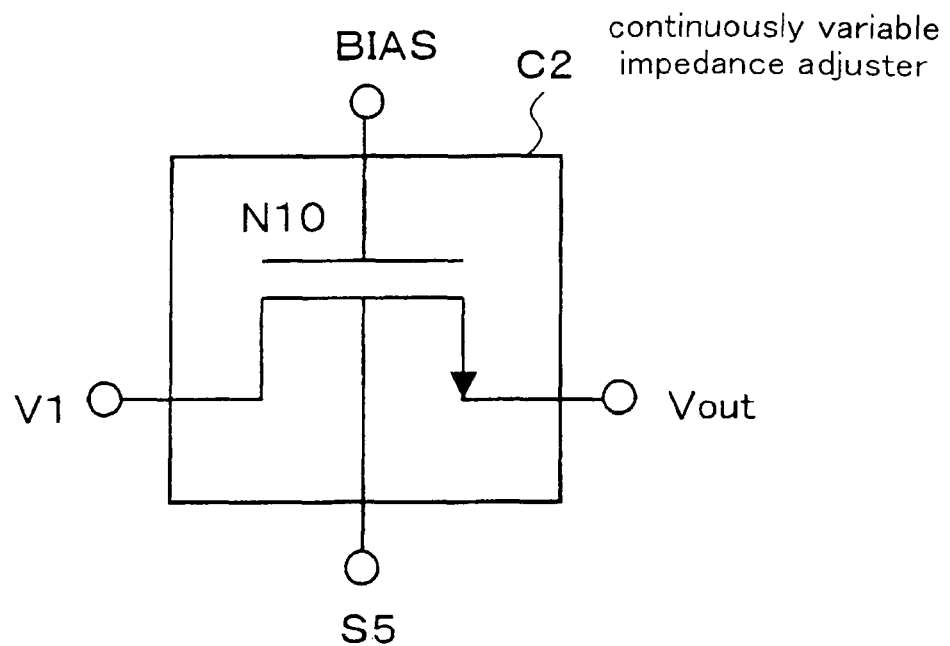
FIG. 31 shows a circuit configuration (3) of the continuously variable impedance adjuster according to the preferred embodiment 7.
Figure 32:
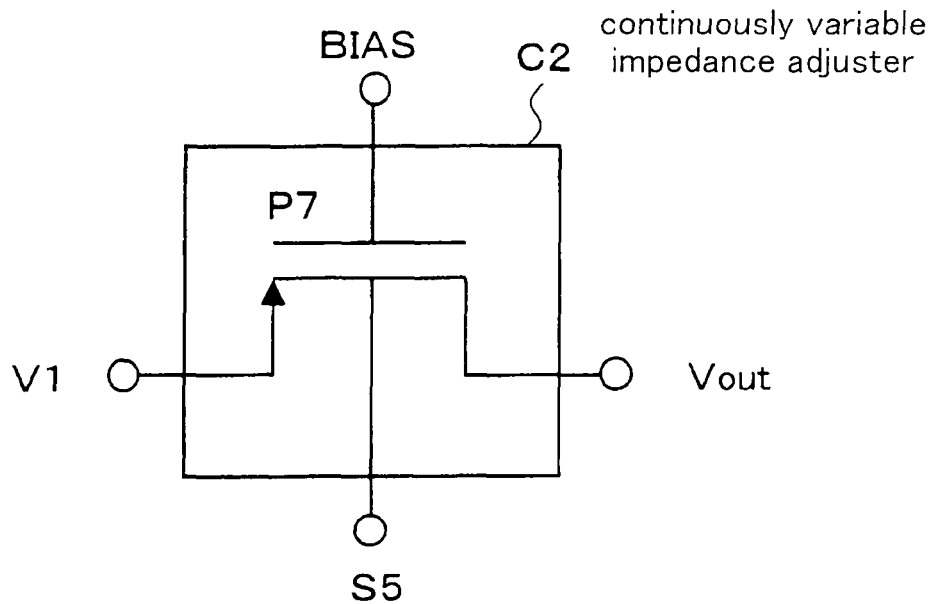
FIG. 32 shows a circuit configuration (4) of the continuously variable impedance adjuster according to the preferred embodiment 7.
Figure 33:
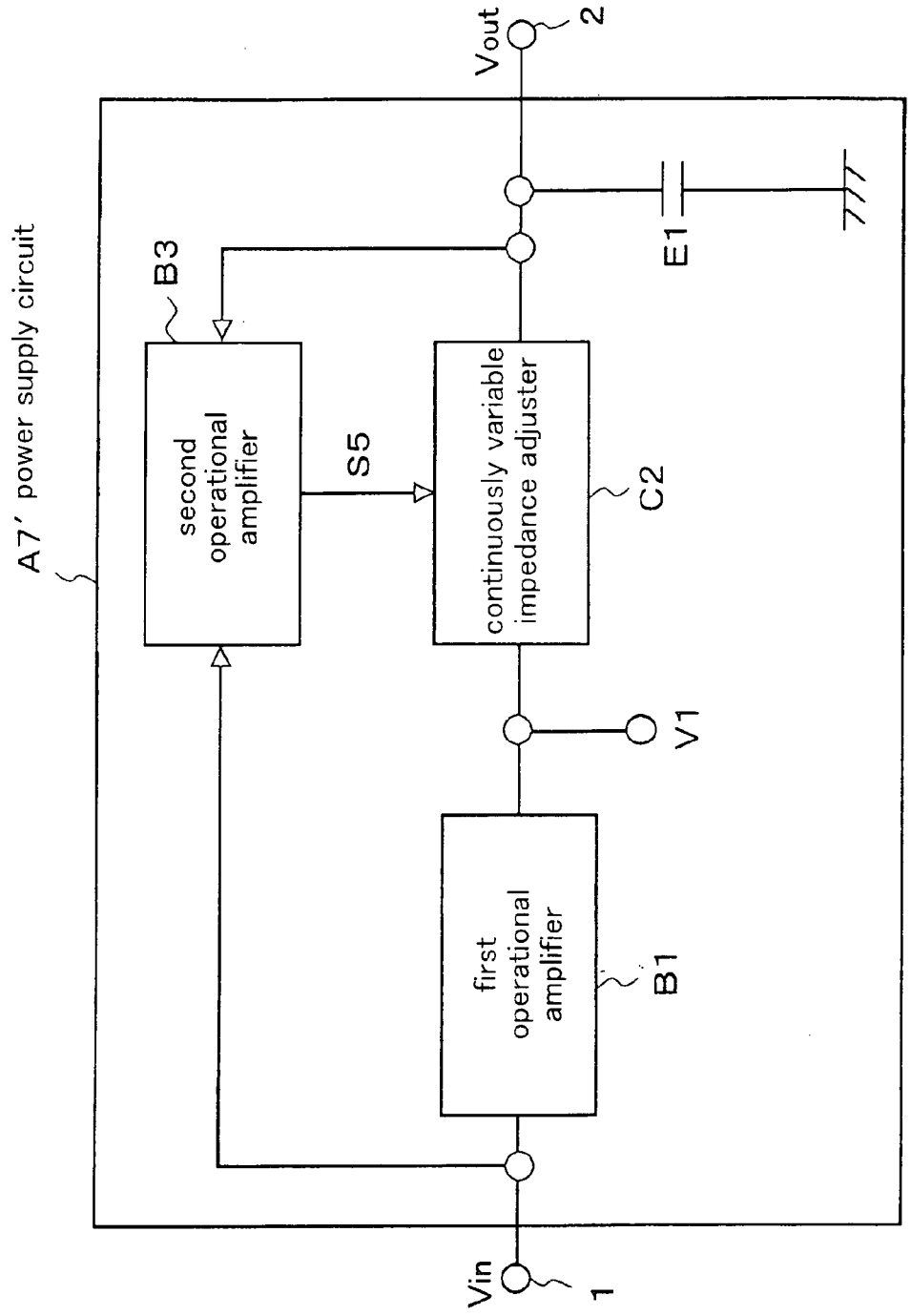
FIG. 33 is a block diagram illustrating a constitution of a power supply circuit according to a preferred embodiment 8 of the present invention and a detailed circuit configuration.

An continuously variable impedance adjuster C2 shown in FIG. 32, which is different from the Nch transistor N10 shown in FIG. 31, comprises a Pch transistor P7. In a power supply circuit A' shown in FIG. 33, the reference potential Vin applied to the input terminal 1 is inputted to the second operational amplifier B2.

Figure 34:
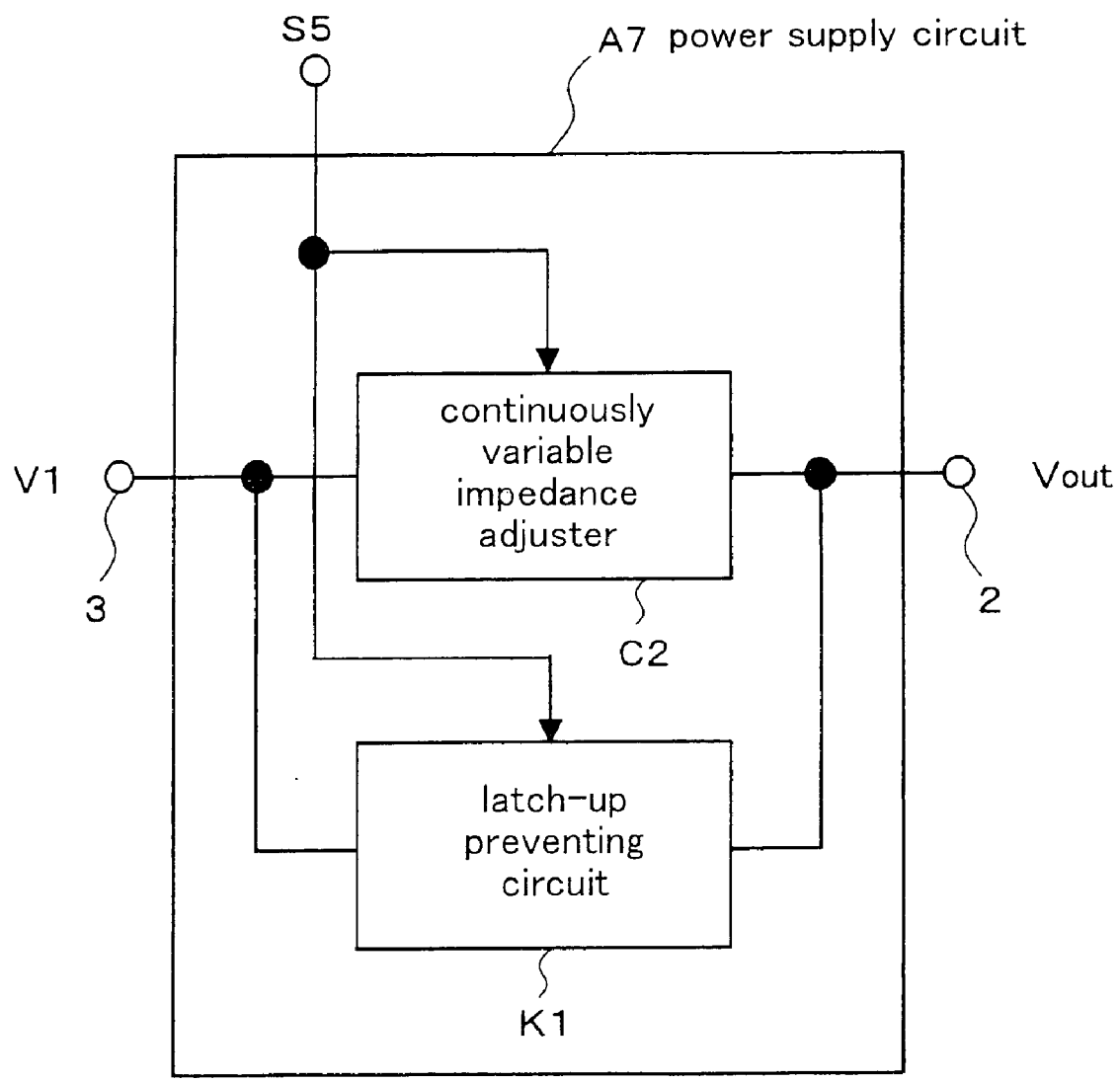
FIG. 34 shows a constitution wherein a latch-up preventing circuit is provided in an continuously variable impedance adjuster according to the preferred embodiment 8.

When any of the continuously variable impedance adjusters C2 described thus far is used, the latch-up may be generated depending on voltage input conditions in the continuously variable impedance adjuster C2. FIG. 34 shows a constitution wherein a latch-up preventing circuit K1 is connected in parallel to the continuously variable impedance adjuster C2.

Figure 35:
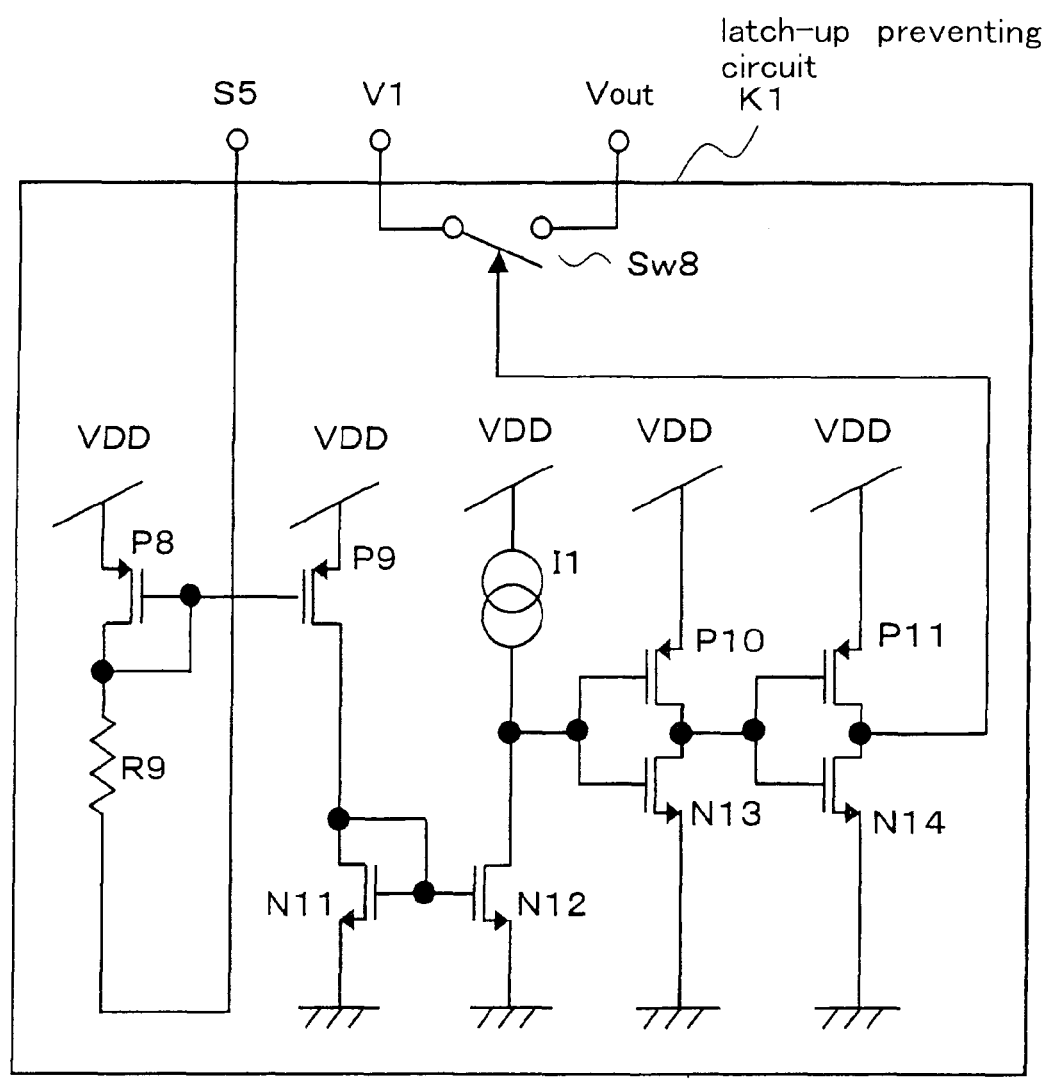
FIG. 35 shows a circuit configuration (1) of the latch-up preventing circuit according to the preferred embodiment 8.

The latch-up preventing circuit K1 shown in FIG. 34 is configured as shown in FIG. 35. The control signal S5 outputted from the second operational amplifier B2 is inputted to a Pch transistor P8 via a resistance R9. The current flowing in the Pch transistor P8 is inputted to a Pch transistor P9 constituting a current mirror circuit by being paired with the Pch transistor P8. The current flowing in the Pch transistor P9 is inputted to an Nch transistor Nil which uses the Pch transistor P9 as a current supply source. The current flowing in the Nch transistor N11 is supplied to an Nch transistor N12 constituting a current mirror circuit by being paired with the Nch transistor N11. The current flowing in the Nch transistor N12 is inputted to an input current circuit I1 which uses the Nch transistor N12 as a current supply source. An inverter (comprising a Pch transistor P10 and an Nch transistor N13) and an inverter (comprising a Pch transistor P11 and an Nch transistor N14) are connected in series in two stages to a point at which the input current circuit 11 and the Nch transistor N12 are connected. Outputs of these inverters are inputted to an opening/closing controller of a switch Sw8.

An operation of the latch-up preventing circuit using the continuously variable impedance adjuster C2 shown in FIG. 32 is described. When the output current amount of the first operational amplifier B1 is increased and the potential difference in the continuously variable impedance adjuster C2 is increased, if the second operational amplifier B2 tries to reduce the impedance in the continuously variable impedance adjuster C2, the voltage of the control signal S5 outputted from the second operational amplifier B2 is increased. At the time, if the output voltage V1 of the first operational amplifier B1 or the power supply circuit output voltage Vout is larger than the increased voltage of the control signal S5, the latch-up is generated. The latch-up preventing circuit K1 turns on the switch Sw8 when the increase of the voltage of the control signal S5 is detected to thereby block a path of the Pch transistor P7 shown in FIG. 32.

FIG. 36 shows another constitution of the latch-up preventing circuit K1. When the switch Sw8 shown in FIG. 35 is turned on, source and back gate terminals of the transistor N10 of the continuously variable impedance adjuster C2 are connected at the same time so that the path of the Pch transistor P7 shown in FIG. 32 is blocked. According to this, in addition to the prevention of the latch-up, the impedance in the transistor N10 of the continuously variable impedance adjuster C2 is continuously controlled so that the impedance can be continuously adjusted.

In the constitution shown in FIG. 35, the junction path between the back gate and the source or drain is blocked before the latch-up, which prevents the generation of the latch-up. However, there is such a concern that the output voltage V1 of the operational amplifier B1 and the power supply circuit output voltage Vout may be connected when the latch-up is prevented, and the variable impedance is thereby substantively short, which possibly causes the oscillation of the operational amplifier.

In the constitution shown in FIG. 35, the variable resistance is adjusted in two stages between a state where the variable impedance transistor is provided and a state where the variable impedance transistor is not provided based on the function of the latch-up preventing circuit. Therefore, the variable resistance gradually reduces in a state where the power supply circuit drives a large current (back gate potential is increased), and subsequently the short state is generated (latch-up preventing circuit starts to operate).

On the contrary, according to a latch-up preventing circuit configured as shown in FIG. 36, the variable impedance is set to a minimum value of an ON resistance of the transistor (substrate bias effect is zero) while the latch-up is being prevented at the same time (the back gate and source of the transistor is short-circuited so that the current path is blocked). As a result, the concern for the oscillation can be eliminated. Further, the stable power supply circuit in which the output is not varied due to the output current volume and latch-up conditions can be provided because the variable impedance is continuously changed.

Figure 37:
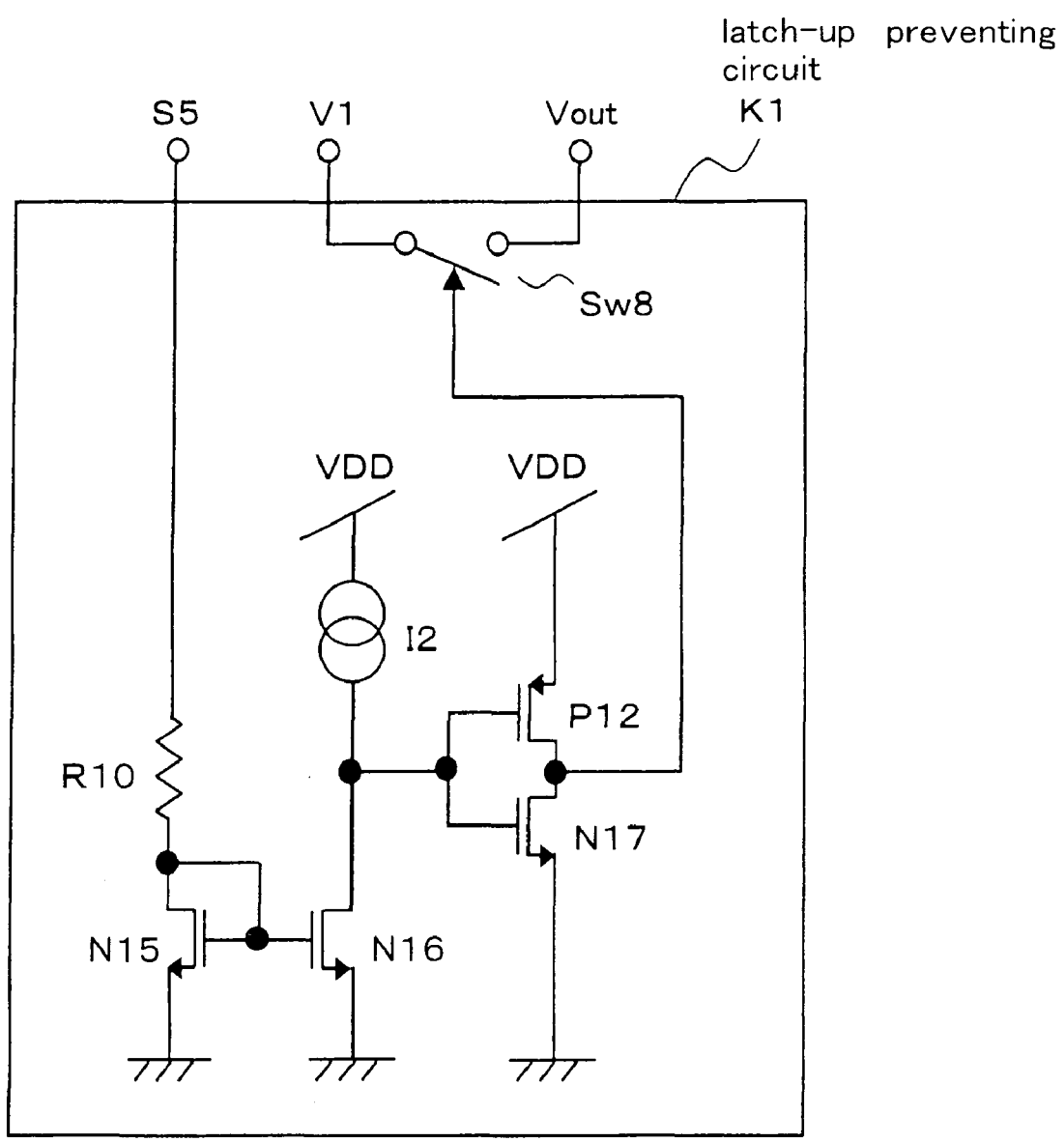
FIG. 37 shows a circuit configuration (3) of the latch-up preventing circuit according to the preferred embodiment 8.

FIG. 37 shows another constitution of the latch-up preventing circuit K1. In the constitution, the Pch transistor P8, Pch transistor P9 and inverter in one stage are deleted from the constitution shown in FIG. 35. Though the level of the voltage received by each transistor is different in comparison to the constitution shown in FIG. 35, a basic operation and an effect according to the constitution are similar to those of the constitution shown in FIG. 35. Therefore, a detailed description is omitted.

Figure 38:
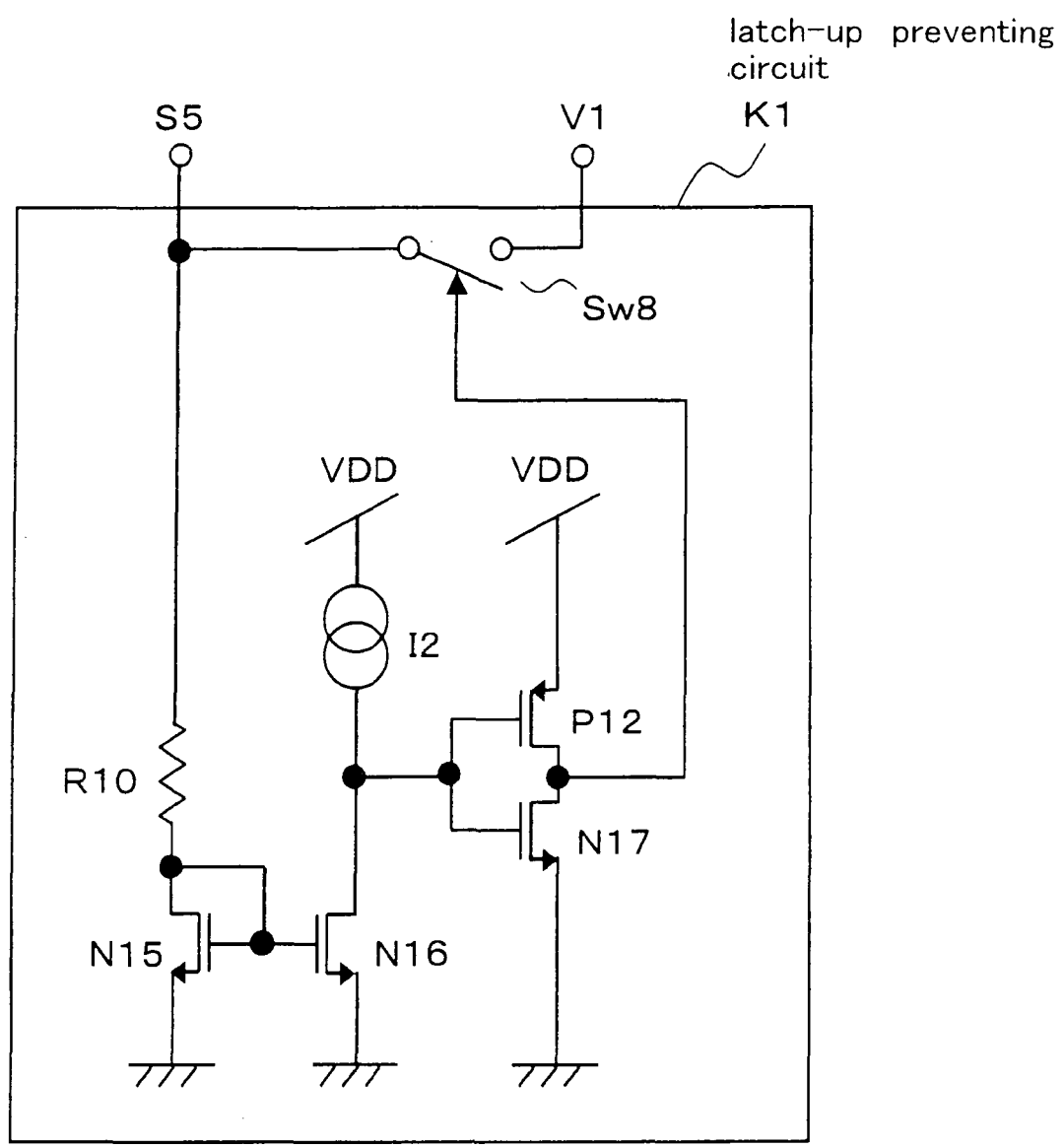
FIG. 38 shows a circuit configuration (4) of the latch-up preventing circuit according to the preferred embodiment 8.

FIG. 38 shows another constitution of the latch-up preventing circuit K1. In the constitution shown in FIG. 37, when the switch Sw8 is turned on, the source and back gate terminals of the transistor N10 in the continuously variable impedance adjuster C2 are connected, which blocks the path of the Pch transistor P7 shown in FIG. 32. According to the present constitution, in addition to the prevention of the latch-up, the impedance in the transistor N10 of the continuously variable impedance adjuster C2 is continuously controlled so that the impedance can be continuously adjusted. A basic operation and an effect according to the constitution are similar to those of the constitution shown in FIG. 37, and a detailed description is omitted.

In the latch-up preventing circuits K1 shown in FIGS. 35, 36, 37 and 38, the Nch and Pch transistors are used for constituting the current mirror circuit. However, the latch-up preventing circuit is not necessarily limited to the combination.

Preferred Embodiment 8

Figure 39:
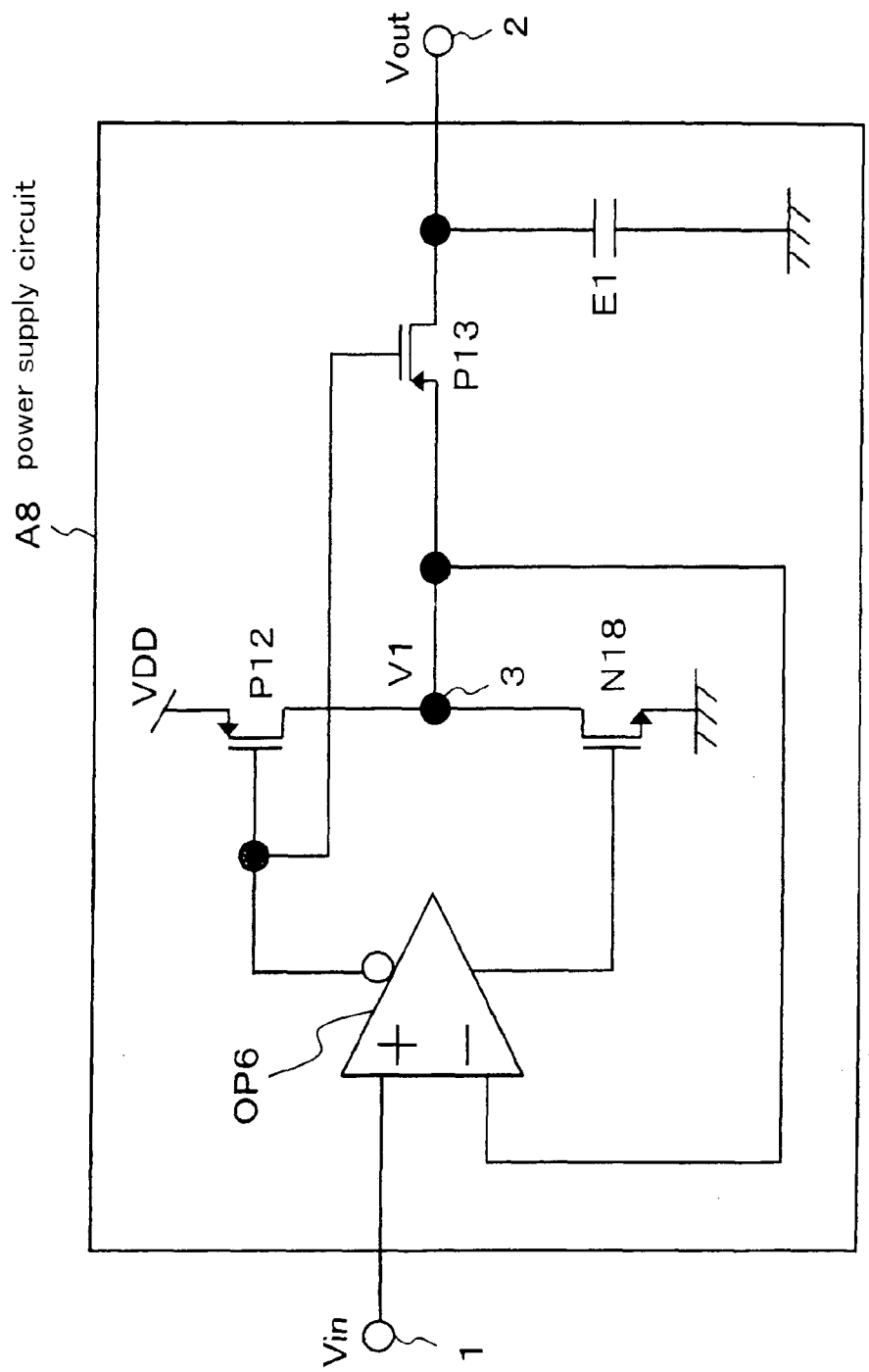
FIG. 39 is a block diagram illustrating a constitution of a power supply circuit according to the preferred embodiment 8.

FIG. 39 is a block diagram illustrating a constitution of a power supply circuit A8 according to a preferred embodiment 8 of the present invention. In the drawing, a Pch transistor P12 and an Nch transistor N18 are output transistors of an operational amplifier OP6 used for monitoring the current. A Pch transistor P13 for the output impedance is provided between an output of the operational amplifier OP6 and the power supply circuit output terminal 2. A gate terminal of the transistor p13 is connected to a gate terminal of the Pch transistor P12. A source terminal of the Pch transistor P13 for the output impedance is connected to the output of the operational amplifier OP6. A drain terminal of the Pch transistor P13 for the output impedance is connected to the power supply circuit output terminal 2. A threshold voltage of the Pch transistor P13 for the output impedance is set to a value smaller than a threshold voltage of the Pch transistor P12 for monitoring the current.

Next, an operation of the power supply circuit AB according to the present preferred embodiment thus constituted is described. When the output current amount of the operational amplifier OP6 is increased in the state where the power supply circuit output terminal 2 is under the load, a gate potential of the Pch transistor P12 for monitoring the current is increased. Because the gate potential of the Pch transistor P12 is connected to the gate terminal of the Pch transistor P13 for the output impedance, a potential between the source and gate of the Pch transistor P13 is increased, and the impedance in the Pch transistor P13 is lowered. When the output current amount of the operational amplifier OP6 is reduced though the power supply circuit output terminal 2 comprises the load, the impedance in the Pch transistor P13 for the output impedance is increased adversely as described above.

The operation thus described can be realized because the threshold voltage of the Pch transistor P13 for the output impedance is smaller than the threshold voltage of the Pch transistor P12 for monitoring the current.

As described above, according to the present preferred embodiment, such an effect as shown in the preferred embodiment 1 can be surely obtained. Further, the output current of the operational amplifier OP6 can be directly monitored and the output impedance can be variably controlled.

Modified Embodiment of the Preferred Embodiment

Figure 40:
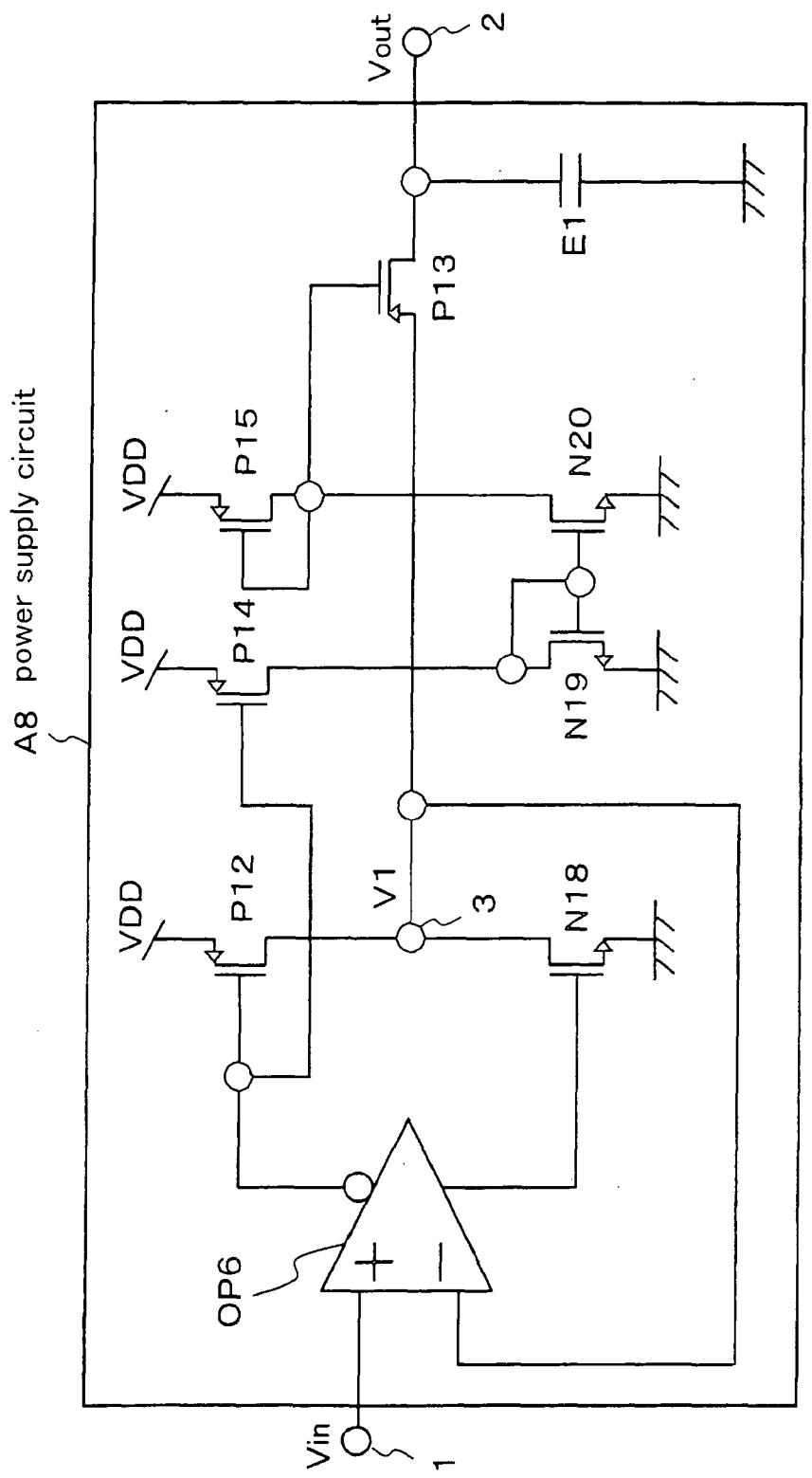
FIG. 40 is a block diagram illustrating a constitution of a power supply circuit (1) according to a modified embodiment of the preferred embodiment 8.

In a power supply circuit A8 shown in FIG. 40, which is differently configured in comparison to the constitution shown in FIG. 39, the output impedance is controlled through the current-voltage conversion. In FIG. 40, the same reference symbols as those shown in FIG. 39 denote the same component, and a detailed description thereof is omitted.

A Pch transistor P14 constituting a current mirror circuit by being paired with the Pch transistor P12 for monitoring the current is provided. An Nch transistor N24 which uses the current flowing in the Pch transistor P14 as a current supply source is provided. An Nch transistor N20 constituting a current mirror circuit by being paired with the Nch transistor N24 for monitoring the current, is provided. A Pch transistor P15 for supplying the current to the Nch transistor N20 is provided. A Pch transistor P13 for the output impedance is provided, and a result of the current-voltage conversion in the Pch transistor P15 is inputted to a gate terminal of the Pch transistor P13.

Figure 41:
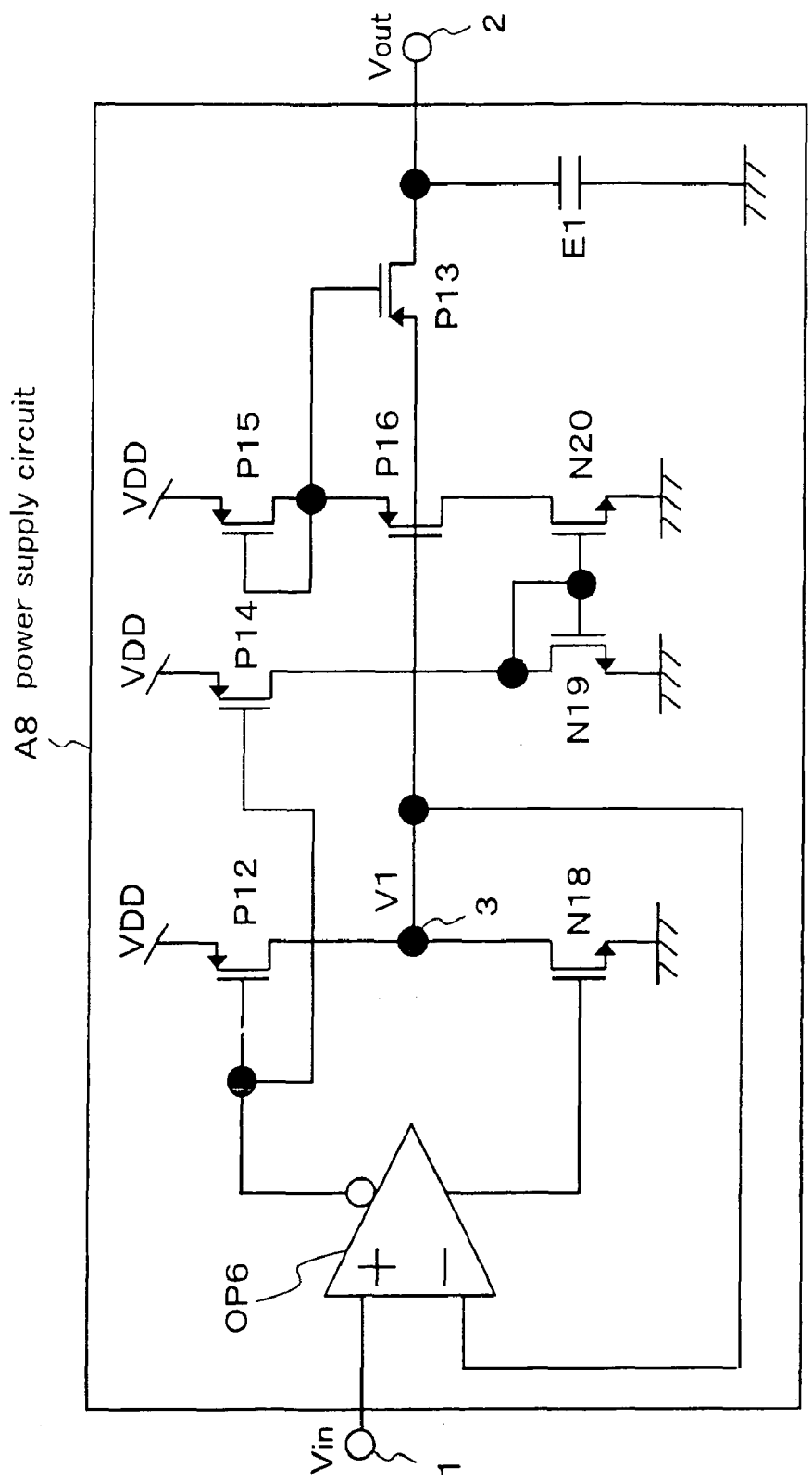
FIG. 41 is a block diagram illustrating a constitution of a power supply circuit (2) according to another modified embodiment of the preferred embodiment 8.
Figure 42:
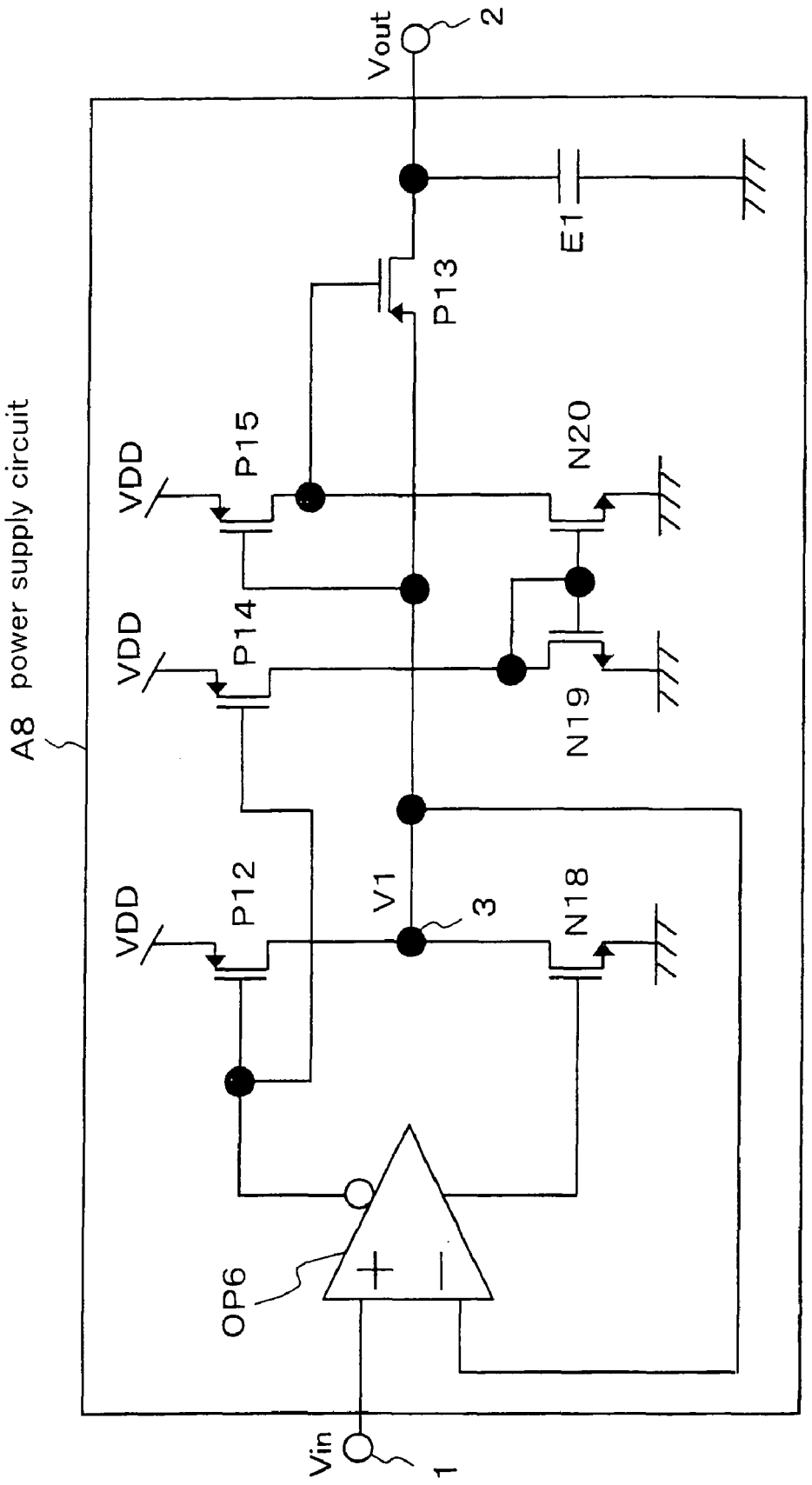
FIG. 42 is a block diagram illustrating a constitution of a power supply circuit (3) according to yet another modified embodiment of the preferred embodiment 8.
Figure 43:
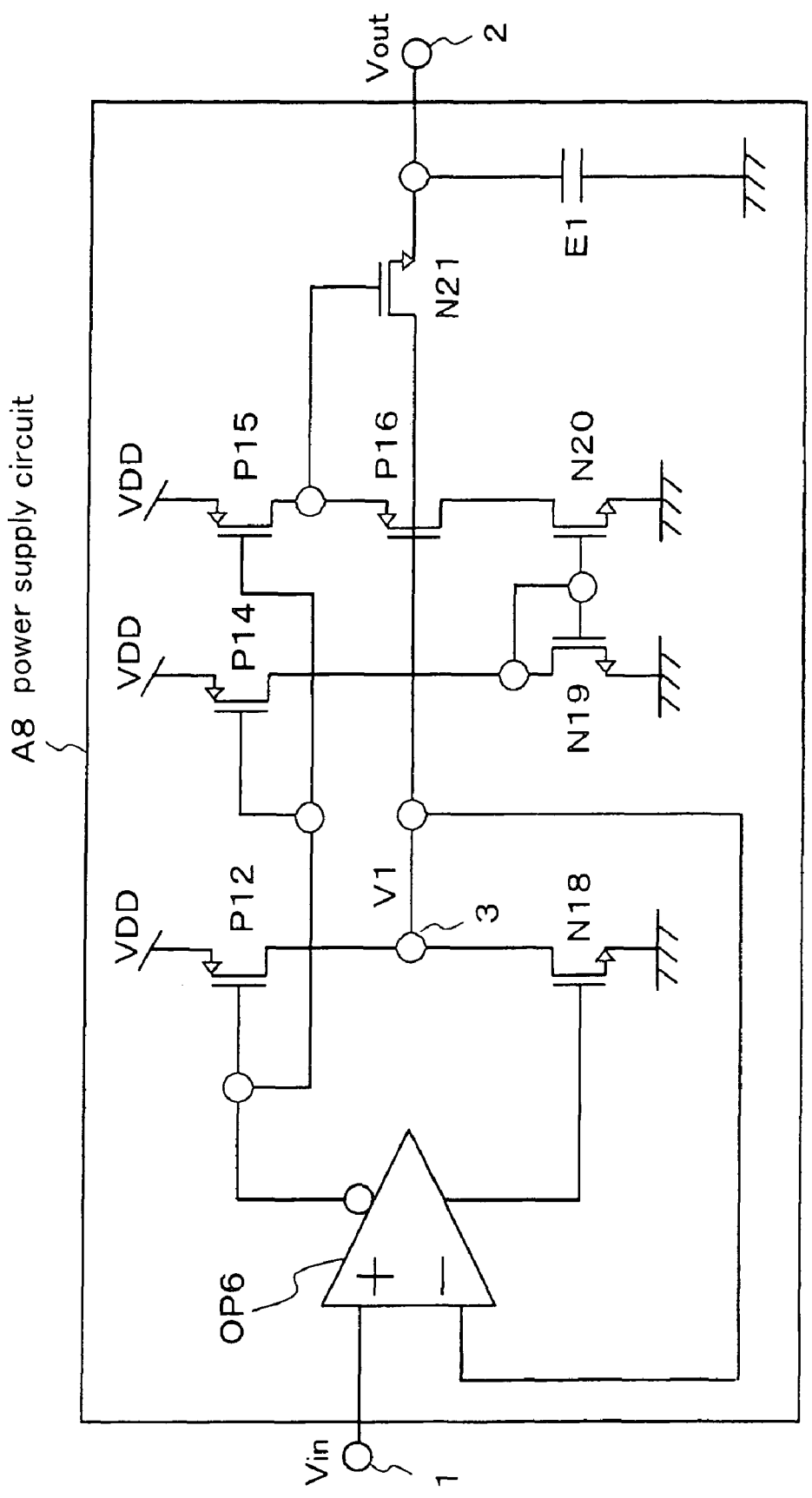
FIG. 43 is a block diagram illustrating a constitution of a power supply circuit (4) according to yet another modified embodiment of the preferred embodiment 8.

In a power supply circuit A8 shown in FIG. 41, which is differently configured in comparison to the constitution shown in FIG. 40, a Pch transistor P16 is provided between the Pch transistor P15 and the Nch transistor N20. A gate terminal of the Pch transistor P16 is connected to the output of the operational amplifier OP6. In a power supply circuit A8 shown in FIG. 42 which is differently configured in comparison to the constitution shown in FIG. 40, the gate terminal of the Pch transistor P15 is connected to the output of the operational amplifier OP6. In a power supply circuit A8 shown in FIG. 43, which is differently configured in comparison to the constitution shown in FIG. 41, the gate terminal of the Pch transistor P15 is connected to a gate terminal of the Pch transistor P14, and an Nch transistor N21 is used for the output impedance.

In FIGS. 39-42, the Pch transistor is used as the Pch transistor P13 for the output impedance, the Pch transistor P12 for monitoring the current and the like. However, it is needless to say that the Nch transistor can constitute a similar circuit.

Preferred Embodiment 9

Figure 44:
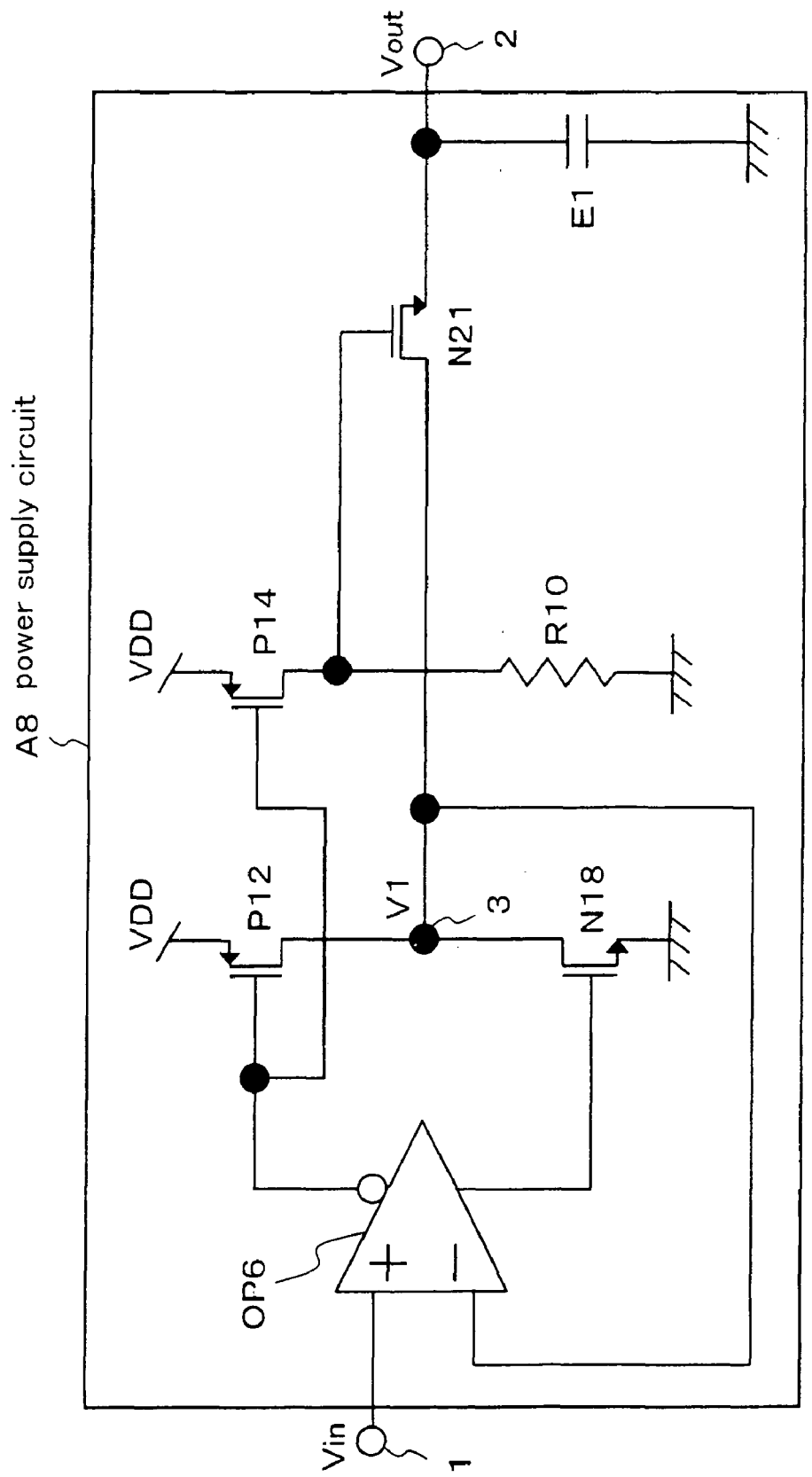
FIG. 44 is a block diagram illustrating a constitution of a power supply circuit according to a preferred embodiment 9 of the present invention.

FIG. 44 is a block diagram illustrating a constitution of a power supply circuit A9 according to a preferred embodiment 9 of the present invention. In the preferred embodiment 9, the Nch transistor N21 for the output impedance is provided between the output of the operational amplifier OP6 and the power supply circuit output terminal 2. The gate terminal of the Pch transistor P12 for monitoring the current of the operational amplifier OP6, and the gate terminal of the Pch transistor P14 are connected. A drain terminal of the Pch transistor P14 is connected to a ground via a resistance R10. A point that connects the Pch transistor P14 and the resistance R10 is connected to the gate terminal of the Nch transistor N21 for the output impedance. In FIG. 44, any component configured in the same manner as in the description of FIG. 40 is provided with the same reference symbol, and a detailed constitution and an operation thereof is not described again.

Next, an operation of the power supply circuit A9 according to the present preferred embodiment thus constituted is described. When the output current amount of the operational amplifier OP6 is increased, the current flowing in the Pch transistor P14 increases. When the current flowing in the Pch transistor P14 increases, the voltage drop in the resistance R10 is increased, and the potential inputted to the gate terminal of the Nch transistor N21 for the output impedance is thereby increased. Then, the impedance in the Nch transistor N21 is lowered, and the amount of the voltage drop in the continuously variable impedance adjuster C2 is accordingly controlled. When the output current of the operational amplifier OP6 is reduced, the impedance of the Nch transistor N21 is increased on the contrary to the operation described above.

As described above, according to the present preferred embodiment, the circuit configuration, that overcomes variation in a manufacturing of each element, can be provided in comparison to the constitution shown in the preferred embodiment 8.

Modified Embodiment of the Preferred Embodiment 9

Figure 45:
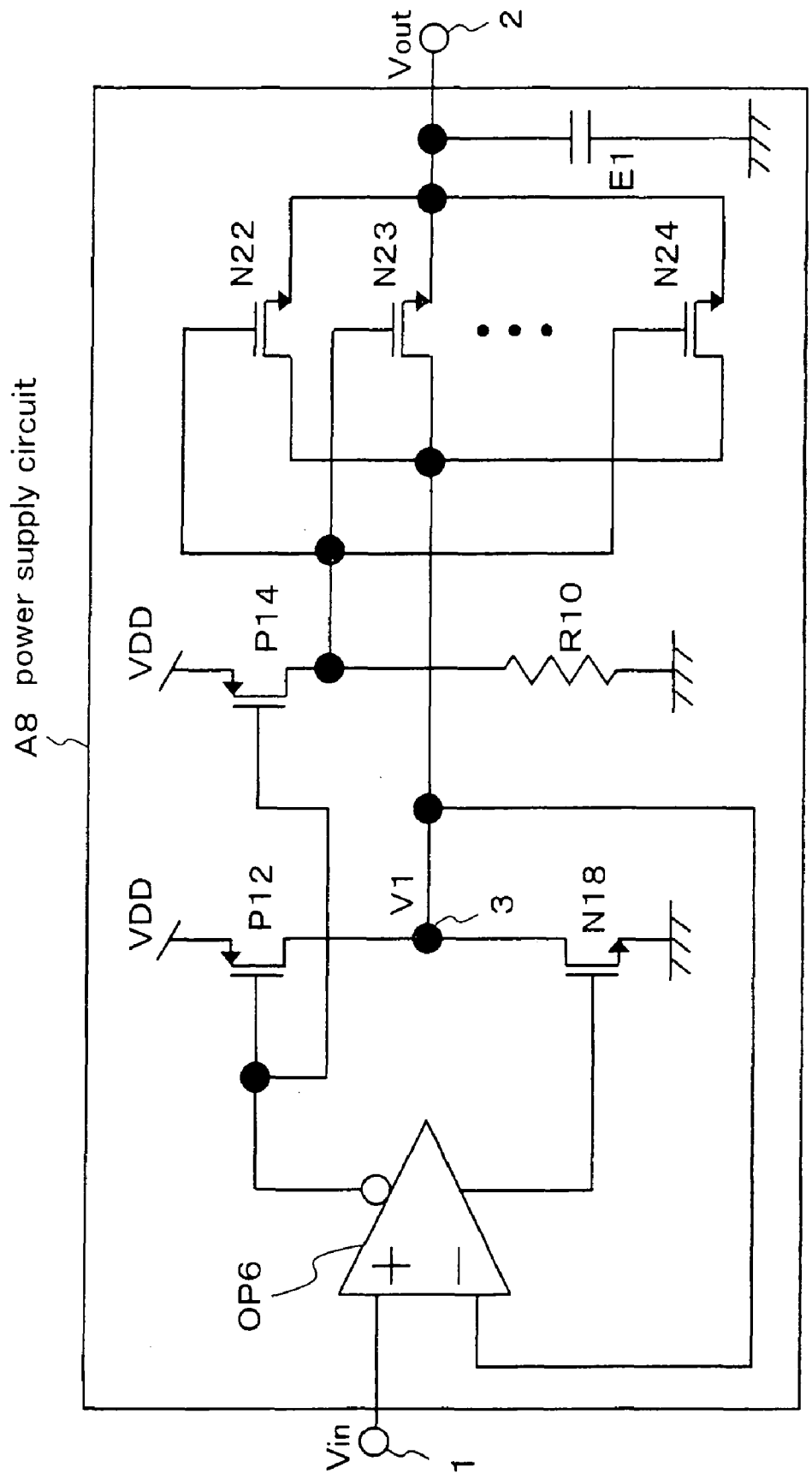
FIG. 45 is a block diagram (1) illustrating a constitution of a power supply circuit according to a modified embodiment of the preferred embodiment 9.

In a power supply circuit A8 shown in FIG. 45, which is differently configured in comparison to the constitution shown in FIG. 44, a parallel circuit comprising a plurality of Nch transistors N22, N23 and N24 each having a different ON resistance or a different transistor size respectively is provided in place of the Nch transistor N21 for the output impedance. The impedance adjustment can be carried out in number of steps more finely divided by taking the constitution as shown in FIG. 45.

Figure 46:
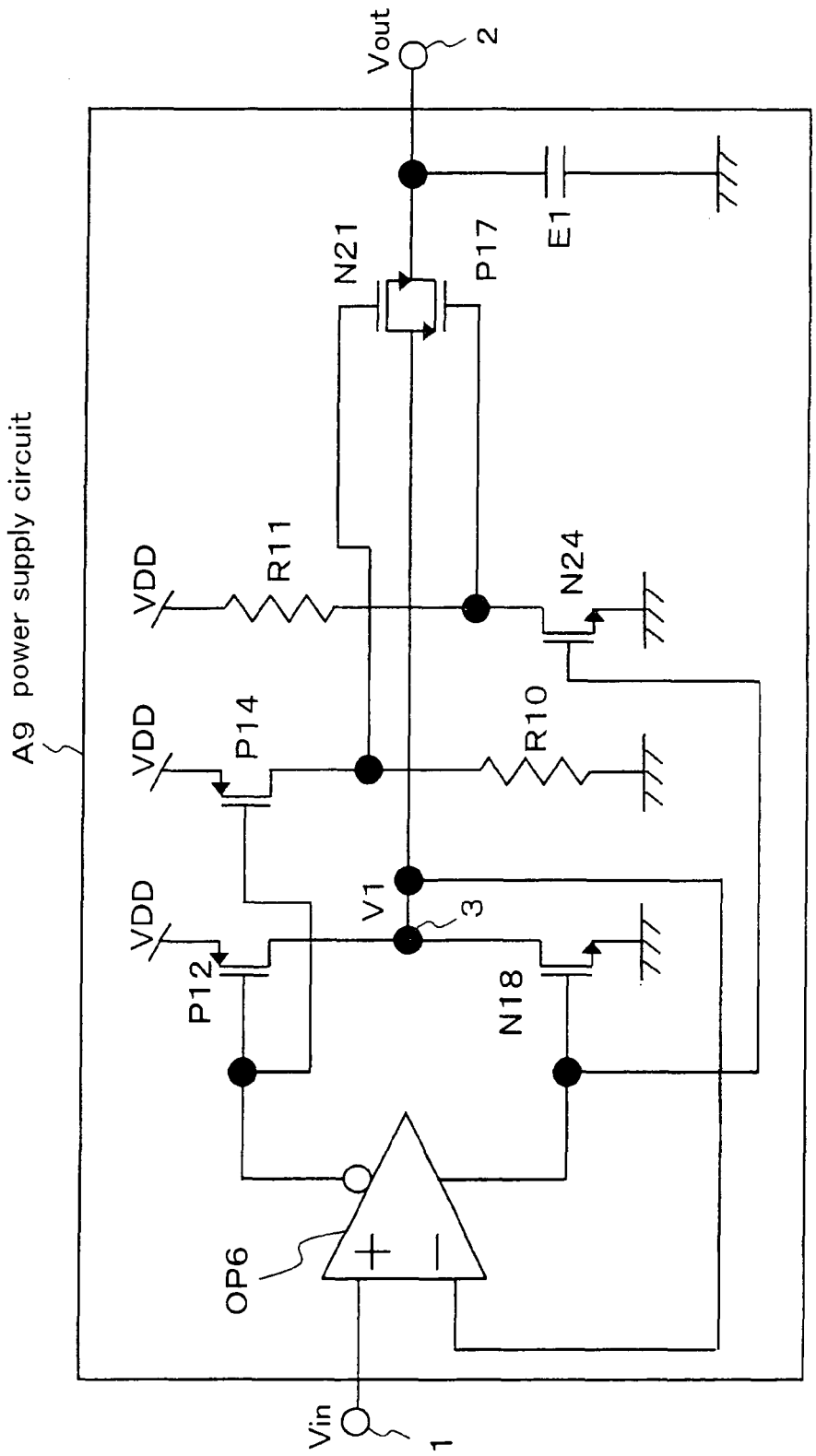
FIG. 46 is a block diagram (2) illustrating a constitution of a power supply circuit according to another modified embodiment of the preferred embodiment 9.

In a power supply circuit A9 shown in FIG. 46, which is differently configured in comparison to the constitution shown in FIG. 44, the Pch transistor is provided in addition to the Nch transistor. A Pch transistor N17 is provided in parallel with the Nch transistor N21 for the output impedance. A gate terminal of an Nch transistor N18 for monitoring the current on a low-potential side of the operational amplifier OP6 and a gate terminal of an Nch transistor N24 are connected. A drain terminal of the Nch transistor N24 is connected to the power supply via a resistance R11. A point that connects the Nch transistor N24 and the resistance R11 is connected to a gate terminal of the Pch transistor P17. Any other component, which is similar to that of FIG. 44, is simply provided with the same reference symbol and not described again. The constitution shown in FIG. 46 can further stabilize the operation in comparison to that of FIG. 44.

Figure 47:
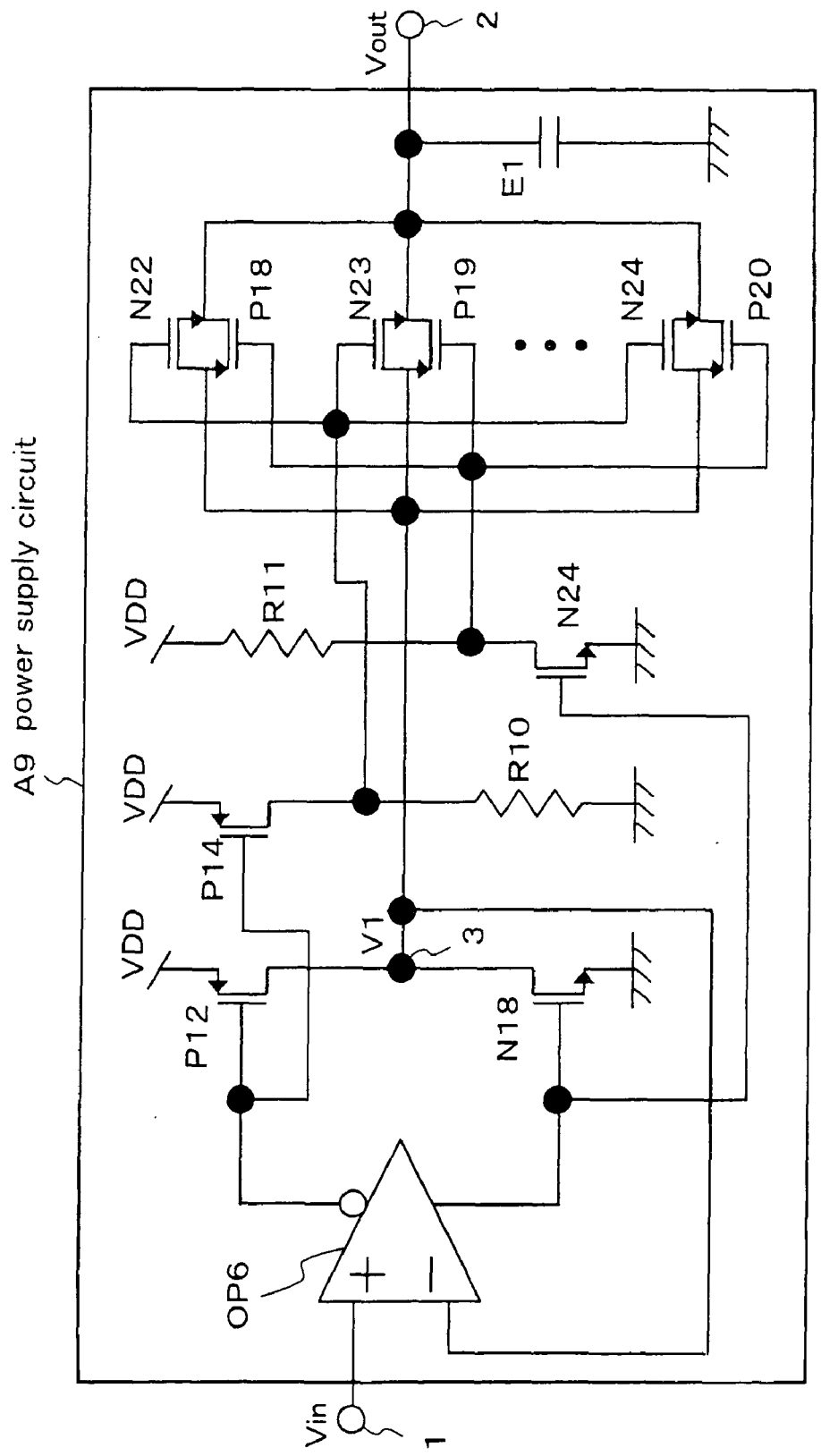
FIG. 47 is a block diagram (3) illustrating a constitution of a power supply circuit according to yet another modified embodiment of the preferred embodiment 9.
Figure 48:
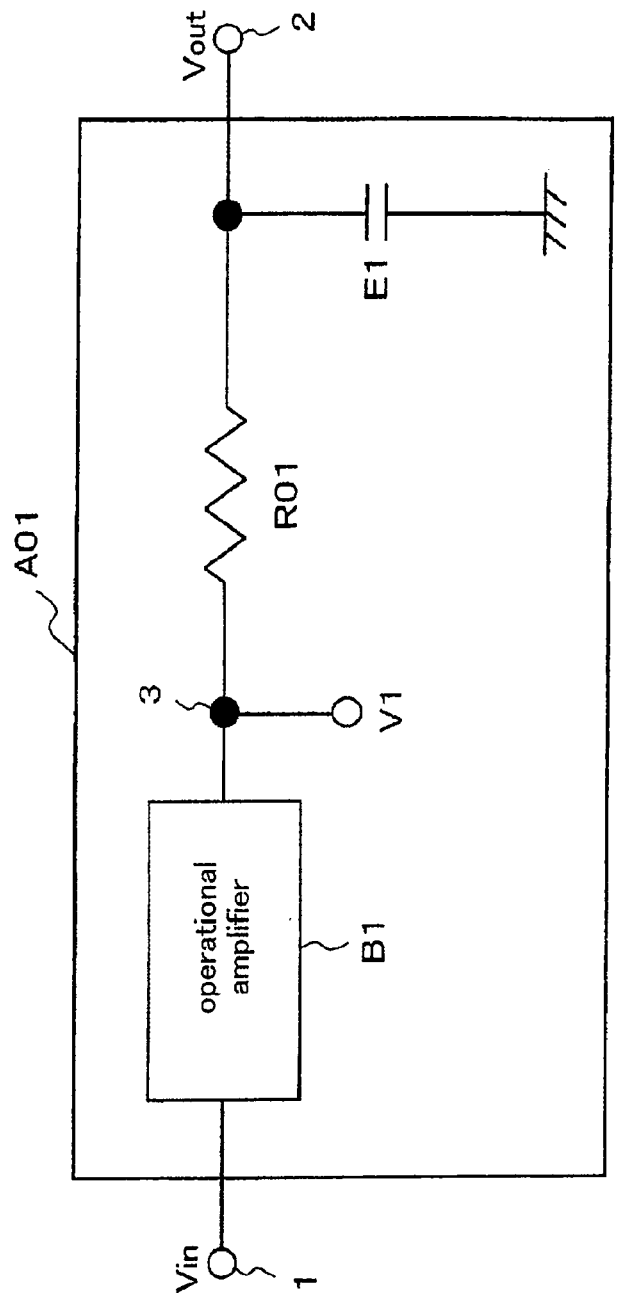
FIG. 48 is a block diagram illustrating a constitution of a power supply circuit according to a conventional technology.

In a power supply circuit A9 shown in FIG. 47, which is differently configured in comparison to the constitution shown in FIG. 46, a parallel circuit comprising a plurality of Nch transistors N22, N23 and N24 having a different ON resistance or a different transistor size respectively and a parallel circuit comprising a plurality of Pch transistors P18, P19 and P20 are provided in place of the Nch transistor N21 and the Pch transistor P17 for the output impedance. The impedance adjustment can be carried out in number of steps more finely divided by taking the constitution as shown in FIG. 47.

In the constitutions shown in FIGS. 44 and 45, the Nch transistors are used as the circuit elements, however, it is needless to say that the Pch transistors can be used as the circuit elements to constitute a similar circuit.

The MOS transistor is used in the preferred embodiment described above, however, it is needless to say that a bipolar transistor can be used to constitute a similar circuit.

The present invention is not limited to the foregoing embodiments and can be freely modified within the Scope of Claims of the present invention.

Though the preferred embodiments of this invention are described in detail, it will be understood that various modifications may be made therein, and it is intended to cover in the appended claims all such modifications as fall within the true spirit and scope of this invention.

What is claimed is:

1. A power supply circuit for generating a voltage for driving a load with direct-current, comprising:
   an operational amplifier for generating a power supply potential from a reference potential;
   an impedance adjuster for adjusting an output impedance of the operational amplifier in accordance with a control signal;
   a charge accumulator for accumulating an output charge of the operational amplifier whose impedance is adjusted by the impedance adjuster; and
   a comparator for comparing an output voltage of the operational amplifier before the impedance adjustment by the impedance adjuster and the output voltage of the operational amplifier after the impedance adjustment by the impedance adjuster to each other, thereafter, generating the control signal in accordance with a result of the comparison and outputting the generated control signal to the impedance adjuster.

2. The power supply circuit as claimed in claim 1, wherein the operational amplifier comprises a switchover phase compensator for adjusting an output phase thereof, wherein the switchover phase compensator includes a plurality of phase compensating circuits having a different level of phase compensation respectively, and the phase compensating circuits for adjusting the output phase are switched over one another based on the control signal.

3. The power supply circuit as claimed in claim 2 further comprising an input terminal to which the reference potential is inputted from outside, wherein
   the operational amplifier comprises:
   a non-inversion input terminal to which the reference potential is inputted from the input terminal;
   an inversion input terminal; and
   an amplifier output terminal for outputting the power supply potential, and
   the switchover phase compensator comprises:
   a first switch for controlling conduction between the input terminal and the inversion input terminal based on the control signal;
   a first resistance connected in series to the first switch;
   a second switch for controlling conduction between the inversion input terminal and the output terminal based on the control signal; and
   a parallel circuit connected in parallel to the second switch, and
   the parallel circuit comprises a capacitor and a second resistance connected in parallel to each other.

4. The power supply circuit as claimed in claim 3, further comprising a third switch for controlling conduction between the parallel circuit and the output terminal based on the control signal.

5. The power supply circuit as claimed in claim 2, comprising an input terminal to which the reference potential is inputted from outside, wherein
   the operational amplifier comprises:
   a non-inversion input terminal to which the reference potential is inputted from the input terminal;
   an inversion input terminal; and
   an amplifier output terminal for outputting the power supply potential, and
   the switchover phase compensator comprises:
   a switch for controlling conduction between the inversion input terminal and the output terminal based on the control signal; and
   a parallel circuit connected in parallel to the switch, and
   the parallel circuit comprises a capacitor and a resistance connected in parallel to each other.

6. The power supply circuit as claimed in claim 1, comprising a power supply circuit output terminal for outputting the power supply potential outside, wherein
   the operational amplifier comprises an amplifier output terminal for outputting the power supply potential to the power supply circuit output terminal,
   the impedance adjuster comprises a parallel circuit provided between the amplifier output terminal and the power supply circuit output terminal, and
   the parallel circuit comprises:
   a switch for controlling conduction between the amplifier output terminal and the power supply circuit output terminal in accordance with the control signal; and
   a resistance connected in parallel to the switch.

7. The power supply circuit as claimed in claim 1, comprising a power supply circuit output terminal for outputting the power supply potential outside, wherein
   the operational amplifier comprises an amplifier output terminal for outputting the power supply potential to the power supply circuit output terminal,
   the impedance adjuster comprises a parallel circuit provided between the amplifier output terminal and the power supply circuit output terminal, and
   the parallel circuit comprises a series circuit and a first resistance connected in parallel to each other, and
   the series circuit comprises:
   a switch for controlling conduction between the amplifier output terminal and the power supply circuit output terminal in accordance with the control signal; and
   a second resistance connected in series to the switch.

8. The power supply circuit as claimed in claim 1, comprising a power supply circuit output terminal for outputting the power supply potential outside, wherein
   the operational amplifier comprises an amplifier output terminal for outputting the power supply potential to the power supply circuit output terminal,
   the impedance adjuster comprises:
   a first transistor provided between the amplifier output terminal and the power supply circuit output terminal; and
   an ON resistance connected in parallel to the first transistor.

9. The power supply circuit as claimed in claim 1, comprising a power supply circuit output terminal for outputting the power supply potential outside, wherein
   the operational amplifier comprises an amplifier output terminal for outputting the power supply potential to the power supply circuit output terminal, and
   the impedance adjuster comprises:
   a first transistor provided between the amplifier output terminal and the power supply circuit output terminal; and
   a second transistor connected in parallel to the first transistor, wherein
   the second transistor has a transistor size different from that of the first transistor.

10. The power supply circuit as claimed in claim 1, comprising a power supply circuit output terminal for outputting the power supply potential outside, wherein
    the operational amplifier comprises an amplifier output terminal for outputting the power supply potential to the power supply circuit output terminal, the impedance adjuster comprises a transistor provided between the amplifier output terminal and the power supply circuit output terminal, wherein a potential more than a threshold voltage is supplied to a gate potential of the transistor, and a back gate potential of the transistor is switched over based on the control signal.

11. The power supply circuit as claimed in claim 1, wherein the comparator outputs the control signal so that the output impedance is adjusted by the impedance adjuster to a high level of impedance when the output voltage of the operational amplifier after the impedance adjustment is higher than or equal to the output voltage of the operational amplifier before the impedance adjustment, and the comparator outputs the control signal so that the output impedance is adjusted by the impedance adjuster to a low level of impedance when the output voltage of the operational amplifier after the impedance adjustment is lower than the output voltage of the operational amplifier before the impedance adjustment.

12. The power supply circuit as claimed in claim 1, comprising a power supply circuit output terminal for outputting the power supply potential outside, wherein the comparator comprises a non-inversion input terminal and an inversion input terminal, the non-inversion input terminal of the comparator is connected to the power supply circuit output terminal, and the inversion input terminal of the comparator is connected to a resistance dividing point at which the output voltage of the operational amplifier is divided.

* * * * *